US012588438B2

(12) United States Patent
Lee et al.

(10) Patent No.: US 12,588,438 B2
(45) Date of Patent: Mar. 24, 2026

(54) LAYER STRUCTURES INCLUDING DIELECTRIC LAYER, METHODS OF MANUFACTURING DIELECTRIC LAYER, ELECTRONIC DEVICE INCLUDING DIELECTRIC LAYER, AND ELECTRONIC APPARATUS INCLUDING ELECTRONIC DEVICE

(71) Applicant: Samsung Electronics Co., Ltd., Suwon-si (KR)

(72) Inventors: Woochul Lee, Gunpo-si (KR); Yongsung Kim, Suwon-si (KR); Jiwoon Park, Suwon-si (KR); Jooho Lee, Hwaseong-si (KR); Yong-Hee Cho, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 600 days.

(21) Appl. No.: 18/058,791

(22) Filed: Nov. 25, 2022

(65) Prior Publication Data

US 2023/0163188 A1      May 25, 2023

(30) Foreign Application Priority Data

Nov. 25, 2021    (KR) ........................ 10-2021-0164869
Nov. 18, 2022    (KR) ........................ 10-2022-0155805

(51) Int. Cl.
*H01L 21/02* (2006.01)
*H10D 1/68* (2025.01)
*H10D 64/68* (2025.01)

(52) U.S. Cl.
CPC ...... *H01L 21/022* (2013.01); *H01L 21/02186* (2013.01); *H10D 1/68* (2025.01); *H10D 64/685* (2025.01); *H10D 64/691* (2025.01)

(58) Field of Classification Search
CPC ............ H01L 21/022; H01L 21/02186; H10D 64/685; H10D 64/691
See application file for complete search history.

(56) References Cited

U.S. PATENT DOCUMENTS 5,912,797 A      6/1999   Schneemeyer et al.
6,093,944 A      7/2000   VanDover
                          (Continued)

FOREIGN PATENT DOCUMENTS

CN      101186496 A      5/2008
JP      H09-165260 A     6/1997
                         (Continued)

OTHER PUBLICATIONS

Minha Seo et al., "Permittivity Enhanced Atomic Layer Deposited HfO2 Thin Films; Manipulated by a Rutile TiO2 Interlayer," Chemistry of Materials vol. 22, No. 15, pp. 4419-4425, Jun. 18, 2010.

(Continued)

*Primary Examiner* — Joseph C. Nicely
(74) *Attorney, Agent, or Firm* — Harness, Dickey & Pierce, P.L.C.

(57)      ABSTRACT

Disclosed are a layer structure including a dielectric layer, a method of manufacturing the dielectric layer, an electronic device including the dielectric layer, and an electronic apparatus including the electronic device. The dielectric layer according to at least one embodiment includes a first layer having a dielectric constant greater than that of silicon oxide and is undoped, a second layer configured to enhance a rutile phase of the first layer, and a third layer configured to increase a bandgap of the first layer.

The method of manufacturing a dielectric layer according to an embodiment includes forming a first layer having a dielectric constant greater than that of silicon oxide; forming (Continued)

a phase stabilization layer for stabilizing a rutile phase of the first layer and forming a high-bandgap layer for increasing a bandgap of the first layer.

20 Claims, 60 Drawing Sheets

(56)                References Cited

U.S. PATENT DOCUMENTS

| | | | | |
|---|---|---|---|---|
| 7,402,876 | B2 * | 7/2008 | Ahn | H10D 64/691 |
| | | | | 257/532 |
| 7,611,959 | B2 * | 11/2009 | Ahn | H01L 21/31691 |
| | | | | 438/785 |
| 7,700,988 | B2 | 4/2010 | Lin et al. | |
| 8,310,807 | B2 * | 11/2012 | Krishnan | H10D 1/684 |
| | | | | 361/313 |
| 8,829,647 | B2 * | 9/2014 | Chen | H01L 21/28562 |
| | | | | 257/E29.345 |
| 9,227,876 | B2 | 1/2016 | Hu et al. | |
| 10,043,655 | B2 | 8/2018 | Swaminathan et al. | |
| 10,186,570 | B2 | 1/2019 | Hendrix et al. | |
| 2004/0110348 | A1 * | 6/2004 | Ahn | H01L 21/02205 |
| | | | | 438/785 |
| 2007/0147217 | A1 * | 6/2007 | Haruguchi | G11B 7/1353 |
| 2008/0274625 | A1 * | 11/2008 | Ahn | H10D 64/685 |
| | | | | 438/785 |
| 2011/0100810 | A1 * | 5/2011 | Merz | G01N 27/227 |
| | | | | 257/253 |
| 2011/0279979 | A1 * | 11/2011 | Mirin | H01L 21/02244 |
| | | | | 438/758 |
| 2012/0119327 | A1 | 5/2012 | Kwon et al. | |
| 2013/0071989 | A1 | 3/2013 | Deweerd et al. | |
| 2013/0100577 | A1 | 4/2013 | Popovici | |
| 2013/0328168 | A1 | 12/2013 | Malhotra et al. | |
| 2014/0077337 | A1 * | 3/2014 | Chen | H01L 21/28562 |
| | | | | 257/532 |
| 2019/0148067 | A1 | 5/2019 | Hirata | |
| 2019/0148390 | A1 | 5/2019 | Frank | |
| 2019/0165088 | A1 | 5/2019 | Cho et al. | |
| 2019/0267383 | A1 | 8/2019 | Rocklein et al. | |
| 2019/0355806 | A1 | 11/2019 | Kang et al. | |
| 2020/0020780 | A1 * | 1/2020 | Kim | H10D 64/691 |
| 2020/0043718 | A1 * | 2/2020 | Yi | H01L 21/02219 |
| 2020/0312952 | A1 | 10/2020 | Cho et al. | |
| 2020/0321472 | A1 | 10/2020 | Ramamoorthy et al. | |
| 2023/0080072 | A1 | 3/2023 | Kim et al. | |

FOREIGN PATENT DOCUMENTS

| | | |
|---|---|---|
| JP | H11-168027 A | 6/1999 |
| KR | 10-1455003 B1 | 11/2014 |
| KR | 10-2023-0039440 A | 3/2023 |

OTHER PUBLICATIONS

Dong-Kwon Lee et al., "Growth of rutile-TiO2 thin films via Sn doping and insertion of ultra-thin SnO2 interlayer by atomic layer deposition," Materials Letters, vol. 246, pp. 1-4, Mar. 9, 2019.

* cited by examiner

4000

LAYER STRUCTURES INCLUDING DIELECTRIC LAYER, METHODS OF MANUFACTURING DIELECTRIC LAYER, ELECTRONIC DEVICE INCLUDING DIELECTRIC LAYER, AND ELECTRONIC APPARATUS INCLUDING ELECTRONIC DEVICE

CROSS-REFERENCE TO RELATED APPLICATION

This application is based on and claims priority under 35 U.S.C. § 119 to Korean Patent Application Nos. 10-2021-0164869, filed on Nov. 25, 2021, and 10-2022-0155805, filed on Nov. 18, 2022, in the Korean Intellectual Property Office, the disclosures of which are incorporated by reference herein in their entirety.

BACKGROUND

Some example embodiments relate to semiconductor materials and electronic apparatuses including the same, and more particularly, to layer structures including dielectric layers, methods of manufacturing the dielectric layers, electronic devices including the dielectric layers, and electronic apparatuses including the electronic devices.

In an environment in which the degree of integration of semiconductor devices is increased, a line width of layers constituting the semiconductor devices is decreased and a thickness thereof is also decreased. When the thickness of a dielectric layer used in a memory device (e.g., DRAM) is reduced, leakage current characteristics may be reduced, and thus, the operation reliability of the memory device may be reduced. Therefore, in the case of a dielectric layer used in a memory device, an appropriate dielectric constant and low leakage current are required while maintaining a small thickness.

SUMMARY

Provided are dielectric layers configured to maintain an appropriate dielectric constant even in an environment having a thin thickness.

Provided are dielectric layers configured to prevent deterioration of leakage current characteristics even in a highly integrated environment.

Alternately and additionally, provided are methods of manufacturing the dielectric layers.

Alternately and additionally, provided are electronic devices including the dielectric layers.

Alternately and additionally, provided are electronic apparatuses including the electronic devices.

Additional aspects and/or features will be set forth in part in the description which follows and, in part, will be apparent from the description, or may be learned by practice of various example embodiments of the disclosure.

According to some example embodiments, a dielectric layer includes: a first layer having a dielectric constant greater than that of silicon oxide and undoped; a second layer on the first layer and configured to enhance a rutile phase of the first layer; and a third layer on at least one of the first and second layers, the third layer configured to increase a bandgap of the first layer.

In an example, the first layer may be between the second layer and the third layer such that the second layer, the first layer, and the third layer are sequentially stacked.

In an example, the first layer may be symmetrical surrounds the second layer, and the third layer is on at least one of a first side or a second side of a first stack structure, the first stack structure including the first and second layers.

In an example, the first layer may be provided below and above the second layer and is in contact with the second layer.

In an example, the first layer may be provided below and above the third layer and is in contact with the third layer.

In an example, the second layer and the third layer may be in contact with each other, and the first layer may be provided on at least one of a first side or a second side of a second stack structure including the contacting second and third layers.

In an example, the second layers may be included in a plurality of second layers, and the first layer is between the plurality of second layers.

In an example, the third layer may be included in a plurality of third layers, and the first layer is between the plurality of third layers.

In an example, one of the plurality of second layers and one of the plurality of third layers may be in contact with each other.

In an example, at least one of the second layer or the third layer may be buried in the first layer.

In an example, the dielectric layer may further include a fourth layer configured to increase the bandgap of the first layer, and the fourth layer may be on at least one side of a first side or a second side of a stack structure including the first to third layers. The second layer may be a plurality of second layers, and the first layer may be between the plurality of second layers. The third layer may be a plurality of third layers, and the first layer may also be provided between the plurality of third layers.

According to an aspect of an embodiment, a method of manufacturing a dielectric layer, the method includes: forming an undoped first layer having a dielectric constant greater than that of silicon oxide; forming a phase stabilization layer on the first layer, the phase stabilization layer being configured to stabilize a rutile phase of the first layer; and forming a first high-bandgap layer on at least one of the first layer or the phase stabilization layer, the first high-bandgap layer being configured to increase a bandgap of the first layer.

In an example, the phase stabilization layer may be formed before the forming of the first layer. The forming of the first layer, the forming of the phase stabilization layer, and the forming of the first high-bandgap layer may be sequentially performed. The first layer may be formed by sequentially stacking a plurality of dielectric material layers. The phase stabilization layer and the first high-bandgap layer are formed between the plurality of dielectric material layers. One of the phase stabilization layer and the first high-bandgap layer and the other layer may be sequentially formed and contacted with each other.

In an example, the phase stabilization layer and the first high-bandgap layer may be formed to be buried in the first layer. At least one of the phase stabilization layer or the first high-bandgap layer may include a plurality of sequentially stacked layers, and the first layer may also be formed between the plurality of layers.

In an example, the phase stabilization layer and the first high-bandgap layer may be repeatedly and alternately stacked. A portion of the phase stabilization layer and a portion of the first high-bandgap layer may be in contact with each other.

In an example, the forming of the first high-bandgap layer may include at least one of forming the first high-bandgap layer before the forming of the first layer and the forming of the phase stabilization layer; and forming the first high-bandgap layer after the forming of the first layer and the forming of the phase stabilization layer.

The method may further include forming a second high-bandgap layer configured to increase the bandgap of the dielectric layer.

In an example, the forming of the second high-bandgap layer may include at least one of forming the second high-bandgap layer before the forming of the first layer, the forming of the phase stabilization layer, and the forming of the first high-bandgap layer; or forming the second high-bandgap layer later than the forming of the first layer, the forming of the phase stabilization layer, and the forming of the first high-bandgap layer.

The first high-bandgap layer and the second high-bandgap layer may be formed of different materials from each other.

According to an aspect of an embodiment, an electronic device includes: a substrate including first and second doped regions spaced apart from each other; a gate insulating layer on the substrate between the first and second doped regions; and a gate electrode on the gate insulating layer, wherein the gate insulating layer includes the dielectric layer described above.

The dielectric layer may further include a fourth layer provided to increase the bandgap of the first layer.

According to an aspect of an embodiment, a memory device includes: a transistor including a source, a drain, and a gate electrode; and a data storage element connected to the transistor, wherein at least one of the transistor or the data storage element includes the dielectric layer described above.

In an example, the data storage element may include a lower electrode connected to the transistor, an upper electrode facing the lower electrode, and the dielectric layer between the upper electrode and the lower electrode.

According to an aspect of an embodiment, an electronic apparatus comprising an electronic device configured to regulate the flow of electrical signals, the electronic apparatus including the electronic device described above.

BRIEF DESCRIPTION OF THE DRAWINGS

The above and other aspects, features, and advantages of certain example embodiments will be more apparent from the following description taken in conjunction with the accompanying drawings, in which.

DETAILED DESCRIPTION

Figure 1:
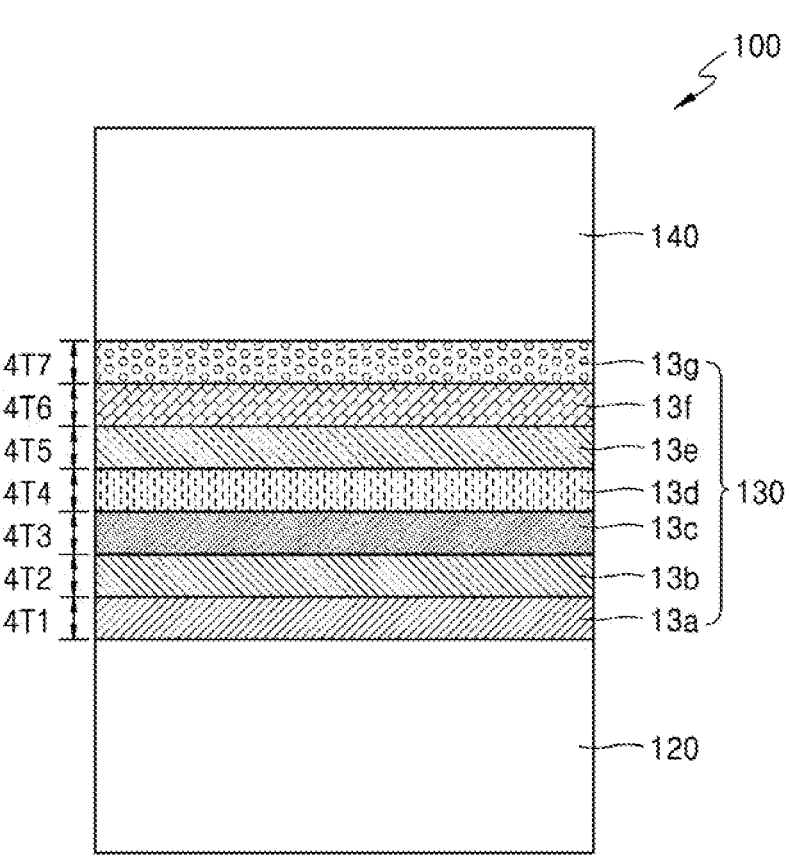
FIG. 1 is a cross-sectional view illustrating a layer structure including a dielectric layer, according to some example embodiments.

Reference will now be made in detail to various embodiments, examples of which are illustrated in the accompanying drawings, wherein like reference numerals refer to like elements throughout. In this regard, various example embodiments may have different forms and should not be construed as being limited to the descriptions set forth herein. Furthermore, example embodiments are not necessarily mutually exclusive. For example, some example embodiments may include features described with reference to one or more figures, and may also include features described with reference to one or more figures. Accordingly, the embodiments are merely described below, by referring to the figures, to explain aspects. As used herein, the terms "or" and/or "and/or" includes any and all combinations of one or more of the associated listed items. Expressions such as "at least one of," when preceding a list of elements, modify the entire list of elements and do not modify the individual elements of the list.

Hereinafter, a layer structure including a dielectric layer and a manufacturing method thereof, an electronic device including the dielectric layer, and an electronic apparatus including the same according to various example embodiments will be described in detail with reference to the accompanying drawings. In the following description, thicknesses of the layers or regions shown in the drawings may be exaggerated for clarity of the specification. The example embodiments are capable of various modifications and may be embodied in many different forms. In addition, when an element or layer is referred to as being "on" or "above" another element or layer, the element or layer may be directly on another element or layer or intervening elements or layers. It will be understood that the spatially relative terms are intended to encompass different orientations of the device in use or operation in addition to the orientation depicted in the figures. For example, if the device in the figures is otherwise oriented (e.g., rotated 90 degrees or at other orientations), the spatially relative descriptors used herein are to be interpreted accordingly. In the description below, like reference numerals in each drawing indicate like elements.

When the terms "about" or "substantially" are used in this specification in connection with a numerical value, it is intended that the associated numerical value includes a manufacturing tolerance (e.g., ±10%) around the stated numerical value. Further, regardless of whether numerical values are modified as "about" or "substantially," it will be understood that these values should be construed as including a manufacturing or operational tolerance (e.g., ±10%) around the stated numerical values.

FIG. 1 shows a first layer structure 100 including a dielectric layer according to an example embodiment.

Referring to FIG. 1, the layer structure 100 including a dielectric layer 130 according to some example embodiments includes a first material layer 120, the dielectric layer 130, and a second material layer 140 that are sequentially stacked.

In some example embodiments, the first material layer 120 may be (or include) a conductive layer, a layer including a semiconductor, or a semiconductor layer. The conductive layer may be or include a metal layer or a conductive metal oxide layer. For example, the conductive layer may include at least one of a $RuO_2$ layer, an $IrO_2$ layer, a Ta doped $SnO_2$ layer, an Nb doped $SnO_2$ layer, a $PtO_2$ layer, a $PdO_2$ layer, a $ReO_2$ layer, a $MoO_2$ layer, a $WO_2$ layer, a $TaO_2$ layer, an $NbO_2$ layer, a TiN layer including a rutile phase, or the like. In some example embodiments, the first material layer 120 may include one layer or a sequentially stacked two (or three or more) layers selected from among the material layers described above. The semiconductor layer may include a compound semiconductor layer or a non-compound semiconductor layer. The semiconductor layer may be doped with a dopant or undoped. In at least one example, when the first material layer 120 includes a semiconductor layer, a channel or path for moving charge carriers may exist between the first material layer 120 and the dielectric layer 130. In some example embodiments, the first material layer 120 may be used as an electrode layer.

The dielectric layer 130 may be or include a composite dielectric layer having a layer structure or a layer configuration configured to reduce a leakage current while stably maintaining a phase having a high-dielectric constant. The phase having a high-dielectric constant may be a rutile phase. The dielectric layer 130 may be present on one surface of the first material layer 120 and may be in direct contact with the one surface. The one surface of the first material layer 120 may be an upper surface, but, as noted above, depending on the viewpoint from which the layer structure 100 is viewed, the one surface may be a side surface, a lower surface, an inclined surface, etc. The dielectric layer 130 may include a given dielectric material but may have a layer structure or a layer configuration provided to have a bandgap different from that of the given dielectric material. For example, the dielectric layer 130 may be a composite dielectric layer including titanium oxide ($TiO_2$) as the given dielectric material and may have a layer structure or a layer configuration provided to have a bandgap greater than that of titanium oxide. The dielectric layer 130 may be the composite dielectric layer and may have a layer structure or a layer configuration including a material for reducing a leakage current.

Accordingly, the dielectric layer 130 may have a leakage current characteristic superior to that of the given dielectric material. For example, the leakage current of the dielectric layer 130 may be less than the leakage current of a comparative dielectric layer including just the given dielectric material.

In some example embodiments, the dielectric layer 130 may have a layer structure or a layer configuration provided to have a rutile-phase more stable than comparative titanium oxide while having a high-dielectric constant corresponding to the rutile-phase of titanium oxide.

The layer structure of the dielectric layer 130 may include a plurality of layers. For example, the dielectric layer 130 may include at least sequentially stacked first to seventh layers 13a, 13b, 13c, 13d, 13e 13f, and 13g, but the number of layers may be increased or decreased.

In some example embodiments, the layer structure including the seven layers 13a, 13b, 13c, 13d, 13e 13f, and 13g may include a layer configuration in which the second layer 13b is present on one surface of the first layer 13a, the third layer 13c is present on one surface of the second layer 13b, the fourth layer 13d is present on one surface of the third layer 13c, the fifth layer 13e is present on one surface of the fourth layer 13d, the sixth layer 13f is present on one surface of the fifth layer 13e, and the seventh layer 13g is present on one surface of the sixth layer 13f.

In some example embodiments, the second layer 13b is outside the first layer 13a, may be in direct contact with the one surface of the first layer 13a, and may be provided to cover all or a part of the one surface. In some example embodiments, the third layer 13c is outside the second layer 13b, may be in direct contact with the one surface of the second layer 13b, and may be provided to cover all or a part of the one surface. In some example embodiments, the fourth layer 13d is outside the third layer 13c, may be in direct contact with the one surface of the third layer 13c, and may be provided to cover all or a part of the one surface of the third layer 13c. In some example embodiments, the fifth layer 13e is outside the fourth layer 13d, may be in direct contact with the one surface of the fourth layer 13d, and may be provided to cover all or a part of the one surface of the fourth layer 13d. In some example embodiments, the sixth layer 13$f$ is outside the fifth layer 13$e$, may be in direct contact with the one surface of the fifth layer 13$e$, and may be provided to cover all or a part of the one surface of the fifth layer 13$e$. In some example embodiments, the seventh layer 13$g$ is outside the sixth layer 13$f$, may be in direct contact with the one surface of the sixth layer 13$f$, and may be provided to cover all or a part of the one surface of the sixth layer 13$f$. In some example embodiments, the one surface of each of the first to seventh layers 13$a$-13$g$ may be an upper surface, but, as noted above, may be a bottom surface, a side surface, or an inclined surface depending on the viewpoint.

The first layer 13$a$ of the dielectric layer 130 may be formed on the one surface of the first material layer 120 and may be provided to be in direct contact with the one surface. The first layer 13$a$ may be provided to cover all or a part of the one surface of the first material layer 120. The first layer 13$a$ may have a first thickness 4T1.

In some example embodiments, the first layer 13$a$ may be or include a material layer (hereinafter, a first high-bandgap layer) provided to increase a bandgap of the dielectric layer 130 greater than that of the given dielectric (e.g., greater than a titanium oxide layer). In some example embodiments, the first high-bandgap layer may have a bandgap greater than that of the titanium oxide layer. For example, the first high-bandgap layer may increase the bandgap of the dielectric layer 130 greater than that of the titanium oxide layer. The first high-bandgap layer may include a single layer or a plurality of layers of different material layers. When the first high-bandgap layer includes a plurality of layers, the plurality of layers may be sequentially and successively stacked in contact with each other or sequentially stacked without contacting each other. In some example embodiments, the first high-bandgap layer is a material layer having a bandgap greater than that of titanium oxide ($TiO_2$). For example, the material layer may have bandgap greater than that of titanium oxide ($TiO_2$) in an anatase-phase and may be or include at least one of a hafnium oxide ($HfO_2$) layer, a zirconium oxide ($ZrO_2$) layer, or a mixed layer thereof ($Hf_xZr_{1-x}O_2$). The first high-bandgap layer may serve as a layer for improving leakage current characteristics of the dielectric layer 130, e.g., as a layer for suppressing leakage current. Accordingly, the first high-bandgap layer may be expressed as a leakage current suppressing layer or a leakage current reducing layer.

In some example embodiments, the first layer 13$a$ may be or include a rutile-phase titanium oxide (e.g., $TiO_2$) layer having a high-dielectric constant. In this case, the first layer 13$a$ may be undoped.

In one embodiment, the first layer 13$a$ may be or include another material layer (hereinafter, a second high-bandgap layer) provided to increase the bandgap of the dielectric layer 130 greater than that of the given dielectric (e.g., greater than the titanium oxide layer). The second high-bandgap layer may increase the bandgap of the dielectric layer 130 greater than that of the titanium oxide layer either alone or together with the first high-bandgap layer. The second high-bandgap layer may be a single layer or include a plurality of layers, and when the second high-bandgap layer includes a plurality of layers, the plurality of layers may be sequentially stacked in contact with each other or sequentially stacked without contacting each other. For example, the second high-bandgap layer is a material layer having a bandgap greater than that of the titanium oxide layer, and may be or include at least one of an $Al_2O_3$ layer, a $Y_2O_3$ layer, and an MgO layer, but is not limited to these layers. The first and second high-bandgap layers may be material layers different from each other. Like the first high-bandgap layer, the second high-bandgap layer may act as a layer for improving a leakage current characteristic of the dielectric layer 130, e.g., as a layer for suppressing leakage current. Accordingly, the second high-bandgap layer may also be referred to as a leakage current suppressing layer or a leakage current reducing layer.

In some example embodiments, the first layer 13$a$ may be or include a layer provided to stabilize or strengthen the rutile-phase of the titanium oxide layer (hereinafter, a phase stabilization layer). The phase stabilization layer may be referred to as a phase enhancement layer. In some example embodiments, the first layer 13$a$ may be one of material layers having a stable rutile-phase. For example, the phase stabilization layer may be or include at least one of a $SnO_2$ layer, a $GaO_2$ layer, a $GeO_2$ layer, or a $SiO_2$ layer. When the first layer 13$a$ serves as a layer for stabilizing the rutile-phase of the titanium oxide layer, a titanium oxide layer having a rutile-phase may be directly formed on the first layer 13$a$.

Also, the first thickness 4T1 of the first layer 13$a$ may vary according to the role or function of the first layer 13$a$. For example, when the first layer 13$a$ is a rutile-phase titanium oxide layer having a high-dielectric constant, the first thickness 4T1 of the first layer 13$a$ may be greater than when the first layer 13$a$ is used as a phase stabilization layer or a high-bandgap layer.

In the dielectric layer 130, the composition of the second through seventh layers 13$b$ through 13$g$ may vary according to the role or function of the preceding layer. The thickness (e.g., 4T2 through 4T7) may also vary depending on the role and/or function of the corresponding layer (e.g., 13$b$ through 13$g$). For example, wherein one of the first through seventh layers 13$a$ through 13$g$ is a rutile-phase titanium oxide layer having a high-dielectric constant, the thickness of said layer may be greater than the phase stabilization layers or the high-bandgap layers.

For example, the second layer 13$b$ of the dielectric layer 130 has a second thickness 4T2. The second thickness 4T2 may be the same as or different from the first thickness 4T1. The second layer 13$b$ may be or include at least one of the rutile-phase titanium oxide layer having a high-dielectric constant, the phase stabilization layer, or the second high-bandgap layer. In some example embodiments, when the second layer 13$b$ is a rutile-phase titanium oxide layer having a high dielectric constant, the second layer 13$b$ may be undoped. The role or function of the second layer 13$b$ may vary depending on a material layer used as the first layer 13$a$. In some example embodiments, when the first layer 13$a$ is the first high-bandgap layer, the second layer 13$b$ may be one of the titanium oxide layer having a rutile-phase, the phase stabilization layer, or the second high-bandgap layer. In some example embodiments, when the first layer 13$a$ is the titanium oxide layer having a rutile phase, the second layer 13$b$ may be one of the rutile-phase titanium oxide layer, the phase stabilization layer, or the second-bandgap layer. In some example embodiments, when the first layer 13$a$ is the phase stabilization layer, the second layer 13$b$ may be one of the rutile-phase titanium oxide layer or the second high-bandgap layer. In some example embodiments, when the first layer 13$a$ is the second high-bandgap layer, the second layer 13$b$ may be one of the rutile-phase titanium oxide layer or the phase stabilization layer.

In this way, as the properties of the material of the second layer 13$b$ are changed, the second thickness 4T2 of the second layer 13$b$ may also vary. For example, when the second layer 13*b* is the rutile-phase titanium oxide layer, the second thickness 4T2 may be greater than when the second layer 13*b* is the phase stabilization layer or the second high-bandgap layer.

The third layer 13*c* of the dielectric layer 130 has a third thickness 4T3. The third thickness 4T3 may be the same as or different from the second thickness 4T2. The third layer 13*c* may be or include one of the rutile-phase titanium oxide layer having a high-dielectric constant, the phase stabilization layer, or the second high-bandgap layer. In some example embodiments, when the third layer 13*c* is a rutile-phase titanium oxide layer having a high dielectric constant, the third layer 13*c* may be undoped. The role or function of the third layer 13*c* may vary depending on the properties of the material used as the second layer 13*b*. For example, when the second layer 13*b* is the rutile-phase titanium oxide layer, the third layer 13*c* may be one of the rutile-phase titanium oxide layer, the phase stabilization layer, and the second high-bandgap layer. In some example embodiments, when the second layer 13*b* is the phase stabilization layer, the third layer 13*c* may be one of the rutile-phase titanium oxide layer and the second high-bandgap layer. In some example embodiments, when the second layer 13*b* is the second high-bandgap layer, the third layer 13*c* may be one of the rutile-phase titanium oxide layer and the phase stabilization layer.

In this way, as the properties of the material of the second layer 13*b* are changed, the third thickness 4T3 of the third layer 13*c* may also vary. For example, when the third layer 13*c* is the rutile-phase titanium oxide layer, the third thickness 4T3 may be greater than when the third layer 13*c* is a phase stabilization layer or a second high-bandgap layer.

The fourth layer 13*d* of the dielectric layer 130 has a fourth thickness 4T4. The fourth layer 13*d* may be or include one of the rutile-phase titanium oxide layer having a high-dielectric constant, the phase stabilization layer, or the second high-bandgap layer. In some example embodiments, when the fourth layer 13*d* is a rutile-phase titanium oxide layer having a high dielectric constant, the fourth layer 13*d* may be undoped. The role or function of the fourth layer 13*d* may vary depending on a material used as the third layer 13*c*. For example, when the third layer 13*c* is the rutile-phase titanium oxide layer, the fourth layer 13*d* may be one of the rutile-phase titanium oxide layer, the phase stabilization layer, and the second high-bandgap layer. In some example embodiments, when the third layer 13*c* is the phase stabilization layer, the fourth layer 13*d* may be one of the rutile-phase titanium oxide layer or the second high-bandgap layer. In some example embodiments, when the third layer 13*c* is the second high-bandgap layer, the fourth layer 13*d* may be one of the rutile-phase titanium oxide layer or the phase stabilization layer.

In this way, as the properties of the material of the fourth layer 13*d* are changed, the fourth thickness 4T4 of the fourth layer 13*d* may also vary. For example, when the fourth layer 13*d* is the rutile-phase titanium oxide layer, the fourth thickness 4T4 may be greater than when the fourth layer 13*d* is the phase stabilization layer or the second high-bandgap layer.

The fifth layer 13*e* of the dielectric layer 130 has a fifth thickness 4T5. The fifth layer 13*e* may be or include one of the rutile-phase titanium oxide layer having a high-dielectric constant, the phase stabilization layer, or the second high-bandgap layer. In some example embodiments, when the fifth layer 13*e* is a rutile-phase titanium oxide layer having a high dielectric constant, the fifth layer 13*e* may be undoped. The role or function of the fifth layer 13*e* may vary depending on a material used as the fourth layer 13*d*. For example, when the fourth layer 13*d* is the rutile-phase titanium oxide layer, the fifth layer 13*e* may be one of the rutile-phase titanium oxide layer, the phase stabilization layer, or the second high-bandgap layer, or one of the phase stabilization layer and the second high-bandgap layer.

When the fourth layer 13*d* is the phase stabilization layer, the fifth layer 13*e* may be one of the rutile-phase titanium oxide layer or the second high-bandgap layer. In some example embodiments, when the fourth layer 13*d* is the second high-bandgap layer, the fifth layer 13*e* may be one of the rutile-phase titanium oxide layer or the phase stabilization layer.

In this way, when the properties of the material of the fifth layer 13*e* are changed, the fifth thickness 4T5 of the fifth layer 13*e* may also vary. For example, when the fifth thickness 4T5 is the phase stabilization layer, the fifth thickness 4T5 may be less than a thickness when the fifth layer 13*e* is the second high-bandgap layer.

The sixth layer 13*f* of the dielectric layer 130 has a sixth thickness 4T6. The sixth layer 13*f* may be one of the rutile-phase titanium oxide layer having a high-dielectric constant, the phase stabilization layer, or the second high-bandgap layer. In some example embodiments, when the sixth layer 13*f* is a rutile-phase titanium oxide layer having a high dielectric constant, the sixth layer 13*f* may be undoped. The role or function of the sixth layer 13*f* may vary depending on a material used as the fifth layer 13*e*. For example, when the fifth layer 13*e* is the rutile-phase titanium oxide layer, the sixth layer 13*f* may be one of the rutile-phase titanium oxide layer, the phase stabilization layer, or the second high-bandgap layer, or one of the phase stabilization layer or the second high-bandgap layer.

When the fifth layer 13*e* is the phase stabilization layer, the sixth layer 13*f* may be one of the rutile-phase titanium oxide layer or the second high-bandgap layer. In some example embodiments, when the fifth layer 13*e* is the second high-bandgap layer, the sixth layer 13*f* may be one of the rutile-phase titanium oxide layer or the phase stabilization layer.

In this way, when the properties of the material of the sixth layer 13*f* are changed, the sixth thickness 4T6 of the sixth layer 13*f* may also vary. For example, when the sixth layer 13*f* is the phase stabilization layer or the second high-bandgap layer, the sixth thickness 4T6 may be less than when the sixth layer 13*f* is the rutile-phase titanium oxide layer.

The seventh layer 13*g* of the dielectric layer 130 has a seventh thickness 4T7. The seventh layer 13*g* may include one of the rutile-phase titanium oxide layer having a high-dielectric constant, the phase stabilization layer, the first high-bandgap layer, or the second high-bandgap layer. The role or function of the seventh layer 13*g* may be determined in consideration of a material used as the sixth layer 13*f*. In some example embodiments, when the sixth layer 13*f* includes one of the rutile-phase titanium oxide layer, the phase stabilization layer, or the second high-bandgap layer, the seventh layer 13*g* may include one of the rutile-phase titanium oxide layer, the phase stabilization layer, the first high-bandgap layer, or the second high-bandgap layer. The material of the sixth layer 13*f* and that of the seventh layer 13*g* may be the same as or different from each other. In some example embodiments, when the seventh layer 13*g* is a rutile-phase titanium oxide layer having a high dielectric constant, the seventh layer 13*g* may be undoped.

When the material properties of the seventh layer 13*g* are different, the seventh thickness 4T7 of the seventh layer 13*g* may also be different. For example, when the seventh layer 13g is the rutile-phase titanium oxide layer or the first high-bandgap layer, the seventh thickness 4T7 may be greater than when the seventh layer 13g is the phase stabilization layer.

A total thickness T1 of the dielectric layer 130 may be determined in consideration of the degree of integration of the electronic device or electronic apparatus to which the dielectric layer 130 or the layer structure 100 is applied. In some example embodiments, the thickness T1 of the dielectric layer 130 may be 100 Å (10 nm) or less and/or 60 Å (6 nm) or less, but is not limited thereto. The thickness of the rutile-phase titanium oxide layer included in the dielectric layer 130, that is, the sum of the thickness of the rutile-phase titanium oxide layer included in each of the layers 13a, 13b, 13c, 13d, 13e, 13f, and 13g may be less than the thickness T1 of the dielectric layer 130. In some example embodiments, the sum of the thicknesses of the rutile-phase titanium oxide layers included in each layer may be 40% or more or 50% or more of the thickness T1 of the dielectric layer 130.

In the dielectric layer 130, the phase stabilization layer and/or the second high-bandgap layer may be disposed between the rutile-phase titanium oxide layers, or vice versa. In at least one example, a rutile-phase titanium oxide layer may be disposed between the phase stabilization layers, between the second high-bandgap layers, or between the phase stabilization layer and the second high-bandgap layer. In either case, the phase stabilization layer may be provided in direct contact with the rutile-phase titanium oxide layer.

In the dielectric layer 130, the content [Al/(Ti+Al)] of the main component (Al) of the phase stabilization layer in a material layer including the entire titanium oxide layer and the phase stabilization layer may be 5% or more and/or 20% or less, but this is not limited thereto. The main component (Al) may be a component other than oxygen in the phase stabilization layer. For example, when the phase stabilization layer is a $SnO_2$ layer, the main component (Al) may be Sn.

The first to seventh layers 13a, 13b, 13c, 13d, 13e, 13f, and 13g included in the dielectric layer 130 may be formed by using an atomic layer deposition (ALD) method, but the method is not limited thereto. Depending on the material properties, roles, or functions of each of the layers 13a, 13b, 13c, 13d, 13e, 13f, and 13g, each layer may be formed in one or several ALD cycles, and/or may be formed in tens or hundreds of ALD cycles. For example, when the second layer 13b is a titanium oxide layer, the second layer 13b may be formed by repeating the ALD cycle for forming titanium oxide several tens to hundreds of times. For example, when the second layer 13b and the fourth layer 13d are titanium oxide layers and the third layer 13c is a phase stabilization layer (e.g. $SnO_2$), the third layer 13c may be formed by performing an ALD cycle for forming a $SnO_2$ layer once or performing the ALD cycle several times. Considering that the thickness of the phase stabilization layer formed by one ALD cycle corresponds to the thickness of about one atomic layer, the thickness of the phase stabilization layer may be negligible compared to the thickness of the titanium oxide layer.

In consideration of this point, the phase stabilization layer in the dielectric layer 130 may be regarded as doped or buried in the titanium oxide layer. Accordingly, in the following description, the phase stabilization layer may also be expressed or referred to as doped or buried in the titanium oxide layer. In addition, a material layer including the phase stabilization layer and the titanium oxide layer may be expressed as a titanium oxide layer doped with a phase stabilization layer or a titanium oxide layer doped with a main component of the phase stabilization layer. For example, when the phase stabilization layer is a $SnO_2$ layer, the material layer including the phase stabilization layer and the titanium oxide layer may be expressed as "$SnO_2$ doped titanium oxide layer" or "Sn doped titanium oxide layer".

The second material layer 140 is provided to face the first material layer 120 with the dielectric layer 130 therebetween. The second material layer 140 may be or include a conductive layer, a layer including a semiconductor, or a semiconductor layer. A material of the second material layer 140 may be the same as or different from the material of the first material layer 120. The second material layer 140 may be used as an electrode layer.

The layer structure 100 may be a structure in which a conductor, an insulator, and a conductor are sequentially stacked, for example, a metal-insulator-metal (MIM) structure. In some example embodiments, the layer structure 100 may be a capacitor, which is included in, e.g., a data storage unit.

Figure 2A:
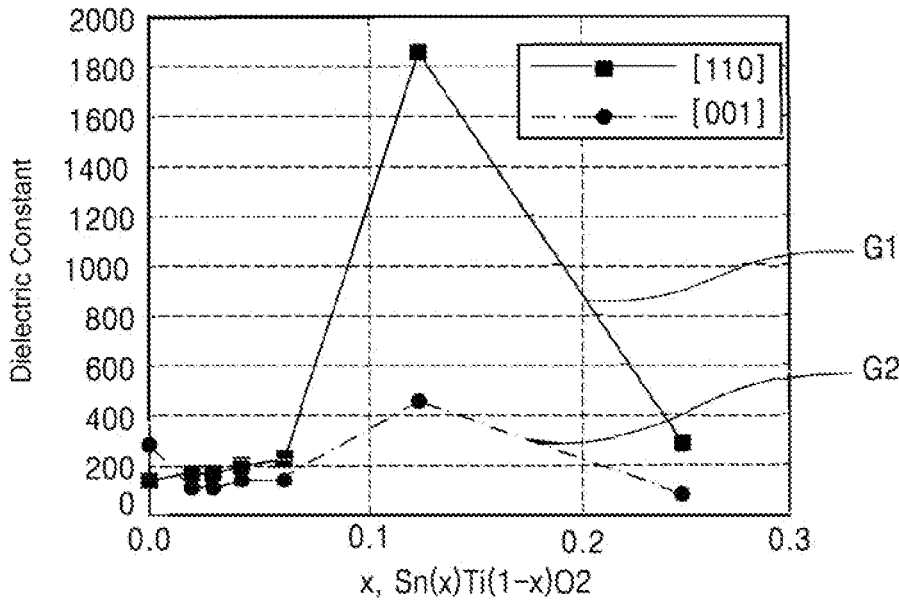
FIGS. 2A to 7 are graphs illustrating simulation results performed to confirm electrical characteristics of a dielectric layer included in the layer structure of FIG. 1.
Figure 2B:
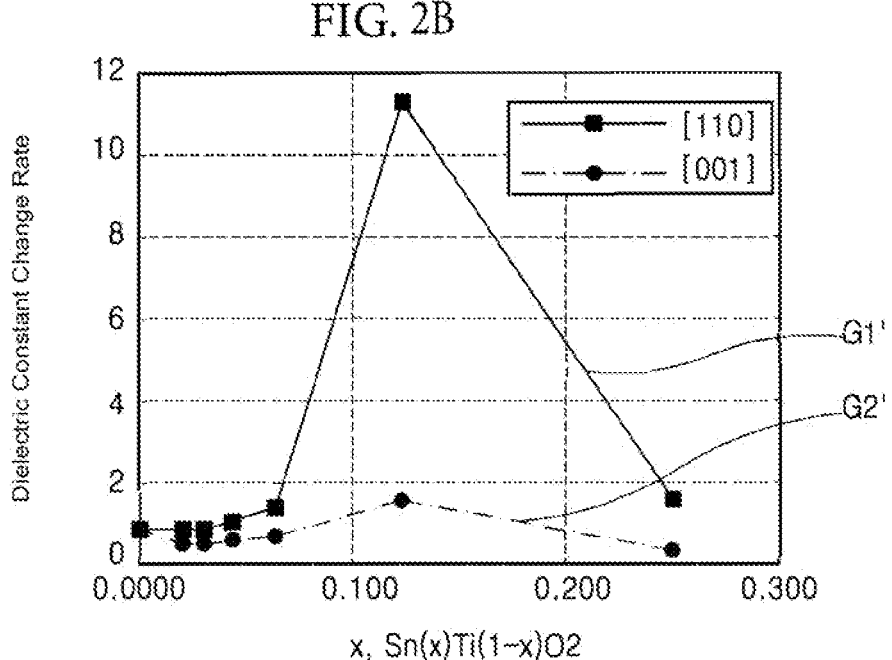

FIG. 2A is a graph showing the change in the dielectric constant of a titanium oxide layer according to a doping amount of $SnO_2$, which is an example of the phase stabilization layer, and FIG. 2B is a graph showing the change in dielectric constant ratio of the titanium oxide layer according to the doping amount of $SnO_2$, which is an example of the phase stabilization layer.

In FIGS. 2A and 2B, the first graphs G1 and G1' are for a [110] plane of the $TiO_2$ layer, and the second graphs G2 and G2' are for a [001] plane of the $TiO_2$ layer.

In FIG. 2A, the horizontal axis represents a Sn doping amount (x) of a Sn-doped $TiO_2$ layer, for example, a Sn(x)Ti(1-x)O2 layer, and the vertical axis represents a dielectric constant. In FIG. 2B, the horizontal axis represents a Sn doping amount (x) of the Sn-doped titanium oxide, and the vertical axis represents a dielectric constant change ratio, respectively.

Referring to FIG. 2A, it may be seen that the change in the dielectric constant of the $TiO_2$ layer according to the Sn doping amount (x) is different depending on a crystal plane of the $TiO_2$ layer, and the dielectric constant for the [110] plane is much greater than the dielectric constant for the [001] plane. In the case of the [110] plane, the dielectric constant starts to increase near 200 and gradually increases until the Sn doping amount (x) reaches a first value (e.g., x=0.05, 5%), and after the Sn doping amount (x) exceeds the first value, the dielectric constant rapidly and proportionally increases. In some examples, the rapid increase is maintained until the Sn doping amount x reaches a second value between 0.1 (10%) and 0.15 (15%). As the increase in the Sn doping amount (x) passes the second value, the dielectric constant rapidly and proportionally decreases, and the decrease is continued until the Sn doping amount (x) exceeds 0.2 (20%) and reaches 0.25 (25%). Even in the section where the dielectric constant is decreased, the lowest value of the dielectric constant is greater than 200.

In the case of the [001] plane, the dielectric constant is less than that of the [110] plane, and the change pattern of the dielectric constant according to the Sn doping amount (x) is similar to the case of the [110]. In the case of the [001] plane, it may be seen that the dielectric constant when the Sn doping amount (x) is about 0.05 (5%) to 0.23 (23%) is greater than that when Sn is not doped (x=0.0).

Figure 3:
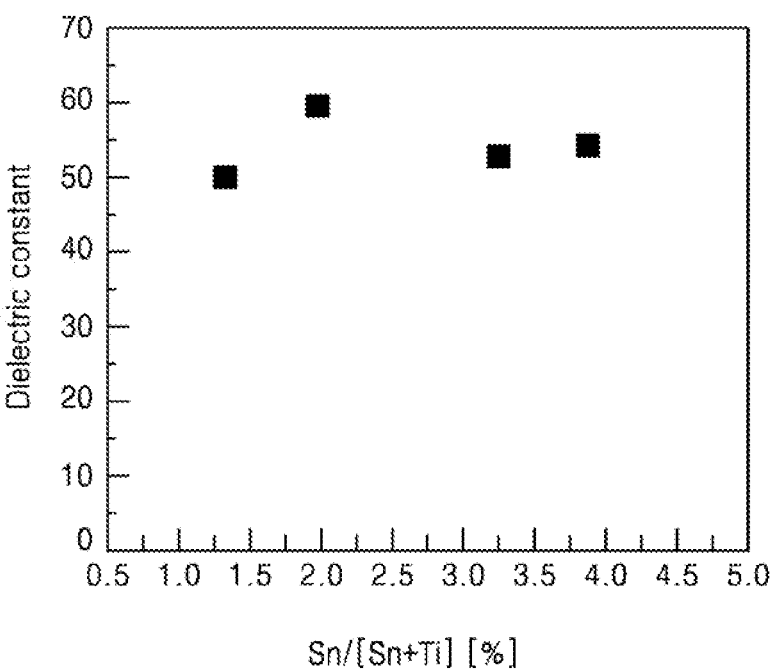

FIG. 3 is a graph showing a dielectric constant of a Sn-doped $TiO_2$ layer when the doping amount of $SnO_2$, which is an example of the phase stabilization layer, is 5% or less.

In FIG. 3, the horizontal axis represents a Sn doping amount [Sn/(Sn+Ti)], and the vertical axis represents a dielectric constant.

Referring to FIG. 3, it may be seen that the dielectric constant of the Sn-doped $TiO_2$ layer is 50 or more even with a Sn doping amount of 0.5% to 5.0%.

FIGS. 2 and 3 show that the $TiO_2$ layer doped with a phase stabilization layer, such as $SnO_2$ layer also has a high-dielectric constant of 50 or more.

Figure 4:
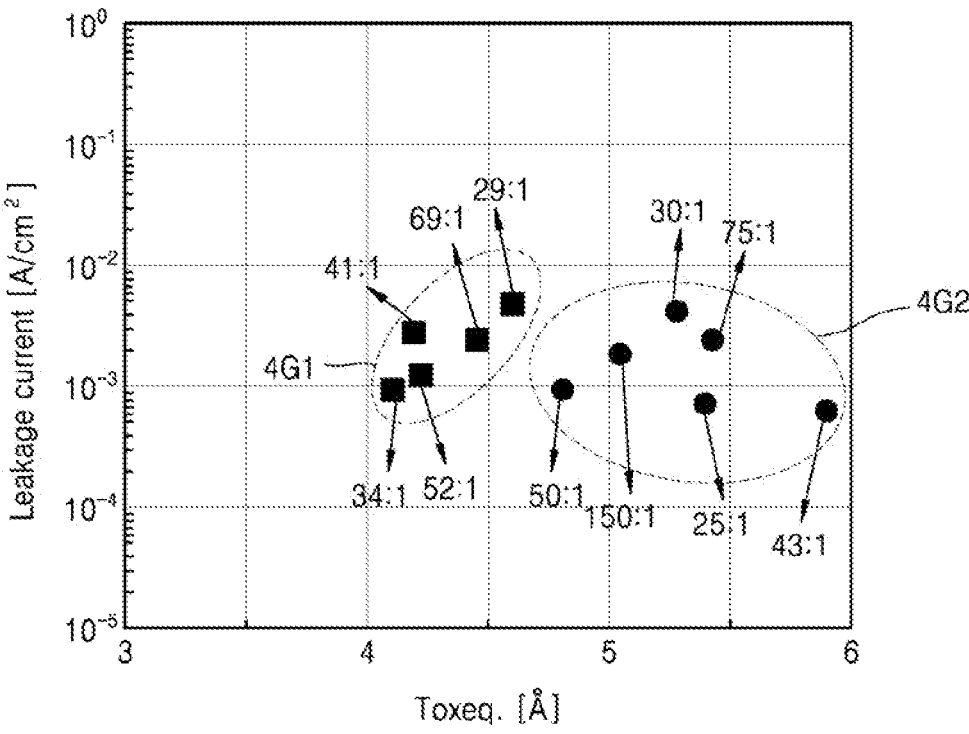

FIG. 4 shows leakage current characteristics at different first and second thicknesses of a $SnO_2$ doped $TiO_2$ layer, that is, a Sn doped $TiO_2$ layer as an example of a phase stabilization layer in the dielectric layer 130.

In FIG. 4, the horizontal axis represents an equivalent oxide film thickness, and the vertical axis represents a leakage current.

In FIG. 4, the first group 4G1 is a case when the Sn-doped $TiO_2$ layer has a first thickness (55 Å), and the second group 4G2 is a case when the Sn-doped $TiO_2$ layer has a second thickness (65 Å). In the Sn-doped $TiO_2$ layer of the first and second thicknesses, the doping amount of Sn is about 0.5% to 4%. Therefore, even in the same group, the equivalent oxide thickness and leakage current of the Sn-doped $TiO_2$ layer may be different.

In FIG. 4, in the figures representing ratios, such as 29:1, 30:1, 52:1, 43:1, etc., the left figure indicates the number of ALD cycles taken to form the $TiO_2$ layer, and the right figure indicates the number of ALD cycles taken to form the $SnO_2$ layer. For example, 69:1 denotes that the ALD cycle for forming the $TiO_2$ layer was performed 69 times and the ALD cycle for forming the $SnO_2$ layer was performed once until the Sn-doped $TiO_2$ layer having the first thickness was formed. In other words, 69:1 means that the ALD cycle for forming the $TiO_2$ layer was performed 69 times, and the ALD cycle for forming the $SnO_2$ layer was performed once to form the Sn-doped $TiO_2$ layer having the first thickness.

Referring to FIG. 4, the leakage currents of the Sn-doped $TiO_2$ layer having a first thickness and the Sn-doped $TiO_2$ layer having a second thickness are in a range of less than $10^{-2}$ and greater than $10^{-4}$.

Figure 5:
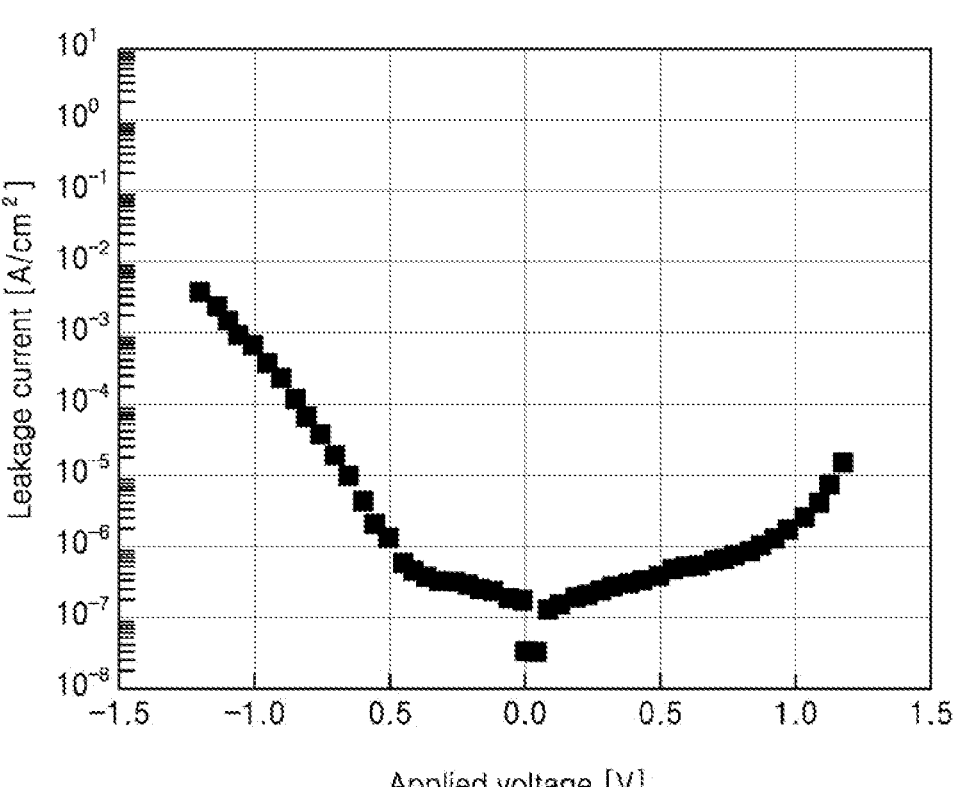

FIG. 5 shows a leakage current when $Al_2O_3$ is added as a layer for suppressing leakage current to the Sn-doped $TiO_2$ layer used to obtain the result of FIG. 4. An amount of Sn doping of the Sn-doped $TiO_2$ layer used to obtain the result of FIG. 5 was about 2.5%. In order to add $Al_2O_3$, an ALD cycle of forming an $Al_2O_3$ layer was performed once. As a result, the graph of FIG. 5 may be viewed as showing the leakage current characteristics for a $Sn_xAl_yTi_{(1-x-y)}O_2$ layer.

In FIG. 5, the horizontal axis represents a voltage applied to the Sn-doped $TiO_2$ layer, and the vertical axis represents a leakage current.

Referring to FIG. 5, the leakage current measured at about 1V is about $2 \times 10^{-6}$ $A/cm^2$, which is much less than that of FIG. 4. As a result, the results of FIGS. 4 and 5 suggest that the leakage current is reduced by adding $Al_2O_3$ to the Sn-doped $TiO_2$ layer, and this suggests that the added leakage current suppressing layer, such as $Al_2O_3$ actually suppresses the leakage current in the Sn-doped $TiO_2$ layer.

Figure 6:
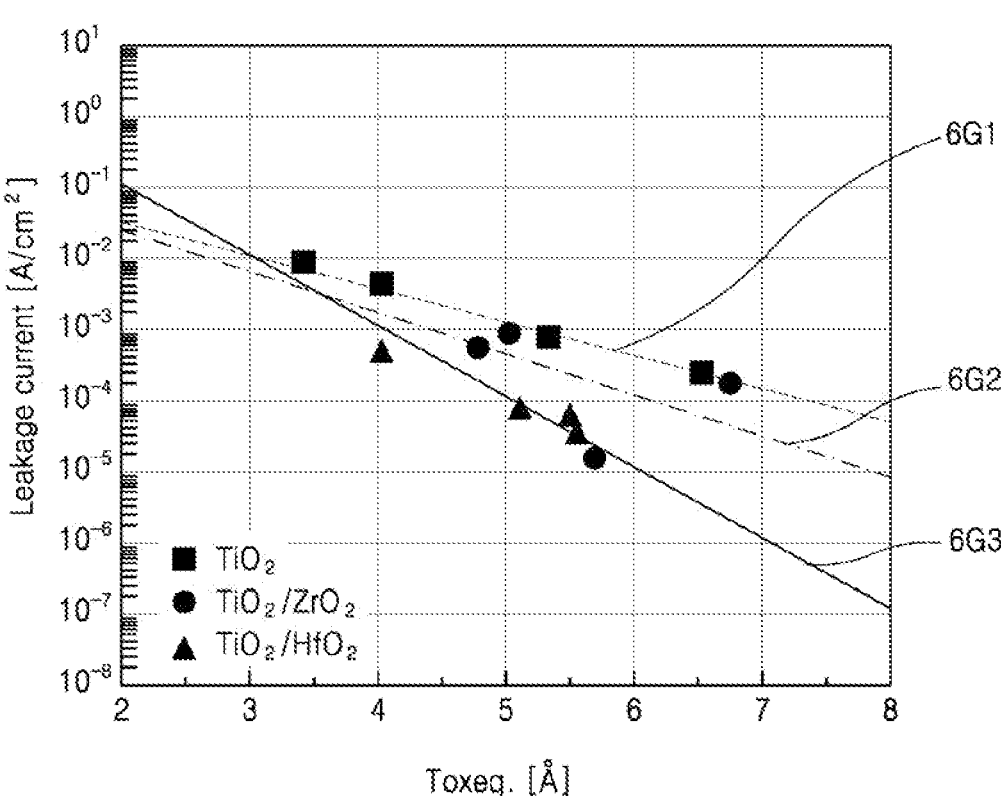

FIG. 6 shows simulation results of measuring the leakage current characteristics for the titanium oxide layer and for the combination of the titanium oxide layer and the first high-bandgap layer.

In FIG. 6, the horizontal axis represents an equivalent oxide film thickness, and the vertical axis represents a leakage current.

In FIG. 6, a first graph 6G1 represents a measurement result for the $TiO_2$ layer. The second graph 6G2 shows a measurement result for the combination of a $ZrO_2$ layer, which is a first high-bandgap layer and the $TiO_2$ layer (sequentially stacked $TiO_2$ layer/$ZrO_2$ layer). The third graph 6G3 shows a measurement result for the combination of the $HfO_2$ layer, which is a first high-bandgap layer and the $TiO_2$ layer (sequentially stacked $TiO_2$ layer/$HfO_2$ layer).

Comparing the first to third graphs 6G1, 6G2, and 6G3, in all of the $TiO_2$ layer, the $TiO_2$ layer/$ZrO_2$ layer, and the $TiO_2$ layer/$HfO_2$ layer, the leakage current decreases as the thickness of the equivalent oxide film increases. However, the degree of leakage current reduction according to the increase of the thickness of the equivalent oxide film is different. Specifically, the amount of leakage current reduction per unit thickness of the equivalent oxide film is greater in the case of $TiO_2$ layer/$ZrO_2$ layer (6G2) and $TiO_2$ layer/$HfO_2$ layer (6G3) than in the case of $TiO_2$ layer (6G1), and is greater in the case of $TiO_2$ layer/$HfO_2$ layer (6G3) than the case of $TiO_2$ layer/$ZrO_2$ layer (6G2). Table 1 below numerically summarizes these relationships.

TABLE 1

| | a) $\partial LKG/ \partial t_{film}$ | Thickness (Å) to reduce LKG 1-order | b) $\partial T_{oxeq.}/ \partial t_{film}$ | a)/b) | c)$\partial LKG/ \partial T_{oxeq.}$ |
|---|---|---|---|---|---|
| $TiO_2$ | −0.034 | ~29 | 0.059 | −0.569 | −0.508 |
| $TiO_2/ZrO_2$ | −0.098 | ~10 | 0.131 | −0.743 | −0.605 |
| $TiO_2/HfO_2$ | −0.178 | ~6 | 0.162 | −1.098 | −0.987 |

In Table 1, a) represents the change (reduction) of the leakage current (LKG) with respect to the actual thickness ($t_{film}$) change of the $TiO_2$ layer, the $TiO_2$ layer/$ZrO_2$ layer, and the $TiO_2$ layer/$HfO_2$ layer, and b) represents a ratio of the actual thickness ($t_{film}$) of the $TiO_2$ layer, the $TiO_2$ layer/$ZrO_2$ layer, and the $TiO_2$ layer/$HfO_2$ layer to the thickness ($T_{oxeq}$) of the equivalent oxide film.

Referring to Table 1, in the case of the $TiO_2$ layer, the leakage current reduction per unit thickness of the equivalent oxide film is about −0.508, and in the case of the $TiO_2$ layer/$ZrO_2$ layer, and the $TiO_2$ layer/$HfO_2$ layer, the leakage current reduction per unit thickness of the equivalent oxide film is about −0.605 and −0.987, respectively. In this way, in the case of the $TiO_2$ layer, in the case of the $TiO_2$ layer/$ZrO_2$ layer, and in the case of the $TiO_2$ layer/$HfO_2$ layer, the amount of leakage current reduction according to the thickness change is different, and thus, the actual thickness required to reduce a leakage current by an order of magnitude is also different in each case. As summarized in Table 1, in the case of the $TiO_2$ layer, an actual thickness required to reduce the leakage current by one order is about 29 Å (2.9 nm), in the case of the $TiO_2$ layer/$ZrO_2$ layer, is about 10 Å (1.0 nm), and in the case of $TiO_2$ layer/$HfO_2$ layer, is about 6 Å (0.6 nm).

In this way, the actual thickness required to reduce the leakage current by one order is less in the case of the $TiO_2$ layer/$ZrO_2$ layer and the case of the $TiO_2$ layer/$HfO_2$ layer than in the case of the $TiO_2$ layer. Therefore, a layer structure for reducing the leakage current at the same thickness is more advantageous in the cases of the $TiO_2$ layer/$ZrO_2$ layer or the $TiO_2$ layer/$HfO_2$ layer than in the case of the $TiO_2$ layer.

Figure 7:
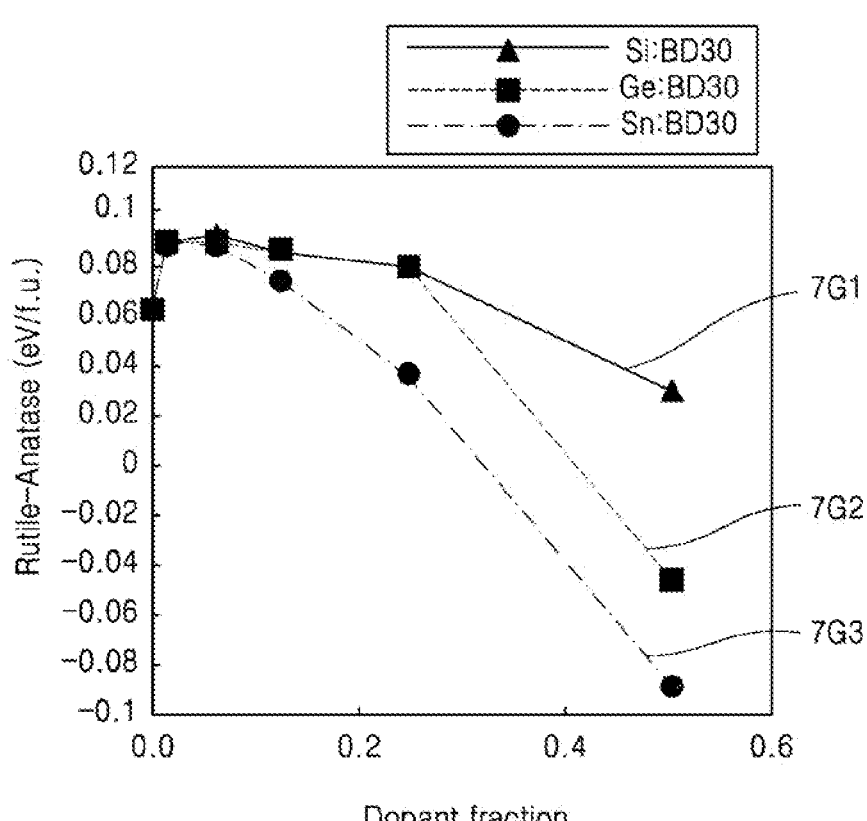

FIG. 7 shows simulation results for the relationship between the doping amount of the phase stabilization layer to the $TiO_2$ layer and the stabilization of the rutile-phase of the $TiO_2$ layer.

In FIG. 7, the horizontal axis represents a doping fraction or doping concentration of a phase stabilization dopant doped into the $TiO_2$ layer for phase stabilization, and the vertical axis represents a phase of the $TiO_2$ layer and the degree of phase stabilization. When a value on the vertical axis is greater than 0, an anatase phase is dominant in the $TiO_2$ layer, and as the value increases, the anatase phase becomes more thermodynamically stable. When the value of the vertical axis is less than 0, that is, when it is a negative value, the rutile-phase dominates in the $TiO_2$ layer, and as the negative value increases, the rutile-phase becomes more thermodynamically stable.

In the simulation conducted to obtain the result of FIG. 7, a $SnO_2$ layer, a $GeO_2$ layer, and a $SiO_2$ layer which have a rutile-phase were used as the phase stabilization layer. In other words, Sn, Ge, and Si were used as dopants for phase stabilization in the simulation. The simulation was performed on the first to third doped $TiO_2$ layers. The first doped $TiO_2$ layer includes a $SiO_2$ layer used as a phase stabilization layer, and it may be regarded as that Si is doped. The second doped $TiO_2$ layer includes a $GeO_2$ layer used as a phase stabilization layer, and it may be regarded as that Ge is doped. The third doped $TiO_2$ layer includes a $SnO_2$ layer used as a phase stabilization layer, and it may be regarded as that Sn is doped.

In FIG. 7, a first graph 7G1 shows a simulation result for the first doped $TiO_2$ layer, and a second graph 7G2 shows a simulation result for the second doped $TiO_2$ layer. The third graph 7G3 shows a simulation result for the third doped $TiO_2$ layer.

Referring to the first to third graphs 7G1, 7G2, and 7G3, at the beginning of doping, the first to third graphs 7G1, 7G2, and 7G3 are in a region where the anatase phase is dominant. As the doping amount of the phase stabilization material increases, the first to third graphs 7G1, 7G2, and 7G3 are downward and show a tendency to fall deeply into a region where the rutile-phase is dominant. The shape suggests that the phases of the first to third doped $TiO_2$ layers are changed to a stable rutile-phase from the anatase-phase as the doping amount of the phase stabilizing material increases.

As a result, FIG. 7 suggests that, in the case of the $TiO_2$ layer doped with a phase stabilization layer, a stable rutile-phase may be obtained by adjusting the doping concentration.

Figure 8:
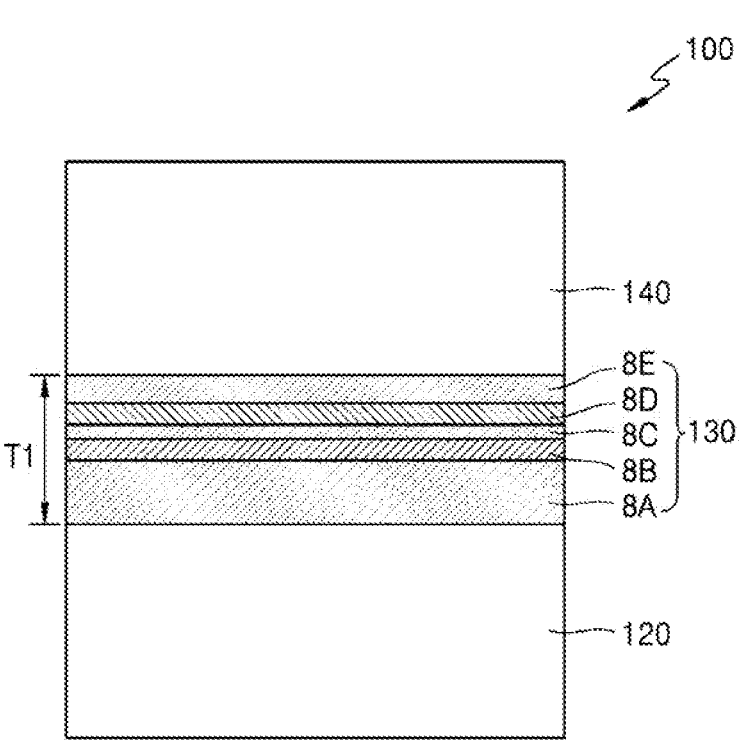
FIGS. 8 to 31 are cross-sectional views illustrating various examples of the layer structure of FIG. 1.

FIG. 8 shows a first example of the layer structure 100 of FIG. 1.

Referring to FIG. 8, the dielectric layer 130 includes a first $TiO_2$ layer 8A, a phase stabilization layer 8B, a second $TiO_2$ layer 8C, a leakage current suppressing layer 8D, and a third $TiO_2$ layer (8E) that are sequentially stacked. The leakage current suppressing layer 8D may be the second high-bandgap layer. The positions of the phase stabilization layer 8B and the leakage current suppressing layer 8D may be interchanged. The first to third $TiO_2$ layers 8A, 8C, and 8E may be $TiO_2$ layers. The first example of FIG. 8 may correspond to a case in which one of the two separated layers (e.g., 13c and 13e) selected from the second to sixth layers 13b to 13f of the dielectric layer 130 of FIG. 1 is a phase stabilization layer, the other layer is a leakage current suppressing layer, and the remaining layers of the dielectric layer 130 except for the two layers are all $TiO_2$ layers.

Figure 9:
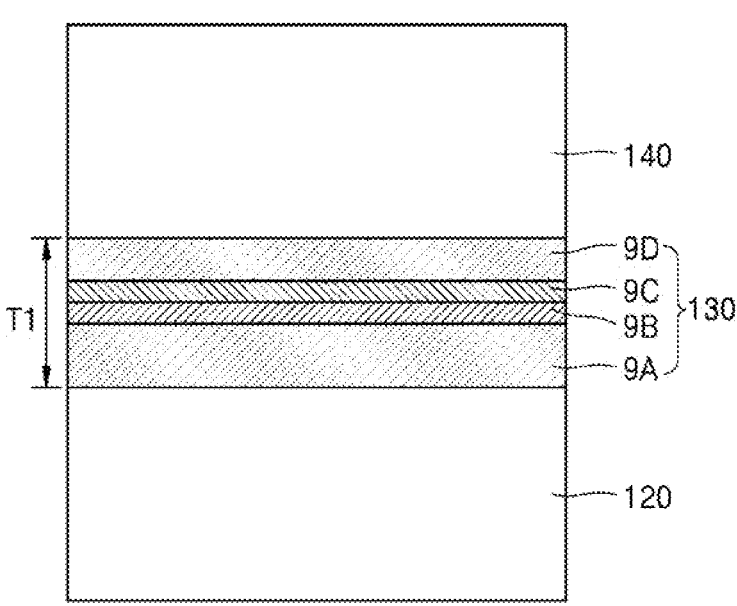

FIG. 9 shows a second example of the layer structure 100 of FIG. 1.

Referring to FIG. 9, the dielectric layer 130 includes a first $TiO_2$ layer 9A, a phase stabilization layer 9B, a leakage current suppressing layer 9C, and a second $TiO_2$ layer 9D that are sequentially stacked. The positions of the phase stabilization layer 9B and the leakage current suppressing layer 9C may be interchanged. The first and second $TiO_2$ layers 9A and 9D may be $TiO_2$ layers. The second example of FIG. 9 may correspond to a case in which one of the two layers (e.g., 13c and 13d) is in contact with each other selected from the second to sixth layers 13b to 13f of the dielectric layer 130 of FIG. 1 is a phase stabilization layer, the other layer is a leakage current suppressing layer, and all of the layers other than the two selected layers in the dielectric layer 130 are $TiO_2$ layers.

Figure 10:
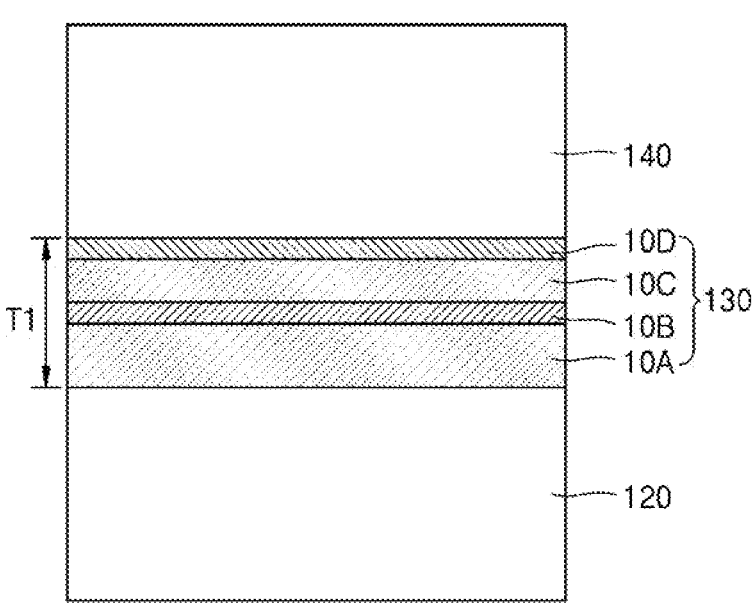

FIG. 10 shows a third example of the layer structure 100 of FIG. 1.

Referring to FIG. 10, the dielectric layer 130 includes a first $TiO_2$ layer 10A, a phase stabilization layer 10B, a second $TiO_2$ layer 10C, and a leakage current suppressing layer 10D that are sequentially stacked. The leakage current suppressing layer 10D may be the second high-bandgap layer. The positions of the phase stabilization layer 10B and the leakage current suppressing layer 10D may be interchanged. The first and second $TiO_2$ layers 10A and 10C may be $TiO_2$ layer. The third example of FIG. 10 may correspond to a case in which one of the seventh layer 13g and one layer (e.g., 13e) separated from the seventh layer 13g of the dielectric layer 130 of FIG. 1 is a phase stabilization layer, the other layer is a leakage current suppressing layer, and the remaining layers of the dielectric layer 130 except for the two layers 13e and 13g are all $TiO_2$ layers.

Figure 11:
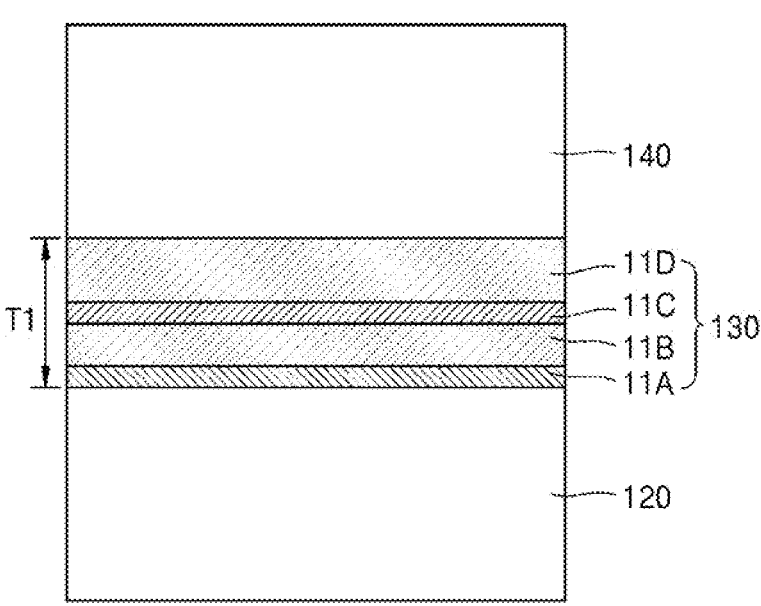

FIG. 11 shows a fourth example of the layer structure 100 of FIG. 1.

Referring to FIG. 11, the dielectric layer 130 includes a phase stabilization layer 11A, a first $TiO_2$ layer 11B, a leakage current suppressing layer 11C, and a second $TiO_2$ layer 11D that are sequentially stacked. The leakage current suppressing layer 11C may be the second high-bandgap layer. The positions of the phase stabilization layer 11A and the leakage current suppressing layer 11C may be interchanged. The first and second $TiO_2$ layers 11B and 11D may be $TiO_2$ layers. The fourth example of FIG. 11 may correspond to a case in which one of the first layer 13a of the dielectric layer 130 of FIG. 1 and the other layer (e.g., 13c) separated from the first layer 13a is a phase stabilization layer, the other layer is a leakage current suppressing layer, and the remaining layers of the dielectric layer 130 are all $TiO_2$ layers.

Figure 12:
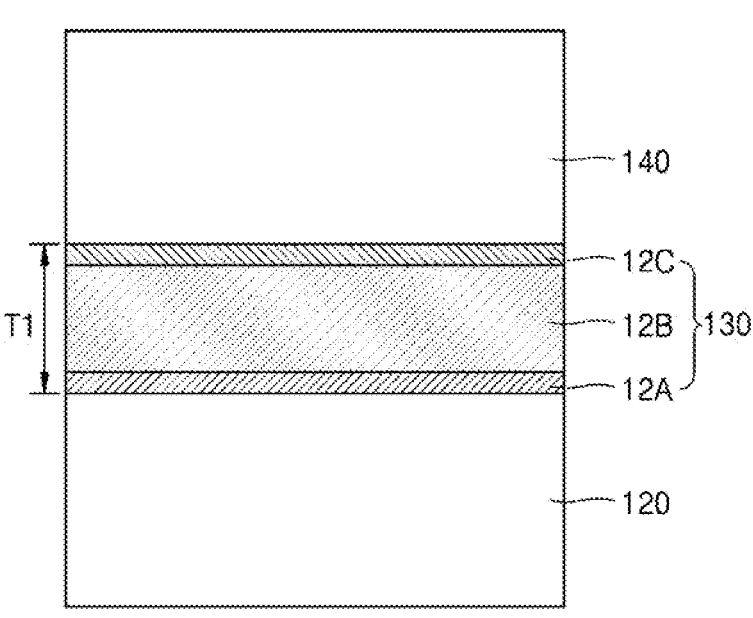

FIG. 12 shows a fifth example of the layer structure 100 of FIG. 1.

Referring to FIG. 12, the dielectric layer 130 includes a phase stabilization layer 12A, a $TiO_2$ layer 12B, and a leakage current suppressing layer 12C that are sequentially stacked. The leakage current suppressing layer 12C may be the second high-bandgap layer. The positions of the phase stabilization layer 12A and the leakage current suppressing layer 12C may be interchanged. The fifth example of FIG. 12 may correspond to a case in which one of the first layer 13a and the seventh layer 13g of the dielectric layer 130 of FIG. 1 is a phase stabilization layer, the other layer is a leakage current suppressing layer, and the remaining layers of the dielectric layer 130 are all $TiO_2$ layers.

Figure 13:
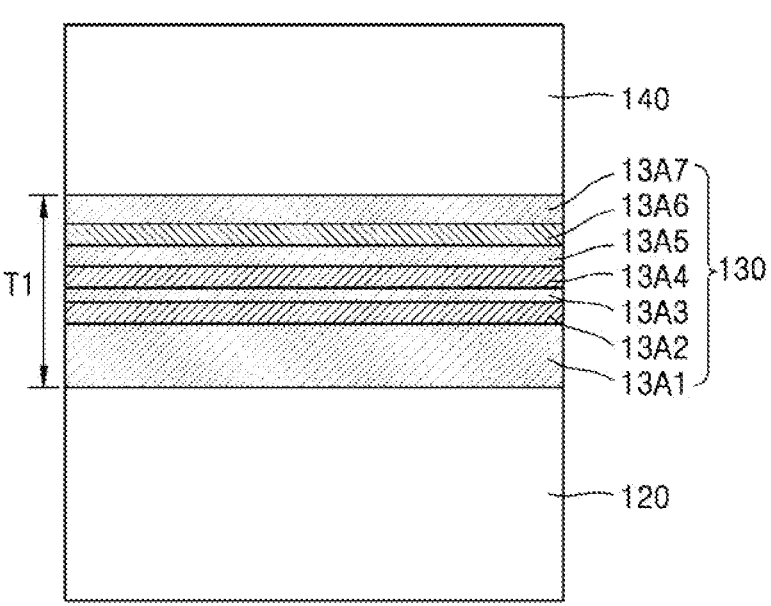

FIG. 13 shows a sixth example of the layer structure 100 of FIG. 1.

Referring to FIG. 13, the dielectric layer 130 includes a first $TiO_2$ layer 13A1, a first phase stabilization layer 13A2, a second $TiO_2$ layer 13A3, a second phase stabilization layer 13A4, a third $TiO_2$ layer 13A5, a leakage current suppressing layer 13A6, and a fourth $TiO_2$ layer 13A7 that are sequentially stacked. The leakage current suppressing layer 13A6 may be the second high-bandgap layer. The positions of one of the first and second phase stabilization layers 13A2 and 13A4 and the leakage current suppressing layer 13A6 may be interchanged. The first to fourth $TiO_2$ layers 13A1, 13A3, 13A5, and 13A7 may be $TiO_2$ layers. The sixth example of FIG. 13 may correspond to a case in which one of three layers (e.g., 13b, 13d, and 130 separated from each other selected from the second to sixth layers 13b to 13f of the dielectric layer 130 of FIG. 1 is a leakage current suppressing layer, the remaining two layers are phase stabilization layers, and the remaining layers of the dielectric layer 130 except for the three layers are $TiO_2$ layers.

Figure 14:
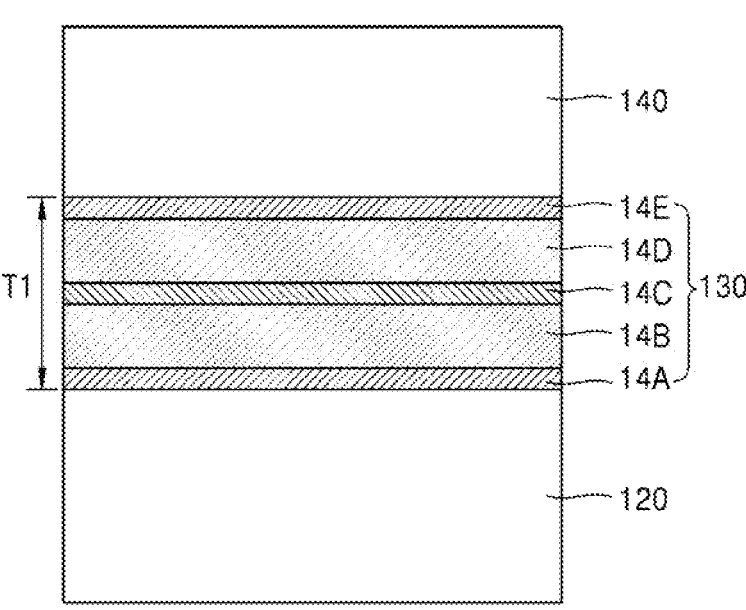

FIG. 14 shows a seventh example of the layer structure 100 of FIG. 1.

Referring to FIG. 14, the dielectric layer 130 includes a first phase stabilization layer 14A, a first $TiO_2$ layer 14B, a leakage current suppressing layer 14C, a second $TiO_2$ layer 14D, and a second phase stabilization layer 14E that are sequentially stacked. The positions of one of the first and second phase stabilization layers 14A and 14E and the leakage current suppressing layer 14C may be interchanged. The first and second $TiO_2$ layers 14B and 14D may be $TiO_2$ layers. The seventh example of FIG. 14 may correspond to a case in which two of the first and seventh layers 13a and 13g of the dielectric layer 130 of FIG. 1 and one layer (e.g., 13d) separated from the two layers 13a and 13g are phase stabilization layers, the remaining one layer is a leakage current suppressing layer, and the remaining layers of the dielectric layer 130 except for the three layers are $TiO_2$ layers.

Figure 15:
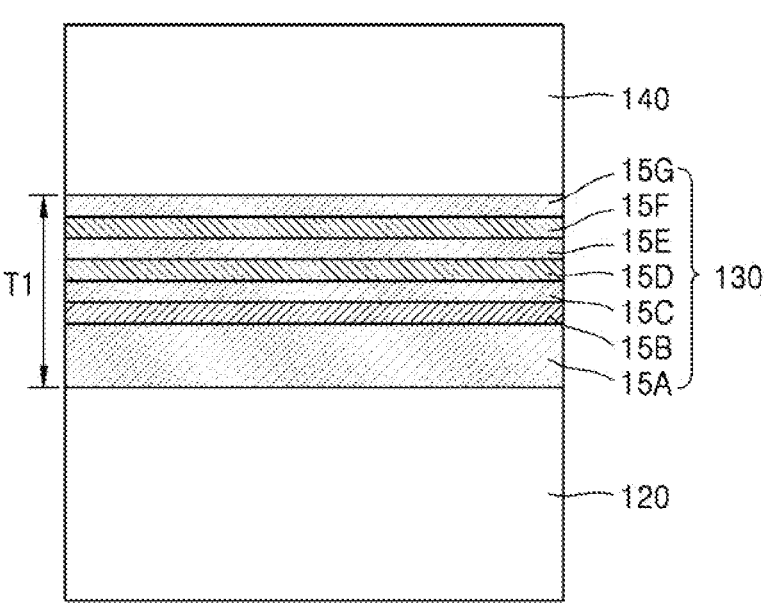

FIG. 15 shows an eighth example of the layer structure 100 of FIG. 1.

Referring to FIG. 15, the dielectric layer 130 includes a first $TiO_2$ layer 15A, a phase stabilization layer 15B, a second $TiO_2$ layer 15C, a first leakage current suppressing layer 15D, a third $TiO_2$ layer 15E, a second leakage current suppressing layer 15F, and a fourth $TiO_2$ layer 15G that are sequentially stacked. The positions of one of the first and second leakage current suppressing layers 15D and 15F and the position of the phase stabilization layer 15B may be interchanged. The first to fourth $TiO_2$ layers 15A, 15C, 15E, and 15G may be $TiO_2$ layers. The eighth example of FIG. 15 corresponds to a case in which one layer selected from the second layer 13b, the fourth layer 13d, and the sixth layer 13f of the dielectric layer 130 of FIG. 1 is a phase stabilization layer, the other two layers are leakage current suppressing layers, and the remaining layers of the dielectric layer 130 except for the three layers are $TiO_2$ layers.

Figure 16:
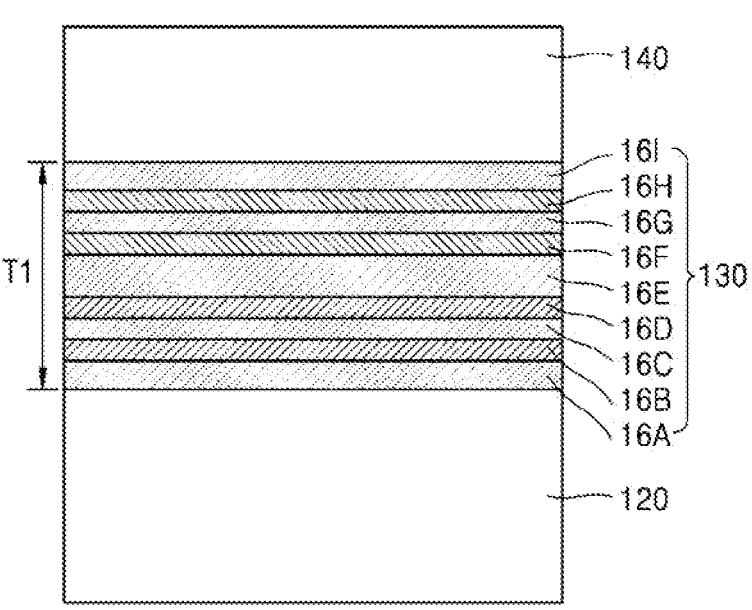

FIG. 16 shows a ninth example of the layer structure 100 of FIG. 1.

Referring to FIG. 16, the dielectric layer 130 includes a first $TiO_2$ layer 16A, a first phase stabilization layer 16B, a second $TiO_2$ layer 16C, a second phase stabilization layer 16D, a third $TiO_2$ layer 16E, a first leakage current suppressing layer 16F, a fourth $TiO_2$ layer 16G, a second leakage current suppressing layer 16H, and a fifth $TiO_2$ layer 16I that are sequentially stacked.

The positions of at least one of the first and second phase stabilization layers 16B and 16D and at least one of the first and second leakage current suppressing layers 16F and 16H may be interchanged. The first to fifth $TiO_2$ layers 16A, 16C,

16E, 16G, and 16I may be $TiO_2$ layers. The ninth example of FIG. 16 may correspond to a case in which, in the dielectric layer 130 of FIG. 1, the second layer 13b, the third layer 13c, the fifth layer 13e, and the sixth layer 13f are formed to be separated from each other, a $TiO_2$ layer is formed between the separated layers, two of the four layers 13b, 13c, 13e, and 13f are formed as phase stabilization layers, the remaining two layers are formed as leakage current suppressing layers, and the remaining layers of the dielectric layer 130 except for the four layers 13b, 13c, 13e, and 13f are $TiO_2$ layers.

Figure 17:
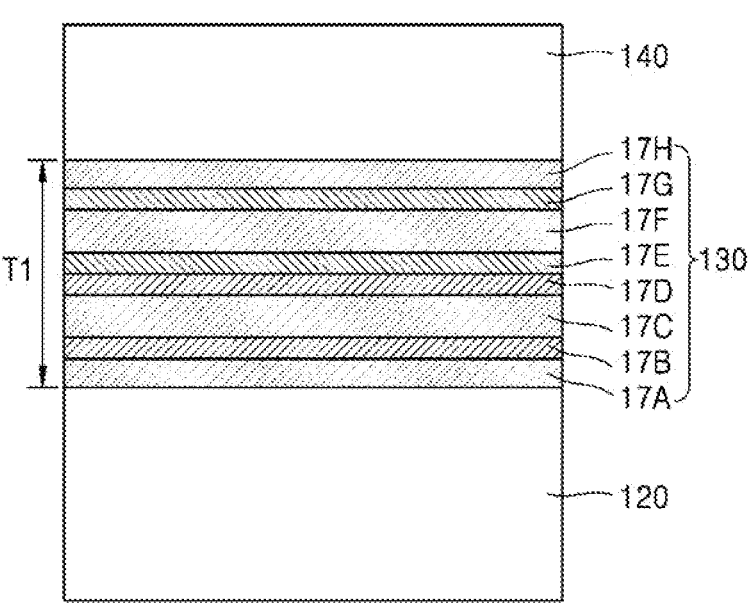

FIG. 17 shows a tenth example of the layer structure 100 of FIG. 1.

Referring to FIG. 17, the dielectric layer 130 includes a first $TiO_2$ layer 17A, a first phase stabilization layer 17B, a second $TiO_2$ layer 17C, a second phase stabilization layer 17D, a first leakage current suppressing layer 17E, a third $TiO_2$ layer 17F, a second leakage current suppressing layer 17G, and a fourth $TiO_2$ layer 17H that are sequentially stacked. The second phase stabilization layer 17D and the first leakage current suppressing layer 17E are in contact with each other.

The dielectric layer 130 of FIG. 17 corresponds to a case in which the second phase stabilization layer 16D and the first leakage current suppressing layer 16F contact each other in FIG. 16.

Figure 18:
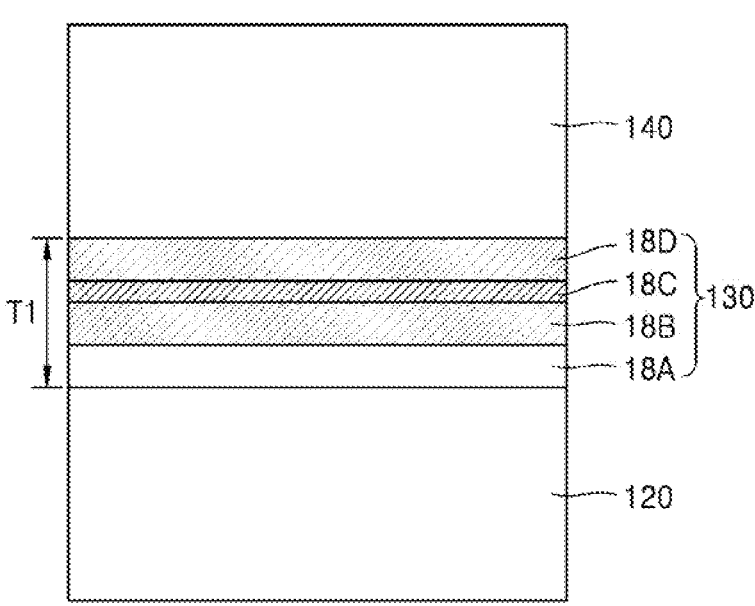

FIG. 18 shows an eleventh example of the layer structure 100 of FIG. 1.

Referring to FIG. 18, the dielectric layer 130 includes a first high-bandgap layer 18A, a first $TiO_2$ layer 18B, a phase stabilization layer 18C, and a second $TiO_2$ layer 18D that are sequentially stacked. The positions of the phase stabilization layer 18C and the first $TiO_2$ layer 18B may be interchanged. That is, the phase stabilization layer 18C may be positioned between the first high-bandgap layer 18A and the first $TiO_2$ layer 18B, and may be in contact with the both layers 18A and 18B. The eleventh example of FIG. 18 may correspond to a case in which the first layer 13a of the dielectric layer 130 of FIG. 1 is a first high-bandgap layer, the seventh layer 13g is a $TiO_2$ layer, one layer of the second layer 13b to the sixth layer 13f is a phase stabilization layer, and the other layers are $TiO_2$ layers.

Figure 19:
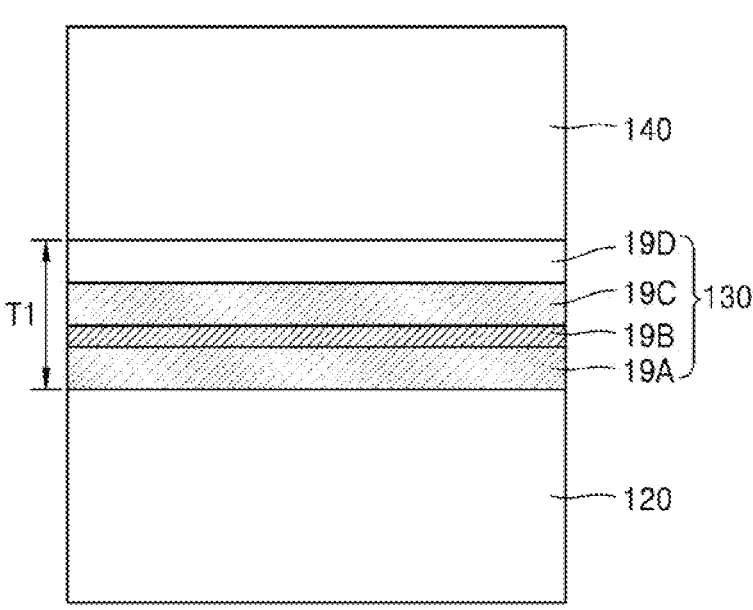

FIG. 19 shows a twelfth example of the layer structure 100 of FIG. 1.

Referring to FIG. 19, the dielectric layer 130 includes a first $TiO_2$ layer 19A, a phase stabilization layer 19B, a second $TiO_2$ layer 19C, and a first high-bandgap layer 19D that are sequentially stacked. The twelfth example of FIG. 19 may correspond to a case in which one of the second to sixth layers 13b, 13c, 13d, 13e, and 13f of the dielectric layer 130 of FIG. 1 is a phase stabilization layer, the seventh layer 13g is a first high-bandgap layer, and the remaining layers are $TiO_2$ layers.

Figure 20:
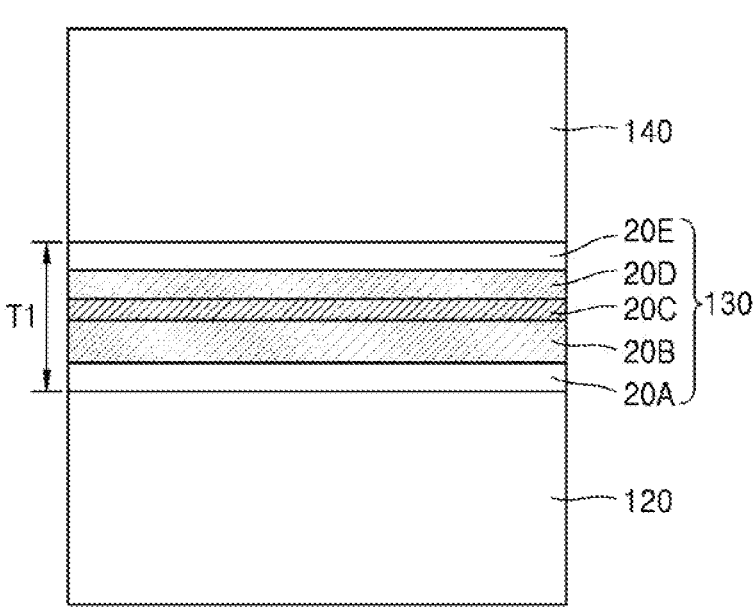

FIG. 20 shows a thirteenth example of the layer structure 100 of FIG. 1.

Referring to FIG. 20, the dielectric layer 130 includes a first high-bandgap layer 20A, a first $TiO_2$ layer 20B, a phase stabilization layer 20C, a second $TiO_2$ layer 20D, and a second high-bandgap layer 20E that are sequentially stacked. The thirteenth example of FIG. 20 may correspond to a case in which the first layer 13a and the seventh layer 13g of the dielectric layer 130 of FIG. 1 are high-bandgap layers, one of the second to sixth layers 13b, 13c, 13d, 13e, and 13f is a phase stabilization layer, and the other layers are $TiO_2$ layers.

Figure 21:
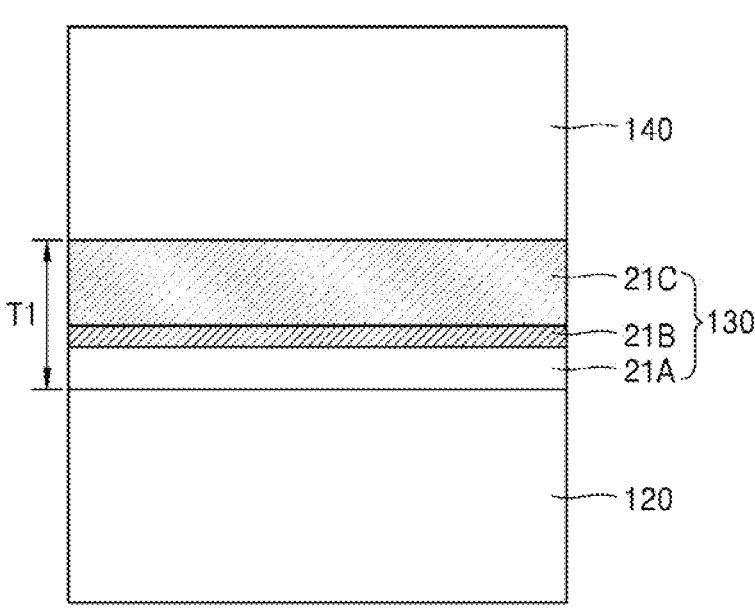

FIG. 21 shows a fourteenth example of the layer structure 100 of FIG. 1.

Referring to FIG. 21, the dielectric layer 130 includes a first high-bandgap layer 21A, a phase stabilization layer 21B, and a $TiO_2$ layer 21C that are sequentially stacked. The fourteenth example of FIG. 21 may correspond to a case in which the first layer 13a of the dielectric layer 130 of FIG. 1 is a high-bandgap layer, the second layer 13b is a phase stabilization layer, and the third to seventh layers 13c; 13d, 13e, 13f, and 13g are $TiO_2$ layers.

Figure 22:
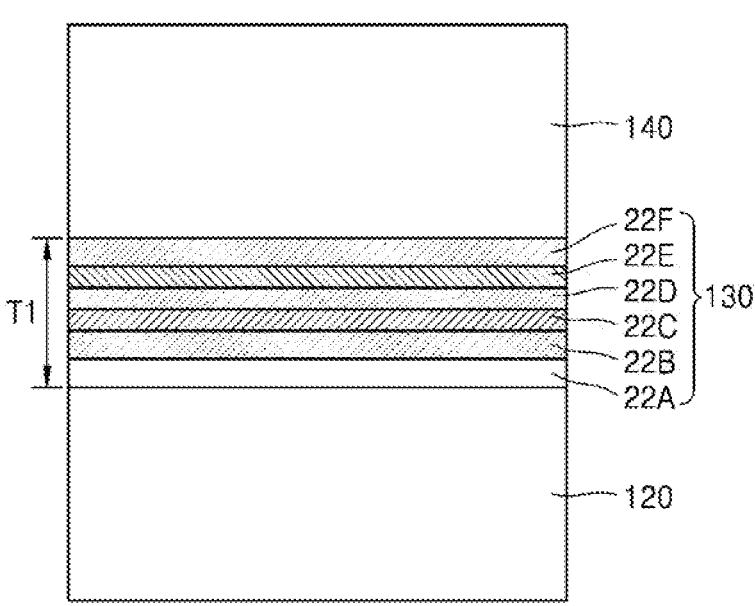

FIG. 22 shows a fifteenth example of the layer structure 100 of FIG. 1.

Referring to FIG. 22, the dielectric layer 130 includes a high-bandgap layer 22A, a first $TiO_2$ layer 22B, a phase stabilization layer 22C, a second $TiO_2$ layer 22D, a leakage current suppressing layer 22E, and a third $TiO_2$ layer 22F that are sequentially stacked. As above, the first to third $TiO_2$ layers 22B, 22D, and 22F may be $TiO_2$ layers that are, e.g., materially identical to each other. The fifteenth example of FIG. 22 may correspond to a case in which the first layer 13a of the dielectric layer 130 of FIG. 1 is a high-bandgap layer, one of the second and third layers 13b and 13c is a phase stabilization layer, one of the fifth and sixth layers 13e and 13f is a leakage current suppressing layer, and the remaining layers are $TiO_2$ layers.

Figure 23:
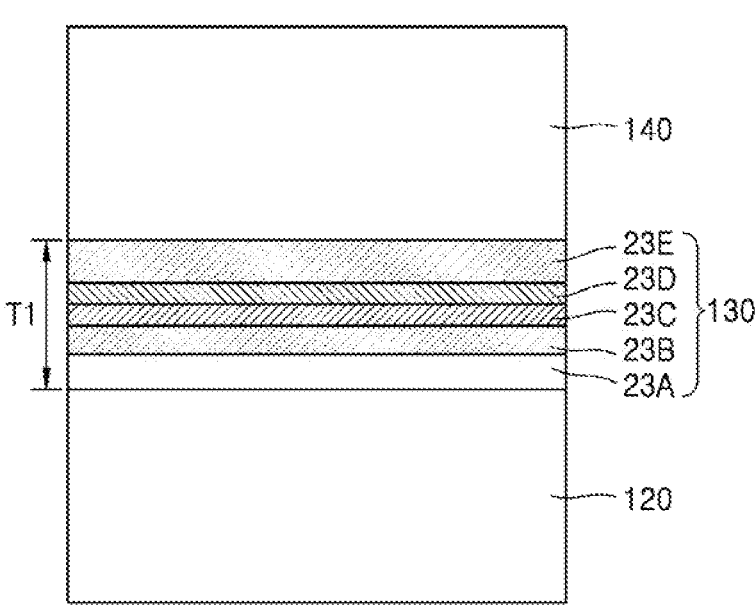

FIG. 23 shows a sixteenth example of the layer structure 100 of FIG. 1.

Referring to FIG. 23, the dielectric layer 130 includes a high-bandgap layer 23A, a first $TiO_2$ layer 23B, a phase stabilization layer 23C, a leakage current suppressing layer 23D, and a second $TiO_2$ layer 23E that are sequentially stacked. The first and second $TiO_2$ layers 23B and 23E may be $TiO_2$ layers that are materially identical to each other. The sixteenth example of FIG. 23 may correspond to a case in which the first layer 13a of the dielectric layer 130 of FIG. 1 is a high-bandgap layer, one of two adjacent layers selected from the third to sixth layers 13c to 13f is a phase stabilization layer, the other layer is a leakage current suppressing layer, and the remaining layers of the dielectric layer 130 are $TiO_2$ layers.

Figure 24:
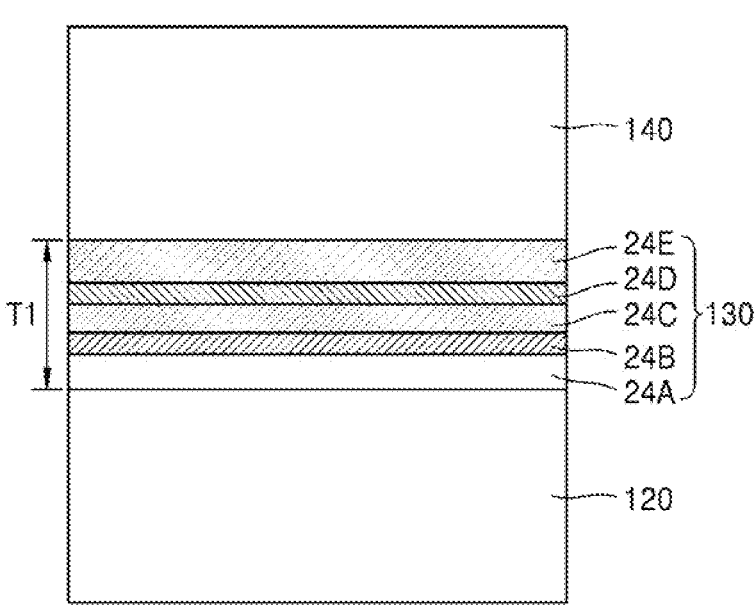

FIG. 24 shows a seventeenth example of the layer structure 100 of FIG. 1.

Referring to FIG. 24, the dielectric layer 130 includes a high-bandgap layer 24A, a phase stabilization layer 24B, a first $TiO_2$ layer 24C, a leakage current suppressing layer 24D, and a second $TiO_2$ layer 24E that are sequentially stacked.

The first and second $TiO_2$ layers 24C and 24E may be $TiO_2$ layers that are materially identical to each other. The seventeenth example of FIG. 24 may correspond to a case in which the first layer 13a of the dielectric layer 130 of FIG. 1 is a high-bandgap layer, the second layer 13b is a phase stabilization layer, one of the fourth to sixth layers 13d to 13f is a leakage current suppressing layer, and the remaining layers of the dielectric layer 130 are $TiO_2$ layers.

Figure 25:
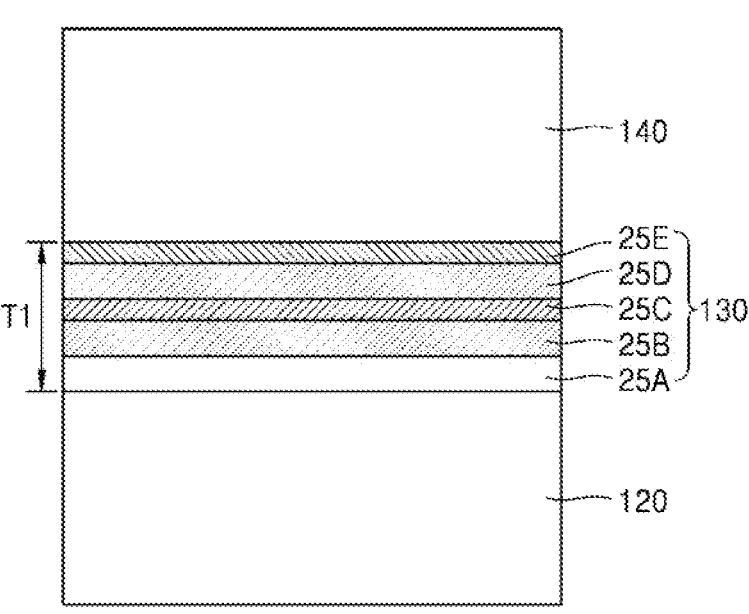

FIG. 25 shows an eighteenth example of the layer structure 100 of FIG. 1.

Referring to FIG. 25, the dielectric layer 130 includes a high-bandgap layer 25A, a first $TiO_2$ layer 25B, a phase stabilization layer 25C, a second $TiO_2$ layer 25D, and a leakage current suppressing layer 25E that are sequentially stacked.

The first and second $TiO_2$ layers 25B and 25D may be $TiO_2$ layers that are otherwise physically identical to each other. The eighteenth example of FIG. 25 may correspond to a case in which the first layer 13a of the dielectric layer 130 of FIG. 1 is a high-bandgap layer, the seventh layer 13g is a leakage current suppressing layer, one of the third to fifth layers 13c to 13e is a phase stabilization layer, and the remaining layers of the dielectric layer 130 are $TiO_2$ layers.

Figure 26:
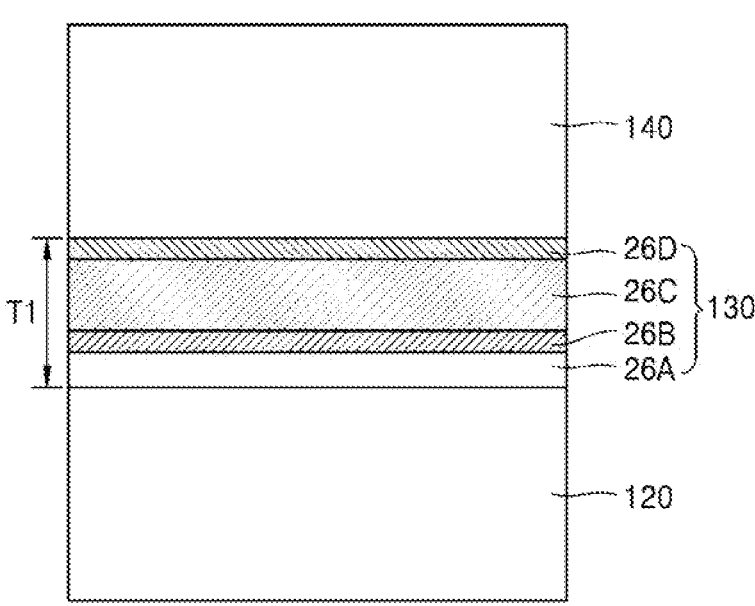

FIG. 26 shows a nineteenth example of the layer structure 100 of FIG. 1.

Referring to FIG. 26, the dielectric layer 130 includes a high-bandgap layer 26A, a phase stabilization layer 26B, a $TiO_2$ layer 26C, and a leakage current suppressing layer 26D that are sequentially stacked.

The 19th example of FIG. 26 may correspond to a case in which the first layer 13a of the dielectric layer 130 of FIG. 1 is a high-bandgap layer, one of the second layer 13b and the seventh layer 13g is a leakage current suppressing layer, the other layer is a phase stabilization layer, and the remaining layers of the dielectric layer 130 are $TiO_2$ layers.

Figure 27:
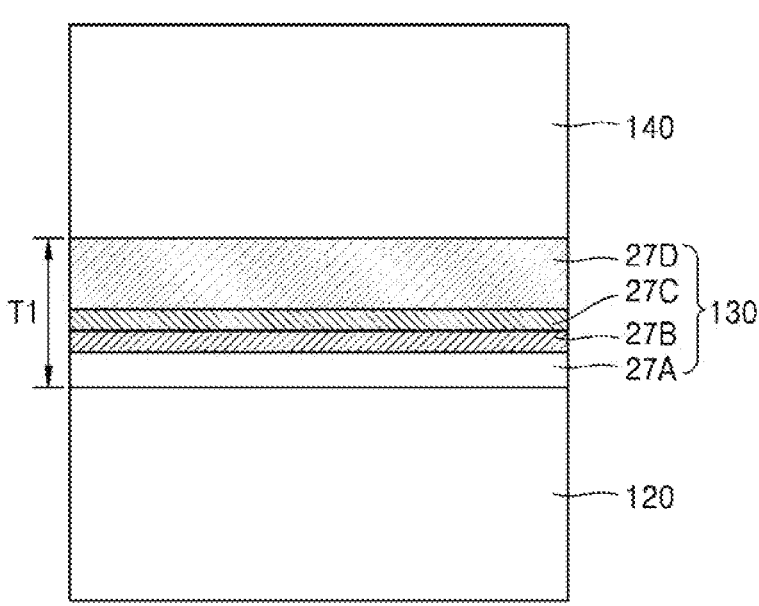

FIG. 27 shows a twentieth example of the layer structure 100 of FIG. 1.

Referring to FIG. 27, the dielectric layer 130 includes a high-bandgap layer 27A, a phase stabilization layer 27B, a leakage current suppressing layer 27C, and a $TiO_2$ layer 27D that are sequentially stacked.

The twentieth example of FIG. 27 may correspond to a case in which the first layer 13a of the dielectric layer 130 of FIG. 1 is a high-bandgap layer, one of the second layer 13b and the third layer 13c is a leakage current suppressing layer, the other layer is a phase stabilization layer, and the remaining layers of the dielectric layer 130 are $TiO_2$ layers.

Figure 28:
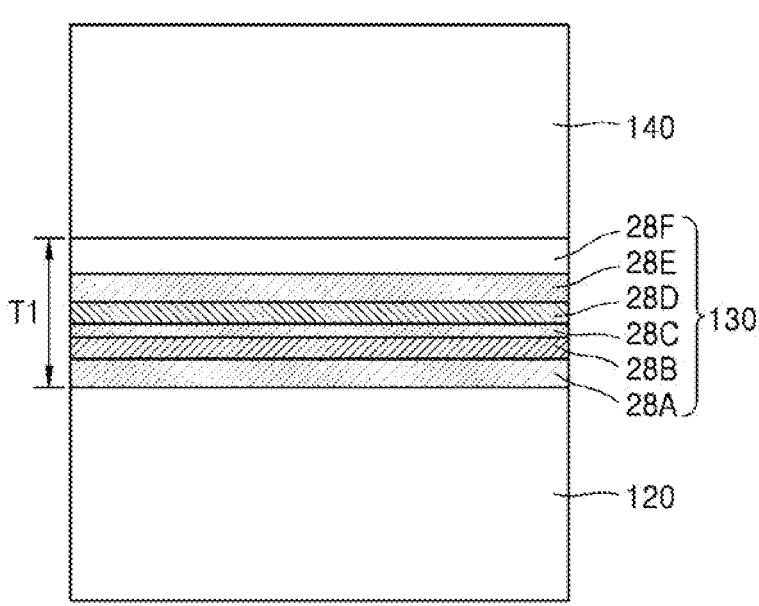

FIG. 28 shows a twenty-first example of the layer structure 100 of FIG. 1.

Referring to FIG. 28, the dielectric layer 130 includes a first $TiO_2$ layer 28A, a phase stabilization layer 28B, a second $TiO_2$ layer 28C, a leakage current suppressing layer 28D, and a third $TiO_2$ layer 28E, and a high-bandgap layer 28F that are sequentially stacked. The first to third $TiO_2$ layers 28A, 28C, and 28E may be $TiO_2$ layers that are materially identical to each other. The twenty-first example of FIG. 28 may correspond to a case in which the seventh layer 13g of the dielectric layer 130 of FIG. 1 is a high-bandgap layer, one of the third layer 13c and the fifth layer 13e is a leakage current suppressing layer, the other layer is a phase stabilization layer, and the remaining layers of the dielectric layer 130 are $TiO_2$ layers.

Figure 29:
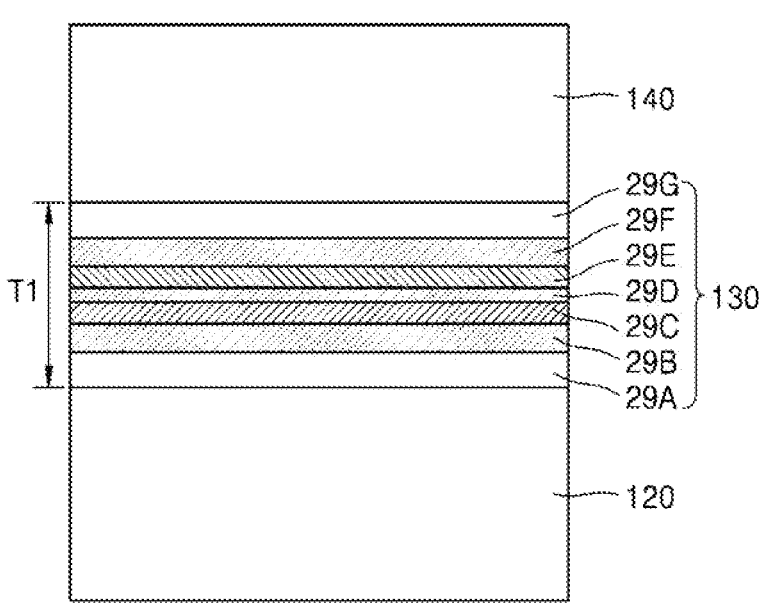

FIG. 29 shows a twenty-second example of the layer structure 100 of FIG. 1.

Referring to FIG. 29, the dielectric layer 130 includes a first high-bandgap layer 29A, a first $TiO_2$ layer 29B, a phase stabilization layer 29C, a second $TiO_2$ layer 29D, and leakage current suppressing layer 29E, a third $TiO_2$ layer 29F, and a second high-bandgap layer 29G that are sequentially stacked. The first to third $TiO_2$ layers 29B, 29D, and 29F may be $TiO_2$ layers that are materially identical to each other. The twenty-second example of FIG. 29 may correspond to a case in which the first and seventh layers 13a and 13g of the dielectric layer 130 of FIG. 1 are high-bandgap layers, one of the third layer 13c and the fifth layer 13e is a leakage current suppressing layer, the other layer is a phase stabilization layer, and the remaining layers of the dielectric layer 130 are $TiO_2$ layers.

Figure 30:
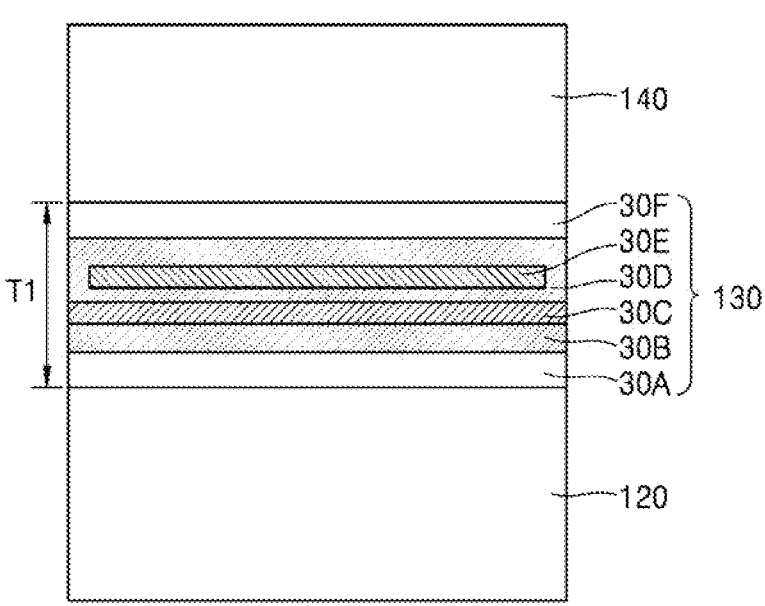

FIG. 30 shows a twenty-third example of the layer structure 100 of FIG. 1.

Referring to FIG. 30, the dielectric layer 130 includes a first high-bandgap layer 30A, a first $TiO_2$ layer 30B, a phase stabilization layer 30C, a second $TiO_2$ layer 30D, a leakage current suppressing layer 30E, and a second high-bandgap layer 30F that are sequentially stacked. The first and second $TiO_2$ layers 30B and 30D may be $TiO_2$ layers that are materially identical to each other. The leakage current suppressing layer 30E is buried in the second $TiO_2$ layer 30D.

Accordingly, the leakage current suppressing layer 30E does not contact the second high-bandgap layer 30F. The positions of the leakage current suppressing layer 30E and the phase stabilization layer 30C may be interchanged.

A buried structure may be formed as follows. The buried structure may be formed such that, after first forming a partial thickness of the second TiO₂ layer 30D, only a portion of the firstly formed TiO₂ layer is exposed by masking, and the leakage current suppressing layer 30E is formed on the exposed portion of the firstly formed TiO₂ layer, and then, the remaining thickness of the second TiO₂ layer 30D is formed to completely cover the leakage current suppressing layer 30E.

The twenty-third example of FIG. 30 may correspond to a case in which the first and seventh layers 13a and 13g of the dielectric layer 130 of FIG. 1 are high-bandgap layers, one of the third layer 13c and the fifth layer 13e is a leakage current suppressing layer, the other layer is a phase stabilization layer, and in the case when the remaining layers of the dielectric layer 130 are TiO₂ layers, the fifth layer 13e is completely surrounded by the fourth layer 13d and the sixth layer 13f because the width of the fifth layer 13e is less than the widths of the adjacent fourth and sixth layers 13d and 13f.

Figure 31:
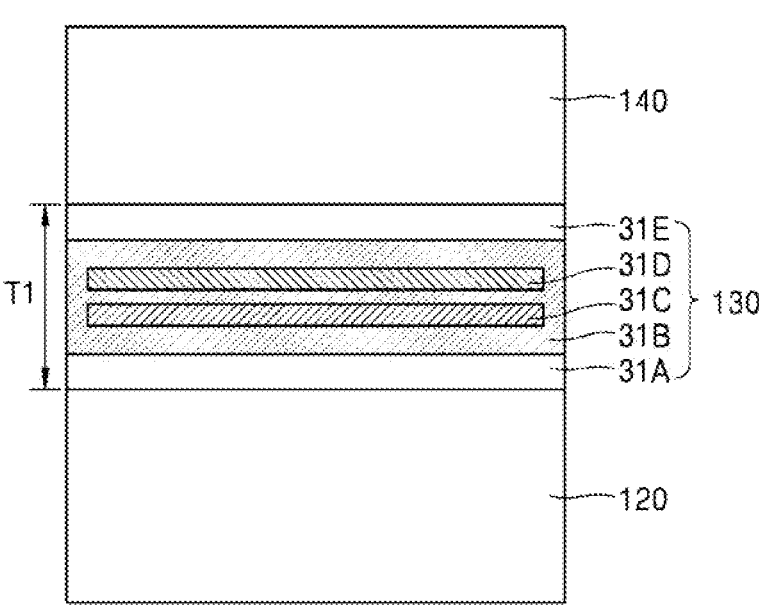

FIG. 31 shows a twenty-fourth example of the layer structure 100 of FIG. 1.

Referring to FIG. 31, the dielectric layer 130 includes a first high-bandgap layer 31A, a TiO₂ layer 31B, a phase stabilization layer 31C, a leakage current suppressing layer 31D, and a second high-bandgap layer 31E that are sequentially stacked. The phase stabilization layer 31C and the leakage current suppressing layer 31D are buried in the TiO₂ layer 31B. The phase stabilization layer 31C and the leakage current suppressing layer 31D are separated from each other in a buried state. The leakage current suppressing layer 31D and the phase stabilization layer 31C do not contact the first and second high-bandgap layers 31A and 31E. The positions of the leakage current suppressing layer 31D and the phase stabilization layer 31C may be interchanged. A layer structure in which the phase stabilization layer 31C and the leakage current suppressing layer 31D are buried may be formed by applying the method of forming the layer structure in which the leakage current suppressing layer 30E of FIG. 30 is buried.

The twenty-fourth example of FIG. 31 may correspond to a case in which the first and seventh layers 13a and 13g of the dielectric layer 130 of FIG. 1 are high-bandgap layers, one of the third layer 13c and the fifth layer 13e is a leakage current suppressing layer, the other layer is a phase stabilization layer, and in the case when the remaining layers of the dielectric layer 130 are TiO₂ layers, the third and fifth layers 13c and 13e are completely surrounded by the second, fourth, and sixth layers 13b, 13d, and 13f because the widths of the third and fifth layers 13c and 13e are shorter than the widths of the layers 13b, 13d, and 13f.

In the examples shown in FIGS. 8 to 31, when the dielectric layer 130 includes a phase stabilization layer (e.g., 8B, 22C) and a leakage current suppressing layer (a first high-bandgap layer) (e.g., 8D, 22E), each of the phase stabilization layer and the leakage current suppressing layer may include two or more layers, and the phase stabilization layer and the leakage current suppressing layer may be alternately repeatedly stacked.

Figure 32:
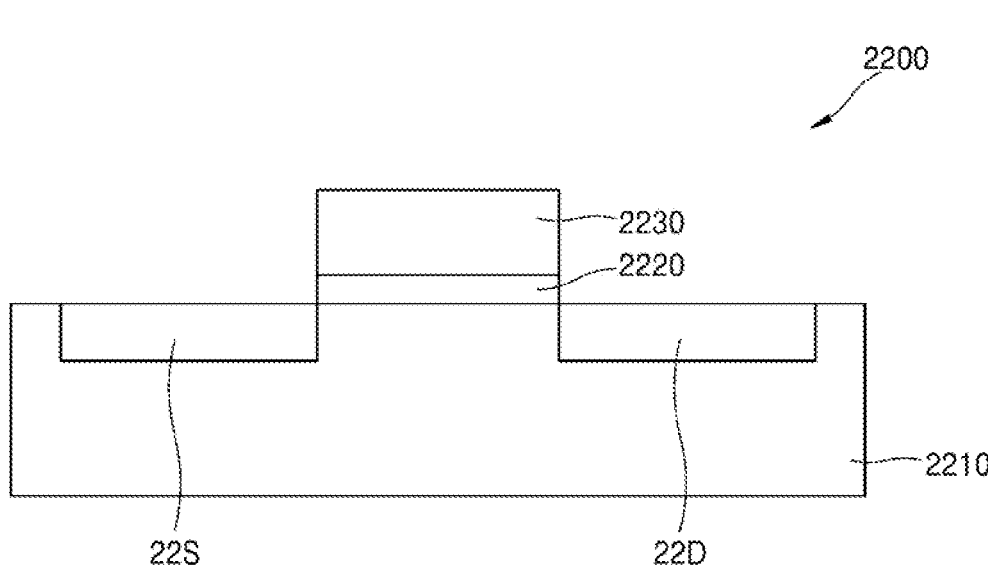
FIG. 32 is a cross-sectional view of a first electronic device (first transistor) including a layer structure or a dielectric layer included in the layer structure, according to some example embodiments.

FIG. 32 shows a first electronic device 2200 including a layer structure according to some example embodiments. The first electronic device 2200 may be or include a field effect transistor.

Referring to FIG. 32, the first electronic device 2200 includes a substrate 2210 having first and second doped regions 22S and 22D separated from each other, a gate insulating layer 2220 on the substrate 2210 between the first and second doped regions 22S and 22D, and a gate electrode 2230 on the gate insulating layer 2220. In at least some embodiments, the substrate 2210 may include a semiconductor substrate doped with at least a first type impurity, and the first and second doped regions 22S and 22D may be provided on the semiconductor substrate. In some example embodiments, the substrate 2210 may be a P-type semiconductor substrate or an N-type semiconductor substrate doped with a P-type or N-type conductive impurity as the first-type impurity. A non-semiconductor layer may further be provided under the semiconductor substrate. In some example embodiments, the non-semiconductor layer may include an insulating layer. The first and second doped regions 22S and 22D may be regions doped with a second type impurity. The second type impurity may be an impurity opposite to the first type impurity. For example, when the first type impurity is a P-type conductive impurity, the second type impurity may be an N-type conductive impurity. One of the first and second doped regions 22S and 22D may be a source region, and the other may be a drain region. The gate insulating layer 2220 may be formed on an upper surface of the substrate 2210 between the first and second doped regions 22S and 22D, cover the entire upper surface, and may be in direct contact with the upper surface. The substrate 2210 under the gate insulating layer 2220 may provide a channel between the first and second doped regions 22S and 22D. When the first electronic device 2200 is operated, carriers may move between the first and second doped regions 22S and 22D through the channel. The carrier may include electrons or holes. The gate insulating layer 2220 may be in contact with the first and second doped regions 22S and 22D. The gate insulating layer 2220 may extend over a portion of the first and second doped regions 22S and 22D. In some example embodiments, the gate insulating layer 2220 may be or include the dielectric layer 130 described with reference to FIGS. 1 and 8 to 31 but is not limited thereto. When considering materials of the substrate 2210, the gate insulating layer 2220, and the gate electrode 2230, a layer structure including the substrate 2210, the gate insulating layer 2220, and the gate electrode 2230 may correspond, e.g., to the layer structure 100 of FIG. 1.

The gate insulating layer 2220 and the gate electrode 2230 may be collectively referred to as a gate stack.

Figure 33:
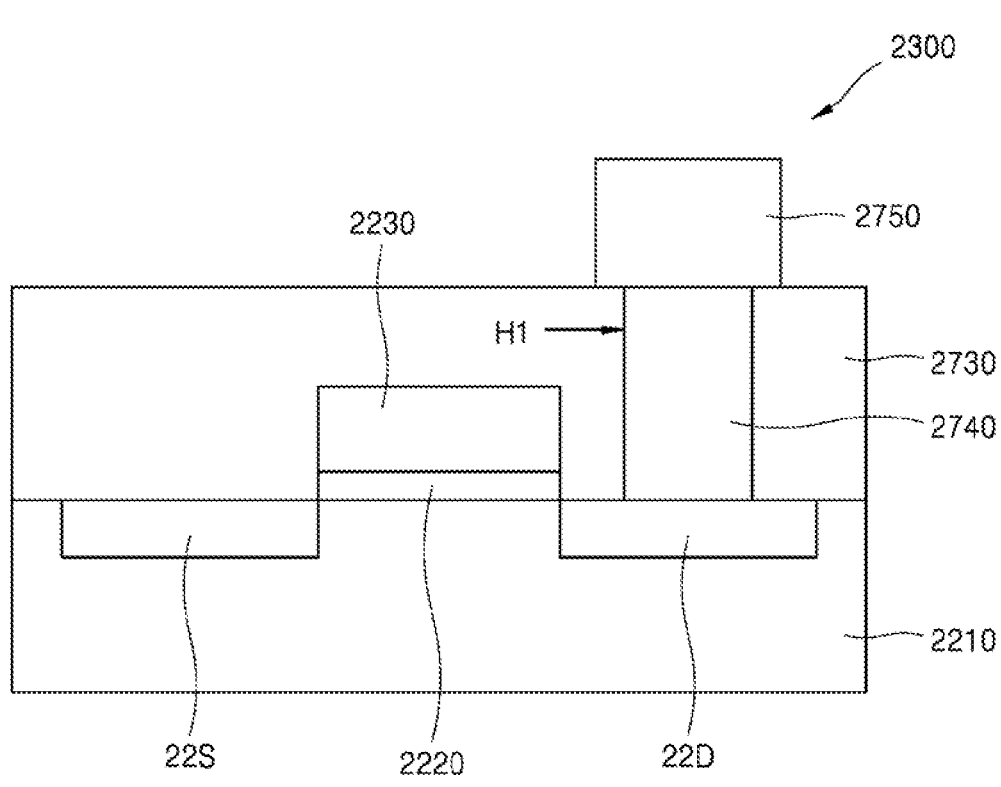
FIG. 33 is a cross-sectional view of a memory device including a layer structure or a dielectric layer included in the layer structure, according to some example embodiments.

FIG. 33 shows a memory device 2300 including a layer structure according to some example embodiments.

Referring to FIG. 33, the memory device 2300 includes the substrate 2210, the first and second doped regions 22S and 22D formed on the substrate 2210, the gate insulating layer 2220 and the gate electrode 2230 sequentially stacked on the substrate 2210 between the first and second doped regions 22S and 22D, and a data storage element 2750 connected to the second doped region 22D.

An interlayer insulating layer 2730 is formed on the substrate 2210 to cover the first and second doped regions 22S and 22D and the gate electrode 2230. The interlayer insulating layer 2730 includes a via hole H1 exposing a portion of the second doped region 22D. The via hole H1 is filled with a conductive plug 2740. The conductive plug 2740 covers an entire exposed portion of the second doped region 22D. The data storage element 2750 may be provided on the interlayer insulating layer 2730, cover an upper surface of the conductive plug 2740, and may be in direct contact with the upper surface thereof. The data storage element 2750 may include memory cells disposed in storage nodes of various memory elements. For example, data storage element 2750 may include one of memory cells disposed in one of a storage node of a DRAM, a storage node of an SRAM, a storage node of an MRAM, and a storage node of a PRAM, but is not limited thereto. The memory cell may include a configuration capable of storing data '1' or '0'. The memory cell may include the dielectric layer 130 of FIG. 1. For example, the memory cell may include a capacitor of DRAM. The capacitor of the DRAM, as is known, includes a lower electrode, a dielectric layer and an upper electrode. In some example embodiments, at least one of the dielectric layer 2220 or the data storage element 2750 may include the dielectric layer 130 described in reference to FIGS. 1 and 8 to 31. For example, the dielectric layer of a capacitor included in the data storage element 2750 may be or include the dielectric layer 130 described with reference to FIG. 1.

Figure 34:
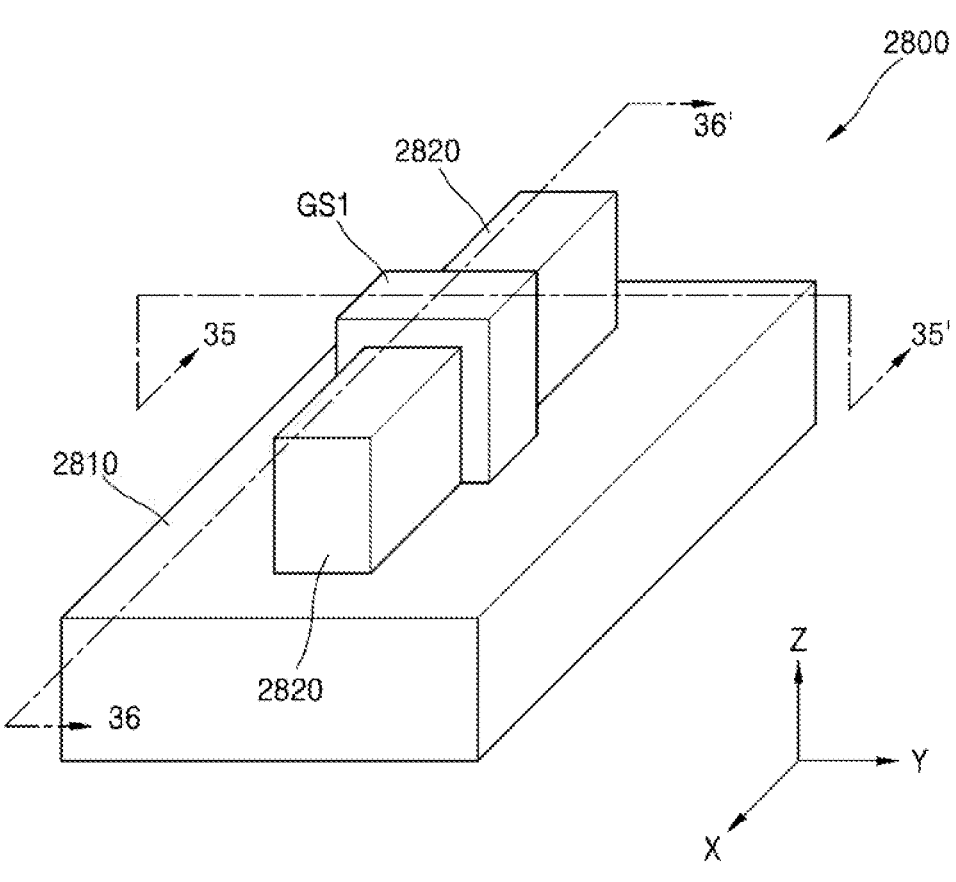
FIG. 34 is a perspective view of a second electronic device (second transistor) including a layer structure or a dielectric layer included in the layer structure, according to some example embodiments.
Figure 35:
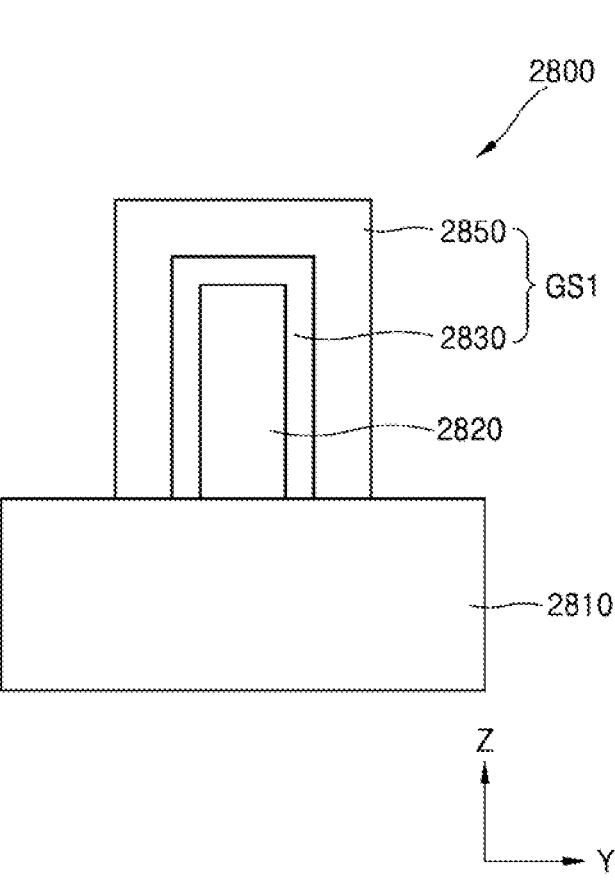
FIG. 35 is a cross-sectional view taken along line 35-35' of FIG. 34.
Figure 36:
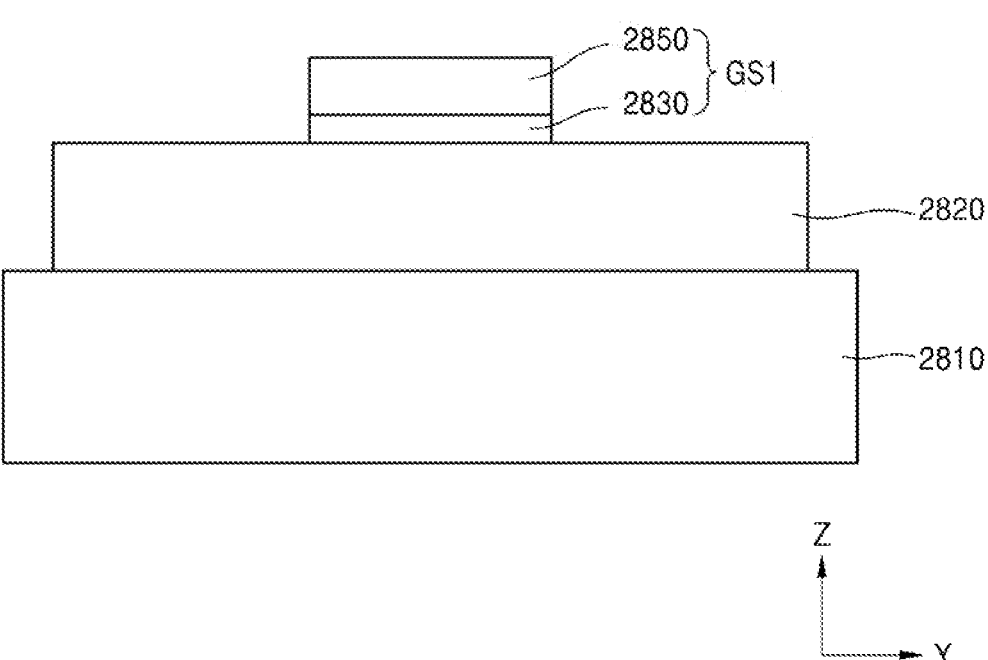
FIG. 36 is a cross-sectional view taken along line 36-36' of FIG. 34.

FIG. 34 shows a second electronic device 2800 including a layer structure according to some example embodiments; FIG. 35 shows a cross-sectional view taken along line 35-35' of FIG. 34; and FIG. 36 shows a cross-sectional view taken along line 36-36' of FIG. 34. The second electronic device 2800 may be a FinFET.

Referring to FIG. 34, a semiconductor layer 2820 is aligned in a first direction on a substrate 2810. A gate stack GS1 is provided on a partial region of the semiconductor layer 2820. The gate stack GS1 may be provided to partially cover the upper surface and both side surfaces of the semiconductor layer 2820. The substrate 2810 may be an insulating substrate. In some example embodiments, the substrate 2810 may be a substrate including an insulating layer on one surface thereof on which the semiconductor layer 2820 and the gate stack GS1 are formed. The one surface may be the upper surface of the substrate 2810. The first direction may be parallel to the one surface of the substrate 2810 or the X-axis. In some example embodiments, the semiconductor layer 2820 may include a P-type or N-type semiconductor layer. One of a left part and a right part of the semiconductor layer 2820 with respect to the gate stack GS1 may be a source or a source electrode, and the other part may be a drain or a drain electrode. Each of the semiconductor layer 2820 and the gate stack GS1 may have an aspect ratio greater than 1, but is not limited thereto. In an example, a height of each of the semiconductor layer 2820 and the gate stack GS1 in a Z-axis direction may be greater than, equal to, or less than a width thereof in a Y-axis direction. The gate stack GS1 may have a height greater than that of the semiconductor layer 2820. The gate stack GS1 may include a conductive contact and the dielectric layer 130 described in reference to FIGS. 1 and 8 to 31.

Referring to FIG. 35, the semiconductor layer 2820 is formed on the substrate 2810. The aspect ratio of the semiconductor layer 2820 may be greater than 1, but may be 1 or less than 1. A surface of the semiconductor layer 2820 may be a channel layer.

Both side surfaces and an upper surface of the semiconductor layer 2820 are covered with a gate insulating layer 2830. The gate insulating layer 2830 formed on the semiconductor layer 2820 may have a constant or substantially constant thickness. The thickness of the gate insulating layer 2830 may be less than that of the semiconductor layer 2820. The gate insulating layer 2830 may be or include the dielectric layer 130 of FIGS. 1 and 8 to 31. A gate electrode 2850 is stacked on upper and side surfaces of the gate insulating layer 2830. The upper surface and side surfaces of the gate electrode 2850 may be parallel to the upper surface and side surfaces of the gate insulating layer 2830.

Referring to FIG. 36, the semiconductor layer 2820 is formed on one surface of the substrate 2810. The gate insulating layer 2830 and the gate electrode 2850 are sequentially stacked on a partial region of the upper surface of the semiconductor layer 2820. A layer structure in which the semiconductor layer 2820, the gate insulating layer 2830, and the gate electrode 2850 are sequentially stacked may correspond to the layer structure 100 illustrated in FIG. 1.

In the semiconductor layer 2820, a left part and a right part of the gate stack GS1 may be doped with the same dopant. In an example, the dopant may include an N-type dopant or a P-type dopant. Depending on the dopant, the second electronic device 2800 may be an N-type device or a P-type device. Any one of the left part and the right part of the semiconductor layer 2820 may be a source region, and the other part may be a drain region. A region under the gate stack GS1 in the semiconductor layer 2820 may be a channel. The second electronic device 2800 may be a top gate FinFET in which the gate electrode 2850 is disposed above the channel.

Figure 37:
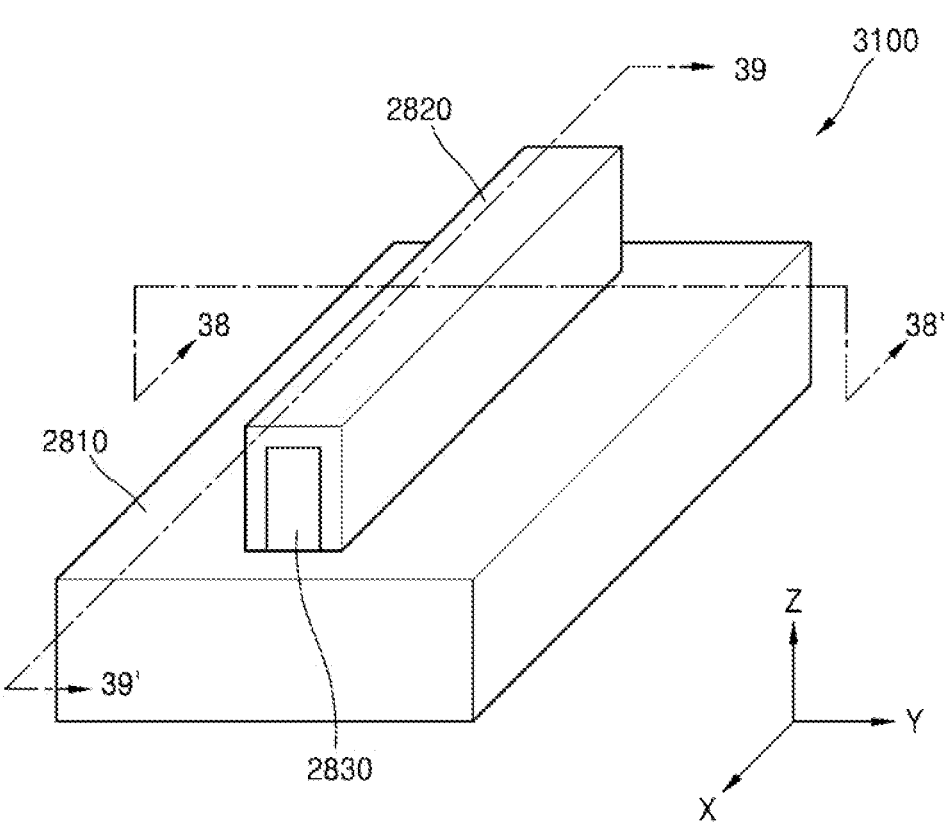
FIG. 37 is a perspective view of a third electronic device (third transistor) including a layer structure or a dielectric layer included in the layer structure, according to some example embodiments.
Figure 38:
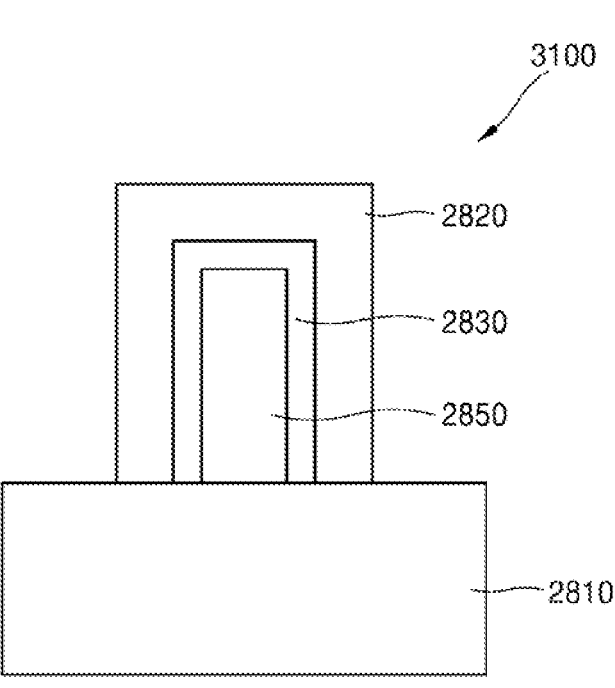
FIG. 38 is a cross-sectional view taken along line 38-38' of FIG. 37.

FIG. 37 shows a third electronic device 3100 including a layer structure according to some example embodiments; FIG. 38 is a cross-sectional view taken along line 38-38' of FIG. 37; and FIG. 39 is a cross-sectional view taken along line 39-39' of FIG. 37.

Referring to FIG. 37, a semiconductor layer 2820 is provided on a substrate 2810 in a direction parallel to the X-axis. The aspect ratio of the semiconductor layer 2820 may be greater than 1, but may be equal to or less than 1.

Referring to FIG. 38, a gate electrode 2850 is formed on the substrate 2810. The aspect ratio of the gate electrode 2850 may be greater than 1, may be 1, or may be less than 1. A gate insulating layer 2830 and a semiconductor layer 2820 are sequentially stacked on upper and both side surfaces of the gate electrode 2850. The semiconductor layer 2820 may be formed to have a thickness greater than that of the gate insulating layer 2830. The gate insulating layer 2830 may correspond to the dielectric layer 130 of FIG. 1. A region of the semiconductor layer 2820 in contact with the gate insulating layer 2830 may be a channel. A layer structure in which the semiconductor layer 2820, the gate insulating layer 2830, and the gate electrode 2850 are sequentially stacked may correspond to the layer structure 100 of FIG. 1.

Figure 39:
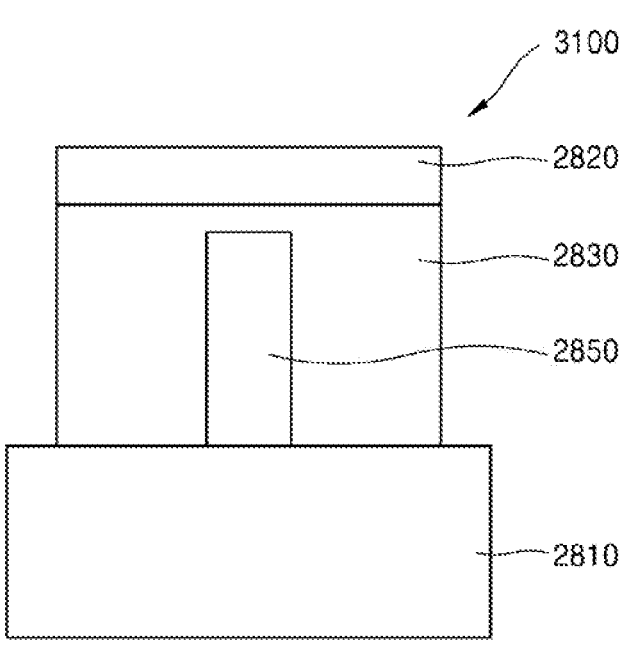
FIG. 39 is a cross-sectional view taken along line 39-39' of FIG. 37.

Referring to FIG. 39, the gate electrode 2850 is disposed on a partial region of an upper surface of the substrate 2810. The gate insulating layer 2830 covering the gate electrode 2850 is formed on the upper surface of the substrate 2810. The gate insulating layer 2830 may be formed to cover the upper surface of the substrate 2810 around the gate electrode 2850, and to cover upper and both side surfaces of the gate electrode 2850. An upper surface of the gate insulating layer 2830 is formed to be flat. A portion of the gate insulating layer 2830 formed on an upper surface of the gate electrode 2850 may be formed to have a constant thickness. A portion of the gate insulating layer 2830 formed on both sides of the gate electrode 2850 may have a thickness greater than that of a portion of the gate insulating layer 2830 formed on the upper surface of the gate electrode 2850. The semiconductor layer 2820 is formed on the gate insulating layer 2830. The semiconductor layer 2820 may be formed to cover an entire upper surface of the gate insulating layer 2830. A portion of the semiconductor layer 2820 corresponding to the upper surface of the gate electrode 2850 may include a channel. In the semiconductor layer 2820, the left part and the right part of the gate electrode 2850 may be regions doped with an N-type or P-type dopant. One of the left and right parts may be a source region, and the other part may be a drain region. The semiconductor layer 2820 including the channel is disposed on the gate electrode 2850. For example, the semiconductor layer 2820 may be provided to face the gate electrode 2850 with the gate insulating layer 2830 therebetween. The semiconductor layer 2820 may be formed to cover the entire upper surface of the gate insulating layer 2830. The third electronic device 3100 may be a bottom-gate FinFET in which the gate electrode 2850 is disposed under a channel.

Figure 40:
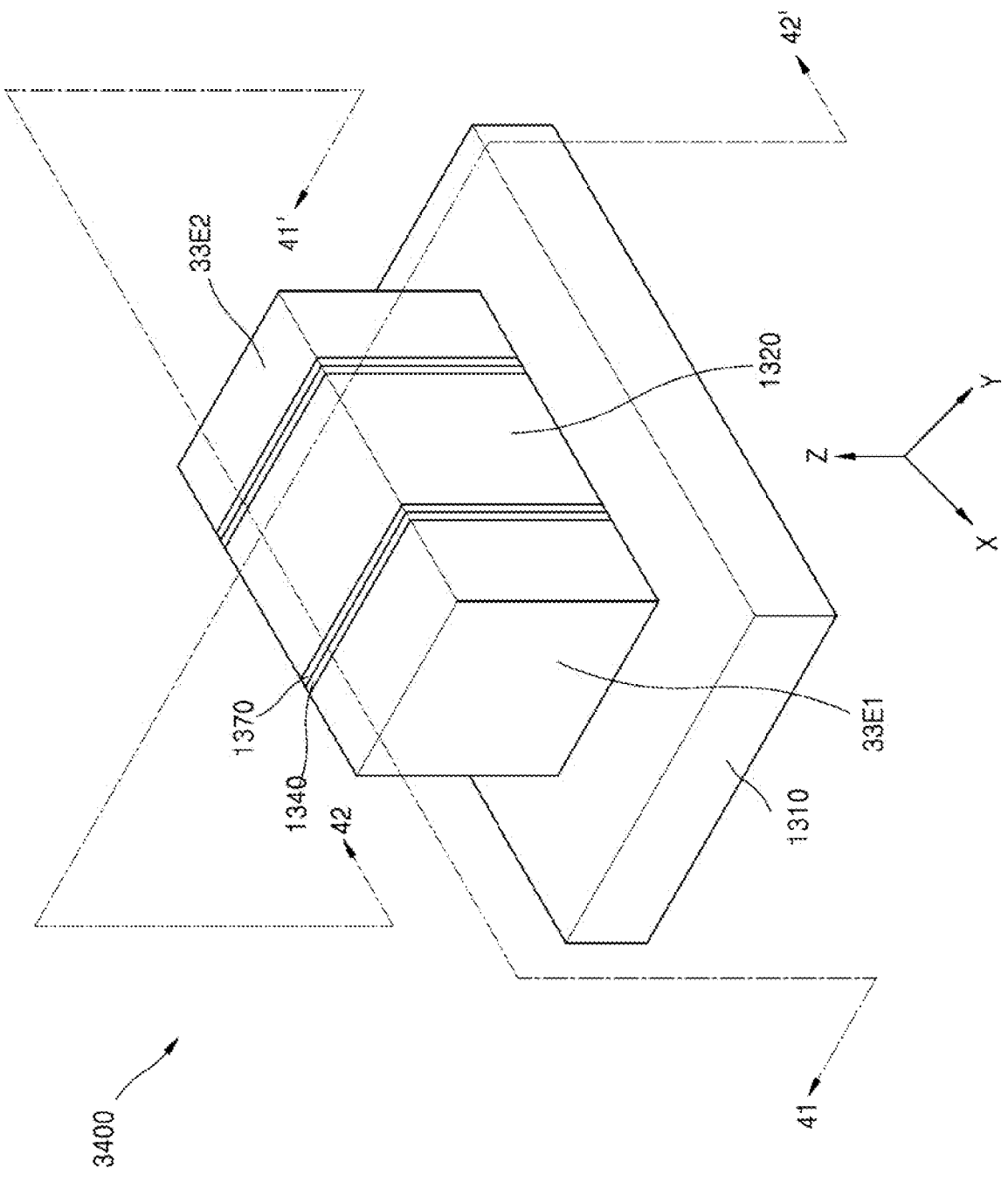
FIG. 40 is a perspective view of a fourth electronic device (fourth transistor) including a layer structure or a dielectric layer included in the layer structure, according to some example embodiments.
Figure 41:
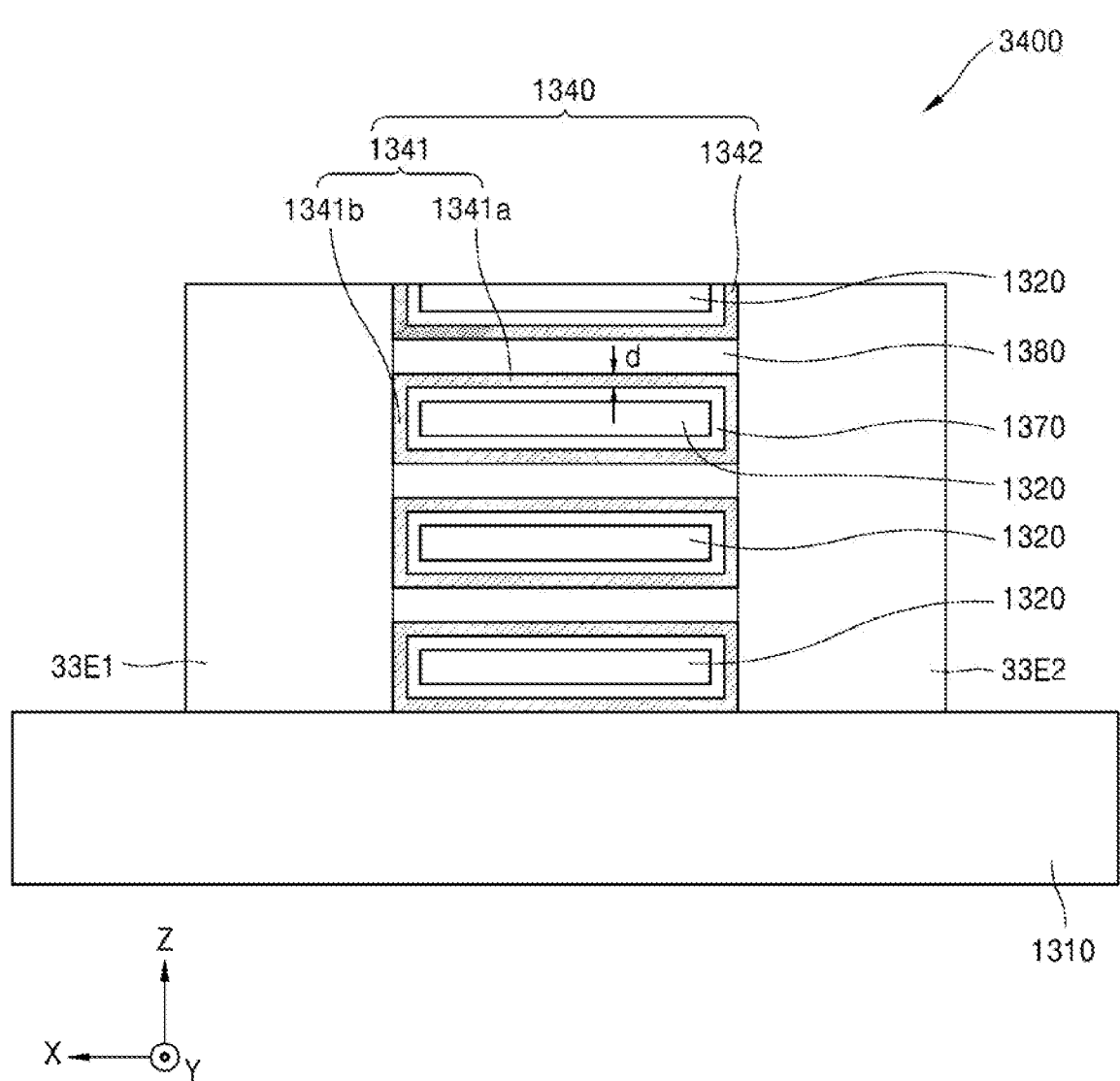
FIG. 41 is a cross-sectional view taken along line 41-41' of FIG. 40.
Figure 42:
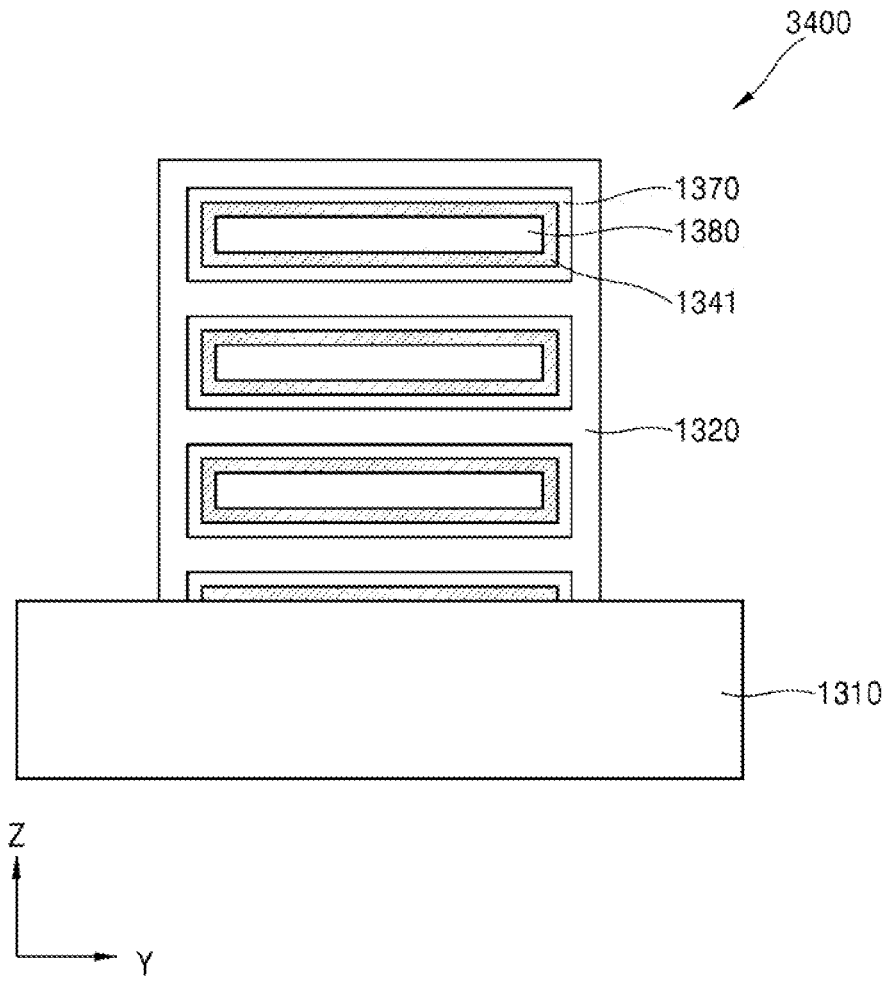
FIG. 42 is a cross-sectional view taken along line 42-42' of FIG. 40.

FIG. 40 is a three-dimensional view of a fourth electronic device 3400 including a layer structure including a dielectric layer according to some example embodiments; FIG. 41 is a cross-sectional view taken along line 41-41' of FIG. 40; and FIG. 42 is a cross-sectional view taken along line 42-42' of FIG. 40.

Referring to FIG. 40, a first electrode 33E1, a gate electrode 1320, and a second electrode 33E2 are sequentially arranged on a substrate 1310 in a direction parallel to an X-axis. The substrate 1310 may be an insulating substrate. In some example embodiments, the substrate 1310 may be a semiconductor substrate having an insulating layer on a surface thereof. In this case, the semiconductor substrate may include, for example, Si, Ge, SiGe, a Group III-V semiconductor material, or the like. The substrate 1310 may be, for example, a silicon substrate having a silicon oxide on a surface thereof, but is not limited thereto. An aspect ratio of each of the first electrode 33E1, the gate electrode 1320, and the second electrode 33E2 may be 1 or more, but may also be less than 1. The first and second electrodes 33E1 and 33E2 may be an N-type or P-type semiconductor layer. In some example embodiments, a material of the first and second electrodes 33E1 and 33E2 may be the same as that of the semiconductor layer used as the substrate 102 of FIG. 1. In some example embodiments, the gate electrode 1320 may be a single layer or a multilayer.

A channel layer 1340 and a gate insulating layer 1370 are sequentially formed between the first electrode 33E1 and the gate electrode 1320 in a direction from the first electrode 33E1 towards the gate electrode 1320. The gate insulating layer 1370 and the channel layer 1340 are sequentially formed between the gate electrode 1320 and the second electrode 33E2 in a direction from the gate electrode 1320 towards the second electrode 33E2. The gate insulating layer 1370 may be or include the dielectric layer 130 of FIG. 1 or 8 to 31. The channel layer 1340 may include a semiconductor layer doped with a P-type or N-type dopant. In some example embodiments, a semiconductor material used as the channel layer 1340 may be the same as the material of the first and second electrodes 33E1 and 33E2. One of the first and second electrodes 33E1 and 33E2 may be a source electrode, and the other may be a drain electrode. Heights of the first and second electrodes 33E1 and 33E2 in a direction perpendicular to the substrate 1310 (the Z-axis direction) may be the same as the height of the gate electrode 1320, but is not limited thereto.

The cross-section shown in FIG. 41 may represent a first cross-section taken from the first electrode 33E1 to the second electrode 33E2 (X direction in the drawing) in a direction perpendicular to the substrate 1310 (the Z direction in the drawing). The cross-section shown in FIG. 42 may represent a second cross-section taken across the gate electrode 1320 (Y-direction in the drawing) between the first electrode 33E1 and the second electrode 33E2 in a direction perpendicular to the substrate 1310 (in the Z direction in the drawing). Here, because the substrate 1310 may not be completely planar, the vertical direction may include a substantially vertical direction as well as a general vertical direction. In this specification, the definitions described above for the first cross-section and the second cross-section are jointly used.

Referring to FIG. 41, the channel layer 1340 may include a first channel 1341 having a hollow and closed cross-sectional structure in the first cross-section. The hollow and closed cross-sectional structure may include, for example, a closed-loop shape including a rectangular, circular, oval, or irregular shape. The first channel 1341 may include, for example, a sheet portion 1341a connected across the first electrode 33E1 and the second electrode 33E2, and a contact portion 1341b that makes contact the first electrode 33E1 and the second electrode 33E2. The sheet portion 1341a may be referred to as a horizontal portion because the sheet portion 1341a is parallel or substantially parallel to the substrate 1310. The contact portion 1341b may be referred to as a vertical portion because the contact portion 1341b is perpendicular or substantially perpendicular to the substrate 1310. The first channel 1341 may include two sheet portions 1341a. The contact portion 1341b may support the two sheet portions 1341a and define a gap between the two sheet portions 1341a.

A plurality of first channels 1341 may be provided, and the first channels 1341 may be disposed to be spaced apart from each other in a direction perpendicular to the substrate 1310 (Z direction). For example, the adjacent first channel 1341 and the first channel 1341 may be arranged separately from each other. The channel layer 1340 may also include a second channel 1342 having an open cross-sectional structure or a sheet-type structure on at least one of an upper end or a lower end in the first cross-section. The channel layer 1340 may be connected between the first electrode 33E1 and the second electrode 33E2 to serve as a passage for flowing a current between the first electrode 33E1 and the second electrode 33E2. The channel layer 1340 may directly contact the first electrode 33E1 and the second electrode 33E2. In some example embodiments, the channel layer 1340 may be connected to the first electrode 33E1 and the second electrode 33E2 through another medium.

Because the first channel 1341 has a hollow and closed cross-sectional structure, the first channel 1341 may be in surface contact with the first electrode 33E1 and the second electrode 33E2, and the surface contact area may be increased by adjusting a thickness of the hollow. For example, a contact area between the first channel 1341 and the first electrode 33E1 and a contact area between the first channel 1341 and the second electrode 33E2 may be adjusted by adjusting a length of a spacer portion 1341b of the first channel 1341. For example, the length of the spacer portion 1341b may be in a range of 100 nm or less. In some example embodiments, the length of the spacer portion 1341b may range equal to or less than 50 nm. In some example embodiments, the length of the spacer portion 1341b may be in a range of 20 nm or less. In some example embodiments, the length of the spacer portion 1341b may range from 10 nm or less.

In some example embodiments, the sheet portion 1341a connected between the first electrode 33E1 and the second electrode 33E2 in the first channel 1341 may have a thickness d of 20 nm or less. In some example embodiments, the sheet portion 1341a of the first channel 1341 may have a thickness d of 10 nm or less. In some example embodiments, the sheet portion 1341a of the first channel 1341 may have a thickness d of 5 nm or less. In some example embodiments, the sheet portion 1341a of the first channel 1341 may have a thickness d of 1 nm or less. In some example embodiments, a distance between the first electrode 33E1 and the second electrode 33E2 may be 100 nm or less. In some example embodiments, the distance between the first electrode 33E1 and the second electrode 33E2 may be in a range of 50 nm or less. In some example embodiments, the distance between the first electrode 33E1 and the second electrode 33E2 may be in a range of 20 nm or less.

The gate insulating layer 1370 may be provided on inner surfaces of the first channel 1341 and the second channel 1342. The gate insulating layer 1370 may be formed to cover the entire inner surfaces of the first and second channels 1341 and 1342. The gate electrode 1320 may be provided inside the gate insulating layer 1370. The gate insulating layer 1370 may directly contact the first and second channels 1341 and 1342.

In the first cross-section, the first channel 1341 and the gate insulating layer 1370 may have a structure that surrounds the entire gate electrode 1320. Accordingly, the gate electrode 1320 may correspond to the entire inner surface of the first channel 1341 with the gate insulating layer 1370 therebetween. A layer structure including the channel layer 1340, the gate insulating layer 1370, and the gate electrode 1320 sequentially stacked in a given direction may correspond to the first layer structure 100 described with reference to FIG. 1. Accordingly, the fourth electronic device 3400 may also have the characteristics of having the first layer structure 100 of FIG. 1.

Although not shown, in at least one example, a buffer layer may further be provided between the channel layer 1340 and the gate insulating layer 1370.

An insulating layer 1380 may further be provided between the adjacent first channels 1341 and between the first and second channels 1341 and 1342. The insulating layer 1380 may be disposed between the first electrode 33E1 and the second electrode 33E2. The insulating layer 1380 may directly contact the first electrode 33E1 and the second electrode 33E2. The insulating layer 1380 insulates between the channels 1341 and 1342 and may function as a support layer for depositing the channel 1340 in a manufacturing process. In some example embodiments, the insulating layer 1380 may have a thickness greater than 0 nm and less than or equal to 100 nm. In some example embodiments, the insulating layer 1380 may have a thickness in a range of greater than 0 and less than or equal to 20 nm. The insulating layer 1380 may include at least one of low-doped silicon, $SiO_2$, $Al_2O_3$, $HfO_2$, $Si_3N_4$, or the like.

In the present example, the first channel 1341 may have a hollow and closed cross-sectional structure and may be connected between the first electrode 33E1 and the second electrode 33E2 with a multi-bridge structure. The first electrode 33E1 and the second electrode 33E2 are spaced apart from each other in a first direction on the substrate 1310, and the first channel 1341 may be disposed between the first electrode 33E1 and the second electrode 33E2 to be spaced apart from each other in a second direction perpendicular to the substrate 1310. The first direction may be the X direction, and the second direction may be the Z direction.

Referring to FIG. 42, the channel layer 1340 may include the first channel 1341 having a hollow and closed cross-sectional structure in the second cross-section. A plurality of first channels 1341 may be provided and disposed to be spaced apart from each other. The gate insulating layer 1370 is provided between the first channel 1341 and the gate electrode 1320. The gate electrode 1320 may be provided to surround the gate insulating layer 1370 around the gate insulating layer 1370. In the second cross-section, the first channels 1341 may be disposed to be spaced apart in a height direction of the fourth electronic device 3400, that is, in the second direction perpendicular to the substrate 1310 (Z direction), the gate insulating layer 1370 may be provided on the outside of the first channel 1341, and the gate insulating layer 1370 and the gate electrode 1320 may be provided to surround the first channel 1341. For example, the gate insulating layer 1370 surrounds the entire first channel 1341. Also, the gate electrode 1320 surrounds the entire sides of the first channel 1341. Therefore, the fourth electronic device 3400 may have a so-called all-around gate structure. The first channel 1341 in the first cross-section and the first channel 1341 in the second cross-section may be alternately provided in a direction perpendicular to the substrate 1310. The insulating layer 1380 may be provided inside the first channel 1341, and the inside of the first channel 1341 may be filled with the insulating layer 1380.

As shown in FIG. 42, the gate electrode 1320 may be spaced apart from the first channel layer 1341 with the gate insulating layer 1370 therebetween. The gate electrode 1320 may provide to have a shape that surrounds the first channel 1341 with a closed path. Because the gate insulating layer 1370 includes the dielectric layer 130 of FIG. 1, a leakage current characteristic of the gate insulating layer 1370 may not be deteriorated even with a small thickness of 10 nm or less. Accordingly, a leakage current through the gate insulating layer 1370 may be suppressed.

In addition, the fourth electronic device 3400 according to some example embodiments is a field effect transistor, and includes a multi-bridge channel or a channel having a multi-bridge shape, thereby suppressing a short channel effect and effectively reducing a channel thickness and a channel length. In addition, the fourth electronic device 3400 has a small size and has high electrical performance, so it is suitable for being applied to an integrated circuit device having a high degree of integration.

Figure 43:
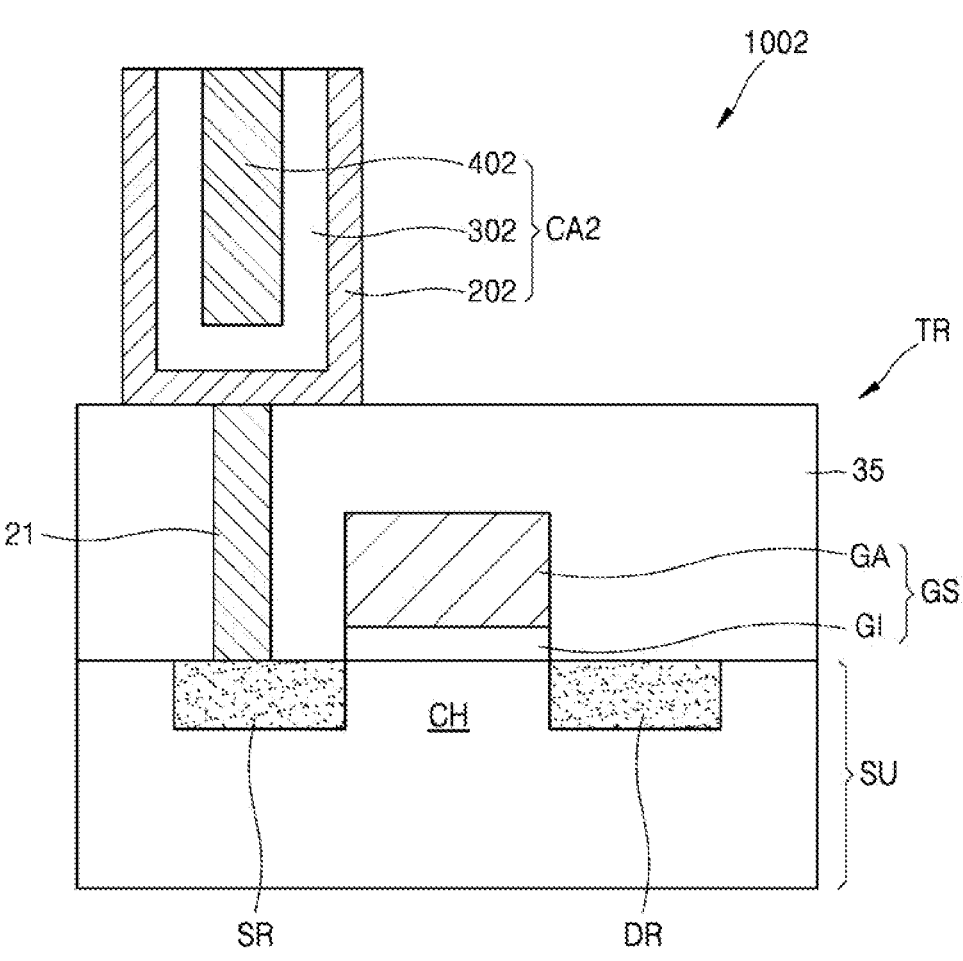
FIG. 43 is a schematic diagram illustrating an electronic device according to some example embodiments.

FIG. 43 shows an electronic device 1002 according to some example embodiments.

Referring to FIG. 43, the electronic device 1002 may include a structure in which a capacitor CA2 and a transistor TR are electrically connected by a contact 21.

The transistor TR includes a semiconductor substrate SU including a source region SR, a drain region DR, and a channel region CH, and a gate stack GS2 disposed to face the channel region CH on the semiconductor substrate SU and includes a gate insulation layer GI and a gate electrode GA.

An interlayer insulating layer 35 may be provided on the semiconductor substrate SU to cover the gate stack GS2. The interlayer insulating layer 35 may include an insulating material. For example, the interlayer insulating layer 35 may include silicon oxide (e.g., $SiO_2$), aluminum oxide (e.g., $Al_2O_3$), a high-k material (e.g., $HfO_2$), and/or the like. The contact 21 passes through the interlayer insulating layer 35 to electrically connect the transistor TR and the capacitor CA2.

The capacitor CA2 includes a lower electrode 202, an upper electrode 402, and a dielectric thin film 302 between the lower electrode 202 and the upper electrode 402. The lower electrode 202 and the upper electrode 402 are proposed in a shape that may maximize a contact area with the dielectric thin film 302.

In some example embodiments, a layer structure including the sequentially stacked the lower electrode 202, the dielectric thin film 302, and the upper electrode 402 may correspond to the layer structure 100 of FIG. 1. The dielectric thin film 302 may be or include the dielectric layer 130 described with reference to FIGS. 1 and 8 to 31. As an example, the dielectric thin film 302 may include one of various implementations of the dielectric layer 130 illustrated in FIGS. 8 to 31.

In some example embodiments, a material of the lower electrode 202 may be selected in consideration of securing conductivity as an electrode and maintaining stable capacitance performance even after a high-temperature process in a manufacturing process of the capacitor CA2.

The upper electrode 402 includes a conductive material, and the material is not particularly limited. Like the lower electrode 202, the upper electrode 402 may have a rutile phase, but may include various conductive materials having a different phase. The upper electrode 402 may include a metal, a metal nitride, a metal oxide, or a combination thereof. For example, the upper electrode 402 may include TiN, MoN, CoN, TaN, W, Ru, $RuO_2$, $SrRuO_3$, Ir, $IrO_2$, Pt, PtO, $SrRuO_3$ (SRO), $(Ba,Sr)RuO_3$ (BSRO), $CaRuO_3$ (CRO), $(La,Sr)CoO_3$ (LSCO), a combination thereof, or the like.

Figure 44:
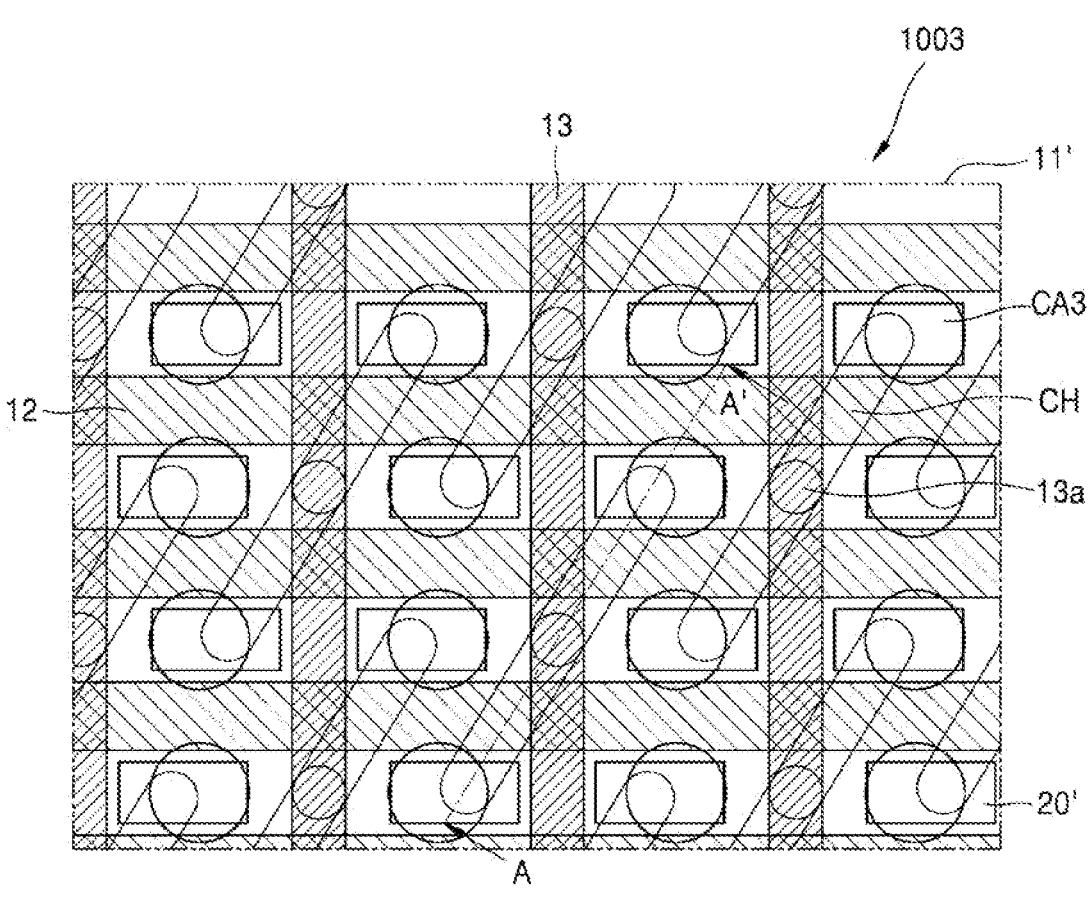
FIG. 44 is a plan view illustrating an electronic device according to some example embodiments.
Figure 44:
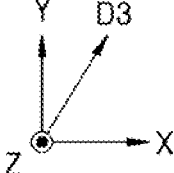
Figure 45:
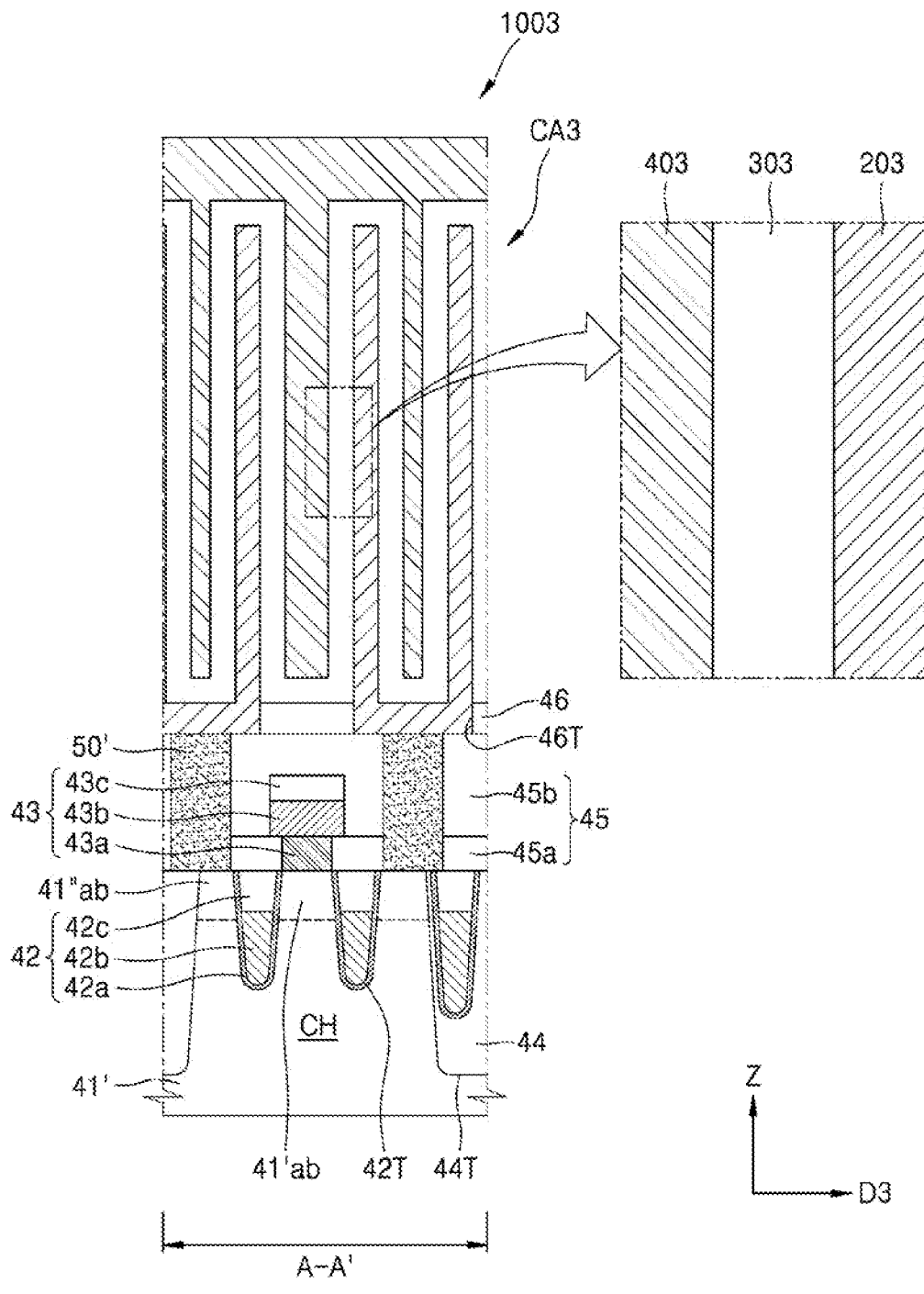
FIG. 45 is a cross-sectional view taken along line A-A' of FIG. 44.

FIG. 44 is a plan view illustrating an electronic device 1003 according to some example embodiments; and FIG. 45 is a cross-sectional view taken along line A-A' of FIG. 44.

Referring to FIG. 44, the electronic device 1003 may include a structure in which a plurality of capacitors and a plurality of field effect transistors are repeatedly arranged. The electronic device 1003 may include a field effect transistor including a gate stack 42 and a semiconductor substrate 41' including a source, a drain, and a channel, a contact structure 50' disposed on the semiconductor substrate 41' so as not to overlap the gate stack 42, and a capacitor CA3 disposed on the contact structure 50', and may further include a bit line structure 43 electrically connecting a plurality of field effect transistors.

FIG. 44 illustrates a form in which both the contact structure 50' and the capacitor CA3 are repeatedly arranged in X and Y directions as an example, but the arrangement of the contact structure 50' and the capacitor CA3 is not limited thereto. For example, the contact structure 50' may be arranged in the X and Y directions, and the capacitor CA3 may be arranged in a hexagonal shape as a honeycomb structure.

Referring to FIG. 45, the semiconductor substrate 41' may have a shallow trench isolation (STI) structure including a device isolation film 44. The device isolation film 44 may be a single layer including one type of insulating layer, or a multilayer including a combination of two or more types of insulating layers. The device isolation film 44 may include a device isolation trench 44T in the semiconductor substrate 41', and the device isolation trench 44T may be filled with an insulating material. The insulating material may include at least one of fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), tonen silazene (TOSZ) or a combination thereof but is not limited thereto.

The semiconductor substrate 41' may further include a channel region CH defined by the device isolation film 44, and a gate line trench 42T parallel to an upper surface of the semiconductor substrate 41' and extending in the X direction. The channel region CH may have a relatively long island shape having a short axis and a long axis. The long axis of the channel region CH may be arranged in a D3 direction parallel to an upper surface of the semiconductor substrate 41' as illustrated in FIG. 44.

The gate line trench 42T may be disposed to cross the channel region CH at a predetermined depth from the upper surface of the semiconductor substrate 41' or may be disposed in the channel region CH. The gate line trench 42T may also be disposed inside the device isolation trench 44T, and the gate line trench 42T inside the device isolation trench 44T may have a bottom surface lower than the gate line trench 42T of the channel region CH. First source/drain 41'ab and second source/drain 41"ab may be disposed on an upper portion of the channel region CH positioned at both sides of the gate line trench 42T.

A gate stack 42 may be disposed inside the gate line trench 42T. Specifically, a gate insulating layer 42a, a gate electrode 42b, and a gate capping layer 42c may be sequentially disposed in the gate line trench 42T.

The gate electrode 42b may include at least one of a metal, a metal nitride, a metal carbide, and polysilicon. For example, the metal may include at least one of aluminum (Al), tungsten (W), molybdenum (Mo), titanium (Ti), and tantalum (Ta), and the metal nitride film may include at least one of a titanium nitride film (TiN film) and a tantalum nitride film (TaN film). The metal carbide may include at least one of aluminum and silicon doped (or included) metal carbide, and specific examples thereof may include TiAlC, TaAlC, TiSiC, or TaSiC.

In some example embodiments, the gate electrode 42b may have a structure in which a plurality of materials are stacked, for example, a stacked structure of a metal nitride layer/metal layer, such as TiN/Al, or a stacked structure of a metal nitride layer/metal carbide layer/metal layer, such as TiN/TiAlC/W. However, the materials mentioned above are merely examples.

In some example embodiments, the gate insulating layer 42a may include a paraelectric material or a high-k dielectric material, and may have a dielectric constant in a range from about 20 to 70.

In some example embodiments, the gate insulating layer 42a may include silicon oxide, silicon nitride, aluminum oxide, hafnium oxide, zirconium oxide, or the like, or may include a 2D insulator, such as hexagonal boron nitride (h-BN). For example, the gate insulating layer 42a may include silicon oxide ($SiO_2$), silicon nitride (SiNx), etc., or hafnium oxide ($HfO_2$), hafnium silicon oxide ($HfSiO_4$), lanthanum oxide ($La_2O_3$), lanthanum Aluminum oxide ($LaAlO_3$), zirconium oxide ($ZrO_2$), hafnium zirconium oxide ($HfZrO_2$), zirconium silicon oxide ($ZrSiO_4$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), red scandium tantalum oxide ($PbSc_{0.5}Ta_{0.5}O_3$), red zinc niobate ($PbZnNbO_3$), and the like. In addition, the gate insulating layer 42a may include metal nitride oxide, such as aluminum oxynitride (AlON), zirconium oxynitride (ZrON), hafnium oxynitride (HfON), lanthanum oxynitride (LaON), yttrium oxynitride (YON), or the like, a silicate, such as ZrSiON, HfSiON, YSiON, LaSiON, or the like, and an aluminate such as ZrAlON, HfAlON, or the like.

In some example embodiments, the gate insulating layer 42a may include one of the implementations of the dielectric layer 130 of FIG. 1 and the dielectric layer 130 illustrated in FIGS. 8 to 31.

In some example embodiments, the gate capping layer 42c may include at least one of silicon oxide, silicon oxynitride, and silicon nitride. The gate capping layer 42c may be disposed on the gate electrode 42b to fill a remaining portion of the gate line trench 42T.

Subsequently, a bit line structure 13 may be disposed on the first source/drain 41'ab. The bit line structure 43 may be disposed to be parallel to the upper surface of the semiconductor substrate 41' and extend in the Y direction. The bit line structure 43 may be electrically connected to the first source/drain 41'ab, and may include a bit line contact 43a, a bit line 43b, and a bit line capping layer 43c sequentially formed on the substrate 41'. For example, the bit line contact 43a may include polysilicon, the bit line 43b may include a metal material, and the bit line capping layer 43c may include an insulating material, such as silicon nitride or silicon oxynitride.

FIG. 45 illustrates a case in which the bit line contact 43a has a bottom surface at the same level as the upper surface of the semiconductor substrate 41', but the examples are not limited thereto. For example, in some example embodiments, a recess having a predetermined or otherwise determined depth from the upper surface of the semiconductor substrate 41' may further be provided, and the bit line contact 43a may extend to an inside of the recess, and thus, a bottom surface of the bit line contact 43a may be formed to be lower than the upper surface of the semiconductor substrate 41'.

The bit line structure 43 may further include a bit line intermediate layer (not shown) between the bit line contact 43a and the bit line 43b. The bit line intermediate layer may include a metal silicide, such as tungsten silicide, or a metal nitride, such as tungsten nitride. In addition, a bit line spacer (not shown) may further be formed on a sidewall of the bit line structure 43. The bit line spacer may have a single-layer structure or a multi-layer structure, and may include an insulating material, such as silicon oxide, silicon oxynitride, or silicon nitride. In addition, the bit line spacer may further include an air space (not shown).

A contact structure 50' may be disposed on the second source/drain 41"ab. The contact structure 50' and the bit line structure 43 respectively may be disposed on different sources/drains on the substrate. The contact structure 50' may have a structure in which a lower contact pattern (not shown), a metal silicide layer (not shown), and an upper contact pattern (not shown) are sequentially stacked on the second source/drain 41"ab. The contact structure 50' may further include a barrier layer (not shown) surrounding a side surface and a bottom surface of the upper contact pattern. For example, the lower contact pattern may include polysilicon, the upper contact pattern may include a metal material, and the barrier layer may include a conductive metal nitride.

The capacitor CA3 may be electrically connected to the contact structure 50' and disposed on the semiconductor substrate 41'. For example, the capacitor CA3 includes a lower electrode 203 electrically connected to the contact structure 50', an upper electrode 403 separated from the lower electrode 203, and a dielectric thin film 303 disposed between the lower electrode 203 and an upper electrode 403. The lower electrode 203 may have a cylindrical shape or a cup shape with a closed bottom side. The upper electrode 403 may have a comb shape having comb teeth extending into an inner space formed by the lower electrode 203 and a region between the adjacent lower electrodes 203. The dielectric thin film 303 may be disposed parallel to surfaces of the lower electrode 203 and the upper electrode 403 between the lower electrode 203 and the upper electrode 403.

In some example embodiments, materials of the lower electrode 203, the dielectric thin film 303, and the upper electrode 403 constituting the capacitor CA3 may be substantially the same as those of the capacitor CA2 described above with reference to FIG. 43, and thus, the repeat descriptions thereof are omitted.

An interlayer insulating layer 45 may further be disposed between the capacitor CA3 and the semiconductor substrate 41'. The interlayer insulating layer 45 may be disposed in a space between the capacitor CA3 and the semiconductor substrate 41' on which other structures are not disposed. Specifically, the interlayer insulating layer 45 may be disposed to cover wiring and/or electrode structures, such as the bit line structure 43, the contact structure 50', and the gate stack 42 on the substrate 41'. For example, the interlayer insulating layer 45 may surround walls of the contact structure 50'. The interlayer insulating film 45 may include a first interlayer insulating film 45a surrounding the bit line contact 43a and a second interlayer insulating film 45b covering sides and/or upper surfaces of the bit line 43b and the bit line capping layer 43c. In some example embodiments, materials of the insulating layer 45 may be substantially the same as those of the insulating layer 35 described above with reference to FIG. 43, and thus, the repeat descriptions thereof are omitted.

The lower electrode 203 of the capacitor CA3 may be disposed on the interlayer insulating layer 45, specifically, on the second interlayer insulating film 45b. Also, when a plurality of capacitors CA3 are disposed, bottom surfaces of the plurality of lower electrodes 203 may be separated by an etch stop layer 46. In other words, the etch stop layer 46 may include an opening 46T, and the bottom surface of the lower electrode 203 of the capacitor CA3 may be disposed in the opening 46T. As shown in FIG. 45, the lower electrode 203 may have a cylindrical shape or a cup shape with a closed bottom side. The capacitor CA3 may further include a supporter (not shown) for preventing the lower electrode 203 from being tilted or collapsed, and the supporter may be disposed on a sidewall of the lower electrode 203. The electronic devices according to the example embodiments described above may constitute a transistor constituting a digital circuit or an analog circuit. In some example embodiments, the electronic device may be used as a high voltage transistor or a low voltage transistor. For example, the electronic device according to some example embodiments may constitute a high voltage transistor constituting a peripheral circuit of one of a flash memory device and an electrically erasable and programmable read only memory (EEPROM) device that are a nonvolatile memory device operating at a high voltage. Alternatively, the electronic device according to some example embodiments may constitute a transistor included in an IC device for a liquid crystal display (LCD) requiring an operating voltage of 10 V or more, for example, an operating voltage of 20 to 30 V, or an IC chip etc. used in a plasma display panel (PDP) requiring an operating voltage of 100 V.

Figure 46:
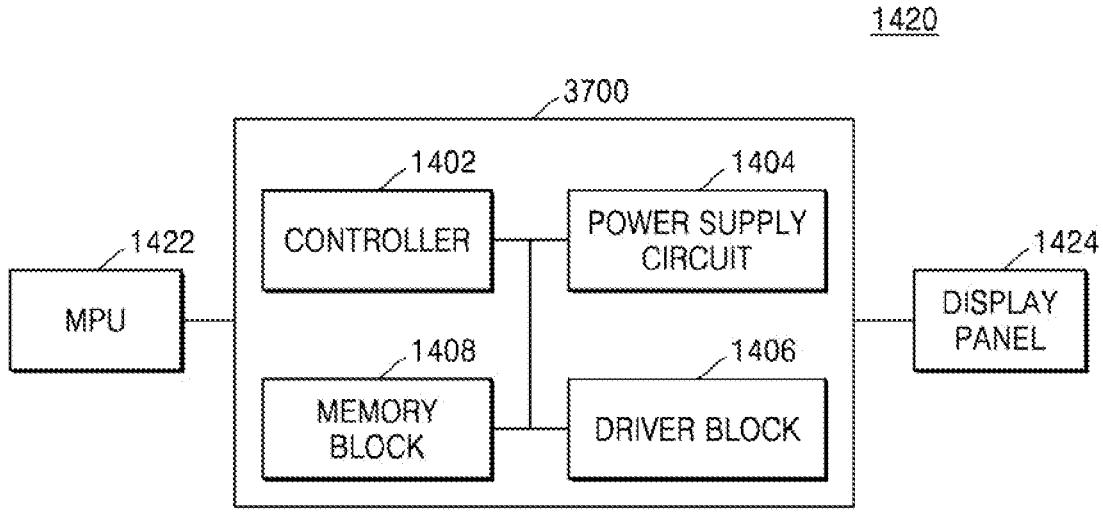
FIG. 46 is a schematic block diagram of a display driver IC (DDI) including an electronic device including a layer structure including a dielectric layer and a display device including a DDI according to some example embodiments.

FIG. 46 is a schematic block diagram of a display driver IC (DDI) 3700 and a display device 1420 including the DDI 3700 according to some example embodiments.

Referring to FIG. 46, the DDI 3700 may include a controller 1402, a power supply circuit 1404, a driver block 1406, and a memory block 1408. The controller 1402 may be configured to receive and decode a command applied from a main processing unit (MPU) 1422, and control each block of the DDI 3700 to implement an operation according to the command. The power supply circuit 1404 may be configured to generate a driving voltage in response to the control of the controller 1402. The driver block 1406 may be configured to drive the display panel 1424 using a driving voltage generated by the power supply circuit 1404 in response to the control of the controller 1402. The display panel 1424 may include a liquid crystal display panel or a plasma display panel. The memory block 1408 may include a memory, such as RAM or ROM that is a block configured to temporarily store commands input to the controller 1402 or control signals output from the controller 1402 or to store necessary data. The DDI 3700, controller 1402, memory block 1408, power supply circuit 1404, or the driver block 1406 may include an electronic device according to at least one of the example embodiments described above.

Figure 47:
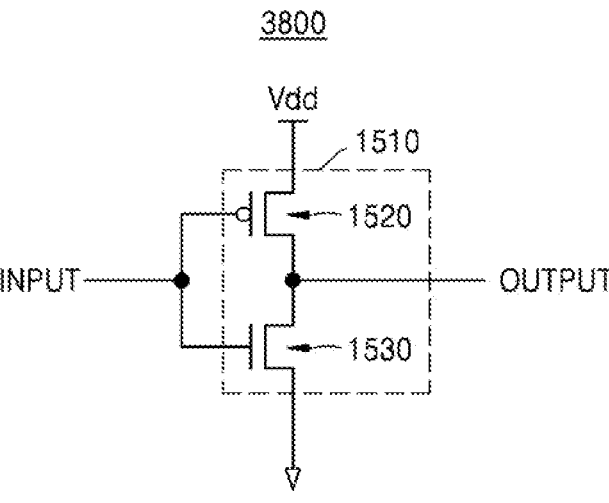
FIG. 47 is a circuit diagram of a CMOS inverter including an electronic device that includes a layer structure including a dielectric layer, according to some example embodiments.

FIG. 47 is a circuit diagram of a CMOS inverter 3800 according to some example embodiments.

The CMOS inverter 3800 includes a CMOS transistor 1510. The CMOS transistor 1510 includes a PMOS transistor 1520 and an NMOS transistor 1530 connected between a power terminal Vdd and a ground terminal. The CMOS transistor 1510 may include the electronic device according to at least one of the example embodiments described above. For example, at least one of the PMOS transistor or the NMOS transistor 1510 may include the dielectric layer 130 of FIG. 1 in a gate stack.

Figure 48:
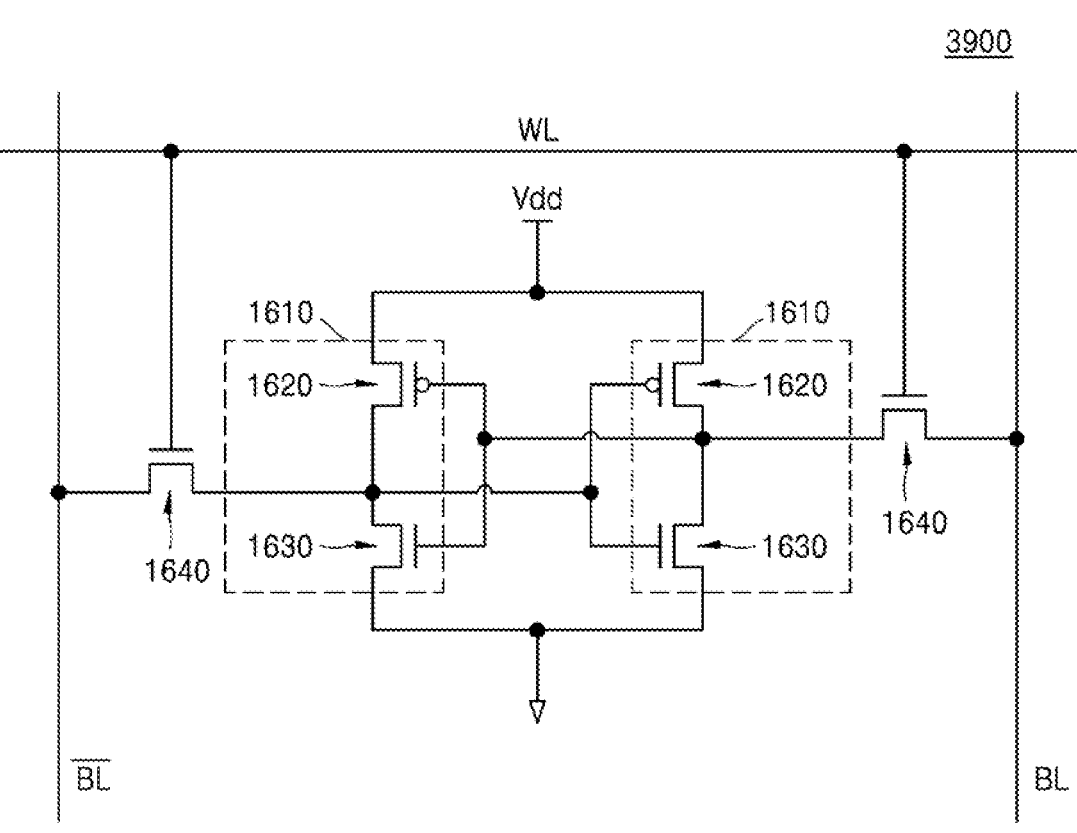
FIG. 48 is a circuit diagram of a CMOS SRAM device including an electronic device that includes a layer structure including a dielectric layer, according to some example embodiments.

FIG. 48 is a circuit diagram of a CMOS SRAM device 3900 according to some example embodiments.

The CMOS SRAM device 3900 includes a pair of driving transistors 1610. The pair of driving transistors 1610 each includes a PMOS transistor 1620 and an NMOS transistor 1630 connected between a power terminal Vdd and a ground terminal. The CMOS SRAM device 3900 may further include a pair of transfer transistors 1640. A source of the transfer transistor 1640 is cross-connected to a common node of the PMOS transistor 1620 and the NMOS transistor 1630 constituting the driving transistor 1610. The power terminal Vdd is connected to a source of the PMOS transistor 1620, and the ground terminal is connected to a source of the NMOS transistor 1630. A word line WL may be connected to a gate of the pair of transfer transistors 1640, and a bit line BL and an inverted bit line may be connected to a drain of each of the pair of transfer transistors 1640, respectively.

At least one of the driving transistor 1610 and/or transfer transistor 1640 of the CMOS SRAM device 3900 may include the electronic device according to the example embodiments described above.

Figure 49:
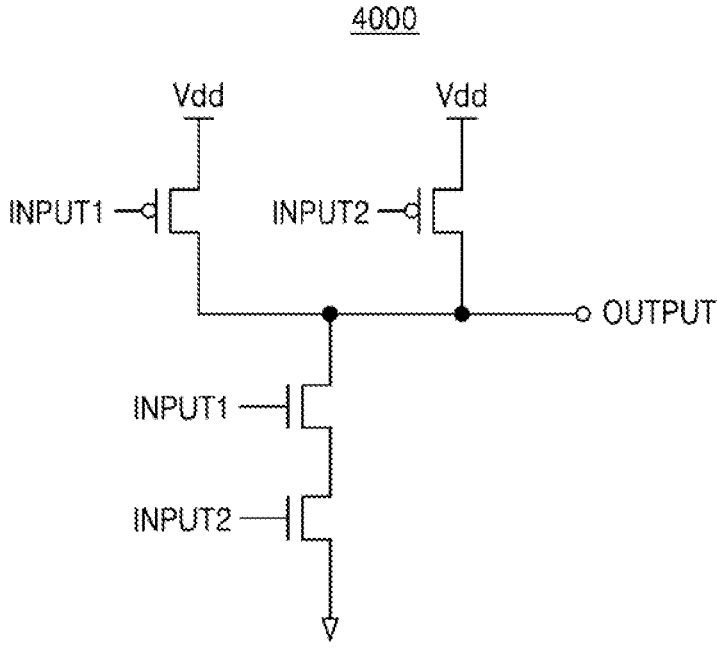
FIG. 49 is a circuit diagram of a CMOS NAND including an electronic device that includes a layer structure including a dielectric layer, according to some example embodiments.

FIG. 49 is a circuit diagram of a CMOS NAND circuit 4000 according to some example embodiments.

The CMOS NAND circuit 4000 includes a pair of CMOS transistors to which different input signals are transmitted. The CMOS NAND circuit 4000 may include the electronic device according to the example embodiments described above.

Figure 50:
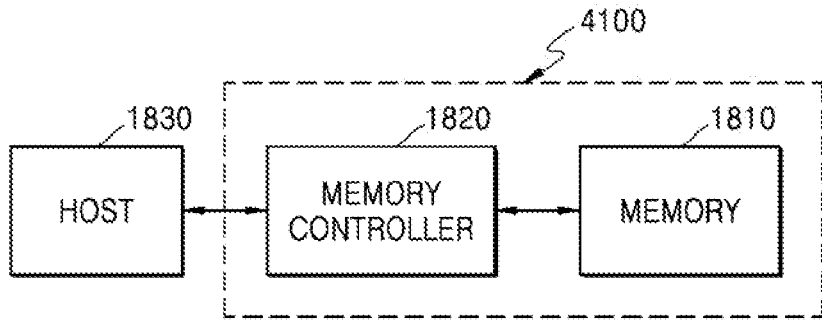
FIG. 50 is a block diagram of an electronic system including an electronic device that includes a layer structure including a dielectric layer, according to some example embodiments.

FIG. 50 is a block diagram illustrating an electronic system 4100 according to some example embodiments.

The electronic system 4100 includes a memory 1810 and a memory controller 1820. The memory controller 1820 may control the memory 1810 to read data from and/or write data to the memory 1810 in response to a request of a host 1830. At least one of the memory 1810 and/or the memory controller 1820 may include the electronic device according to the example embodiments described above.

Figure 51:
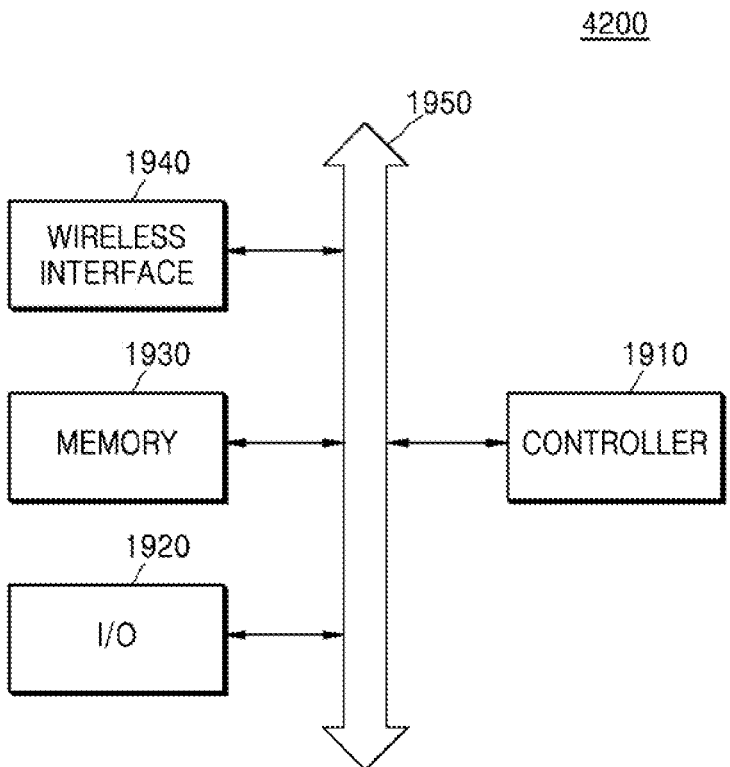
FIG. 51 is a block diagram of an electronic system including an electronic device that includes a layer structure including a dielectric layer, according to some example embodiments.

FIG. 51 is a block diagram of an electronic system 4200 according to some example embodiments.

The electronic system 4200 may constitute a wireless communication device or a device capable of transmitting and/or receiving information under a wireless environment. The electronic system 4200 includes a controller 1910, an input/output device (I/O) 1920, a memory 1930, and a wireless interface 1940, which are interconnected to each other through a bus 1950.

The controller 1910 may include at least one of a microprocessor, a digital signal processor, and/or a processing device similar thereto. The input/output device 1920 may include at least one of a keypad, a keyboard, a speaker, microphone, a display, etc. The memory 1930 may be used to store instructions executed by controller 1910. For example, the memory 1930 may be used to store user data. The electronic system 4200 may use the wireless interface 1940 to transmit/receive data over a wireless communication network. The wireless interface 1940 may include an antenna and/or a wireless transceiver. In some example embodiments, the electronic system 4200 may be used in a communication interface protocol of various communication systems, for example, code division multiple access (CDMA), global system for mobile communications (GSM), north American digital cellular (NADC), extended-time division multiple access (E-TDMA), and/or wide band code division multiple access (WCDMA). The electronic system 4200 may include the electronic device according to the example embodiments described above, for example, as a field effect transistor and/or capacitor.

An electronic device including a layer structure according to some example embodiments may have a good electrical performance with a microminiature structure, and thus may be applied to an integrated circuit device, and may realize miniaturization, low power, and high performance.

Next, a method of manufacturing a layer structure including a dielectric layer according to some example embodiments will be described with reference to FIGS. 52 to 58. In this process, like reference numerals as the aforementioned reference numerals indicate like members, and aspects of the descriptions thereof may be omitted for brevity.

Figure 52:
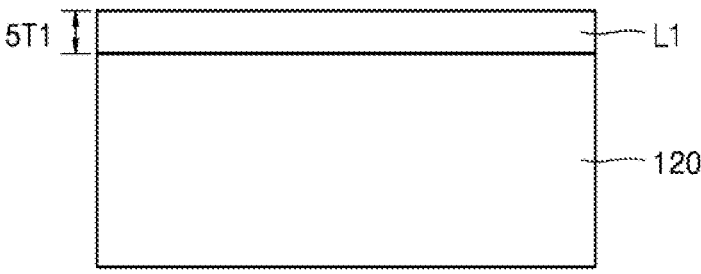
FIGS. 52 to 60 are cross-sectional views illustrating a method of manufacturing a layer structure including a dielectric layer, according to some example embodiments.

Referring to FIG. 52, a first layer L1 is formed on the one surface of the first material layer 120. The first layer L1 may be in direct contact with the one surface of the first material layer 120 and may be formed to cover all or a part of the one surface of the first material layer 120. The first layer L1 may be formed to have a first thickness 5T1. The first thickness 5T1 may vary according to the role or function of the first layer L1. The first layer L1 may be formed by using an ALD method, but is not limited thereto. A material and configuration of the first layer L1 may correspond to the material and configuration of the first layer 13*a* of FIG. 1.

The formed first layer L1 may have one surface (e.g., an upper surface) parallel or substantially parallel to the one surface of the substrate 120

Figure 53:
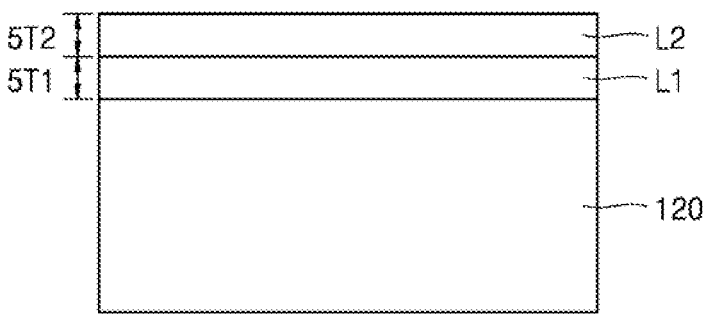

After the first layer L1 is formed, as shown in FIG. 53, a second layer L2 is formed on the one surface of the first layer L1. The second layer L2 may be formed directly on the one surface of the first layer L1, and may be formed to cover all or a part of the one surface of the first layer L1. The formed second layer L2 may have a surface (e.g., an upper surface) parallel to or substantially parallel to the one surface of the first material layer 120 or the one surface of the first layer L1. The second layer L2 may be formed to have a second thickness 5T2. The first and second thicknesses 5T1 and 5T2 may be the same as or different from each other. The second layer L2 may be formed by using an ALD method, but is not limited thereto. In at least some embodiments, the second layer L2 may be physically and functionally different from the first layer L1. In the process of forming the first and second layers L1 and L2 by using an ALD method, the number of formation cycles of the first and second layers L1 and L2 may also be different from each other. A material and configuration of the second layer L2 may correspond to one of the second to sixth layers 13*b* to 13*f* of FIG. 1.

Figure 54:
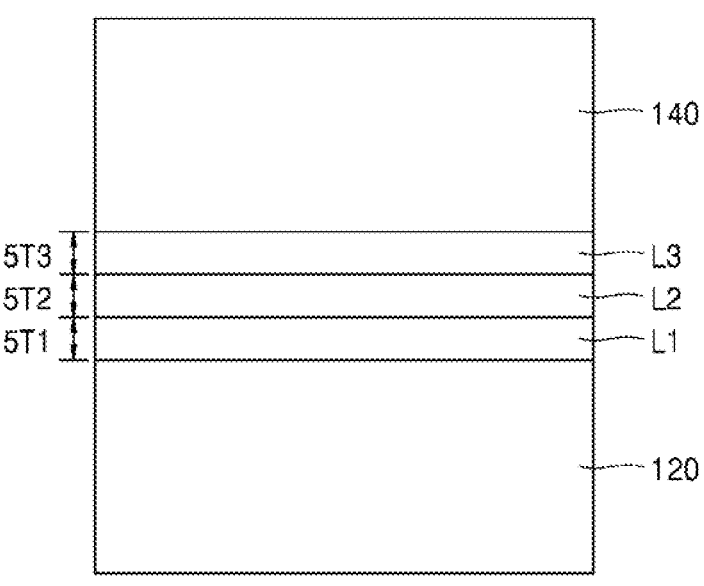

After the second layer L2 is formed, as shown in FIG. 54, a third layer L3 is formed on the one surface of the second layer L2. The third layer L3 may be formed directly on the one surface of the second layer L2, and may be formed to cover all or a part of the one surface. The formed third layer L3 may have a surface (e.g., an upper surface) parallel or substantially parallel to the one surface of the first material layer 120 or the one surface of the second layer L2. The third layer L3 may be formed by using an ALD method, and may be formed to have a third thickness 5T3, but is not limited thereto. The third thickness 5T3 may be the same as or different from the second thickness 5T2. In at least some embodiments, third layer L3 may be materially and functionally different from the first and second layers L1 and L2. For example, one of the first to third layers L1, L2, and L3 may be or include a TiO$_2$ layer, another layer may be or include a phase stabilization layer, and the remainder layer may be or include a leakage current suppressing layer. Alternatively, one of the first to third layers L1, L2, and L3 may be or include a TiO$_2$ layer, and the layer may be or include a phase stabilization layer, and the other layer may be or include a high-bandgap layer. In some example embodiments, the material and configuration of the third layer L3 may correspond to the seventh layer 13g of FIG. 1 or may correspond to one of the second to sixth layers 13b to 13f of FIG. 1.

A second material layer 140 may be formed on the third layer L3.

Figure 55:
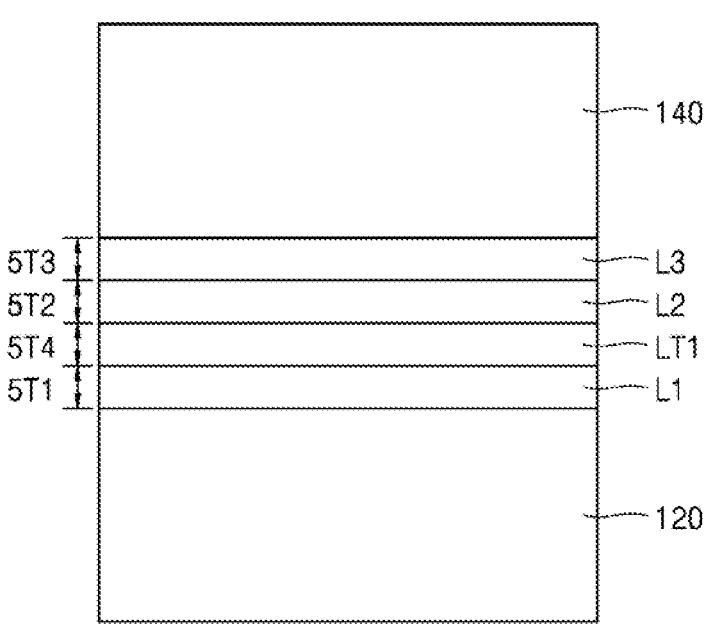

In one example, as shown in FIG. 55, a first TiO$_2$ layer LT1 may further be formed between the first and second layers L1 and L2. In this case, the first TiO$_2$ layer LT1 may be formed directly on the one surface of the first layer L1 or may be formed to cover all or a part of the one surface. The formed first TiO$_2$ layer LT1 may have a surface (e.g., an upper surface) parallel or substantially parallel to the one surface of the first material layer 120 or the one surface of the first layer L1. After the first TiO$_2$ layer LT1 is completely formed, the second layer L2 may be directly formed on the one surface of the first TiO$_2$ layer LT1, and may be formed to cover all or a part of the one surface of the first TiO$_2$ layer LT1. In other words, the first TiO$_2$ layer LT1 and the second layer L2 may be formed such that the first TiO$_2$ layer LT1 is in direct contact with the other surface (e.g., the bottom surface) opposite to the one surface of the second layer L2, or the first TiO$_2$ layer LT1 may be formed to be in contact with all or part of the other surface of the second layer L2. The formed second layer L2 may have a surface (e.g., an upper surface) parallel or substantially parallel to the one surface of the first material layer 120 or the one surface of the first TiO$_2$ layer LT1.

The first TiO$_2$ layer LT1 may be formed by using an ALD method, but is not limited thereto. The first TiO$_2$ layer LT1 may be formed to have a fourth thickness 5T4 which may be greater than a thickness of a layer used as a phase stabilization layer and a layer used as a leakage current suppressing layer (or a high-bandgap layer), among the first to third layers L1 to L3. In the ALD process for forming the first TiO$_2$ layer LT1, the number of formation cycles may be greater than the number of formation cycles of the layer used as the phase stabilization layer and the number of formation cycles of the layer used as the leakage current suppressing layer (or a high-bandgap layer).

Figure 56:
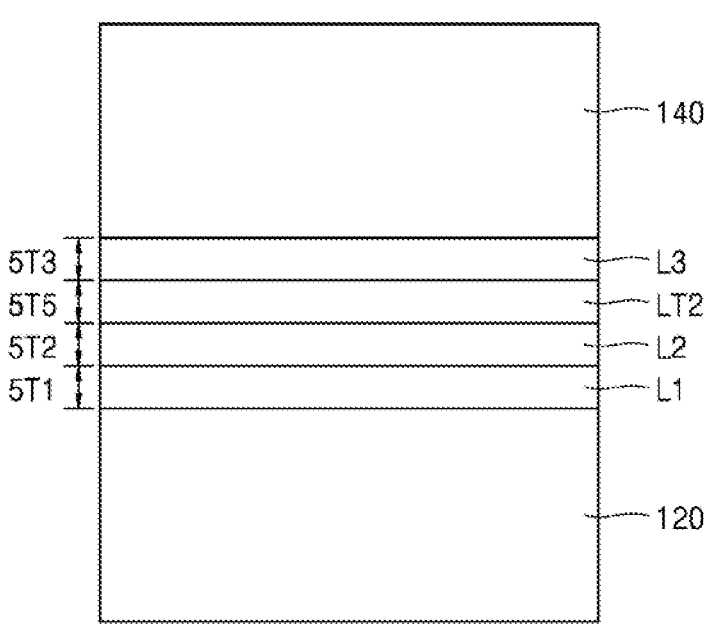

In one example, as shown in FIG. 56, a second TiO$_2$ layer LT2 may further be formed between the second and third layers L2 and L3. In this case, the second TiO$_2$ layer LT2 may be formed directly on the one surface of the second layer L2 and may be formed to cover all or a part of the one surface of the second layer L2. The formed second TiO$_2$ layer LT2 may have a surface (e.g., an upper surface) parallel or substantially parallel to the one surface of the first material layer 120 or the one surface of the second layer L2. After the second TiO$_2$ layer LT2 is completely formed, the third layer L3 may be directly formed on the one surface of the second TiO$_2$ layer LT2, and may be formed to cover all or a part of the one surface of the second TiO$_2$ layer LT2. In other words, the second TiO$_2$ layer LT2 and the third layer L3 may be formed such that the second TiO$_2$ layer LT2 is in direct contact with the other surface (e.g., a bottom surface) opposite to (facing) the one surface of the third layer L3, or the second TiO$_2$ layer LT2 may be formed to contact all or a part of the other surface of the third layer L3. The formed third layer L3 may have a surface (e.g., an upper surface) parallel or substantially parallel to the one surface of the first material layer 120 or the one surface of the second TiO$_2$ layer LT2.

The second TiO$_2$ layer LT2 may be formed by using an ALD method, but is not limited thereto. The second TiO$_2$ layer LT2 may be formed to have a fifth thickness 5T5 which may be formed to be greater than a thickness of a layer used as a phase stabilization layer and a leakage current suppressing layer (or a high-bandgap layer) among the first to third layers L1 to L3. In the ALD process for forming the second TiO$_2$ layer LT2, the number of formation cycles may be greater than the number of formation cycles of the layer used as the phase stabilization layer and the number of formation cycles of the layer used as the leakage current suppressing layer (or high-bandgap layer).

In some example embodiments, the first TiO$_2$ layer LT1 of FIG. 55 may be applied to the layer structure of FIG. 56. That is, in the layer structure shown in FIG. 53, a TiO$_2$ layer may also be formed between the first and second layers L1 and L2.

Figure 57:
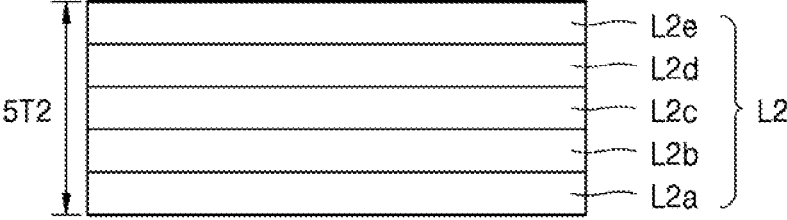

In some example embodiments, the second layer L2 may be formed as a single layer, but may be formed as a plurality of layers as shown in FIG. 57.

Referring to FIG. 57, the second layer L2 may be formed by sequentially stacking first to fifth sub-material layers L2a, L2b, L2c, L2d, and L2e, but is not limited thereto. For example, the second layer L2 may be formed by sequentially stacking a plurality (e.g., five or more or five or less) of sub-material layers. Each of the first to fifth sub-material layers L2a to L2e may be one of a phase stabilization layer, a first leakage current suppressing layer, and a TiO$_2$ layer, and two adjacent sub-material layers may be different from each other. For example, the first and second sub-material layers L2a and L2b may be formed by sequentially stacking a phase stabilization layer and a first leakage current suppressing layer or stacking them in an opposite order. For example, the first and second sub-material layers L2a and L2b may be formed by sequentially stacking the phase stabilization layer and the TiO$_2$ layer or stacking them in an opposite order For example, the first and second sub-material layers L2a and L2b may be formed by sequentially stacking the first leakage current suppressing layer and the TiO$_2$ layer or stacking them in an opposite order.

In this case, the TiO$_2$ layer may be formed to a greater thickness than the phase stabilization layer and the first leakage current suppressing layer, and to this end, the TiO$_2$ layer may be formed with more ALD cycles than the phase stabilization layer and the first leakage current suppressing layer. The phase stabilization layer and the first leakage current suppressing layer may be formed in fewer than 10 ALD cycles, and in some example embodiments, may be formed in one ALD cycle.

Figure 58:
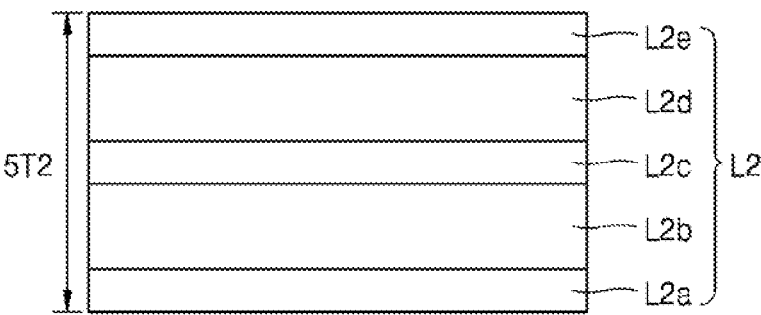

FIG. 58 shows an example of the second layer L2 of FIG. 57. In FIG. 58, the first and third sub-material layers L2*a* and L2*c* are phase stabilization layers, the fifth sub-material layer L2*e* is a first leakage current suppressing layer or vice versa, and the second and fourth sub-material layers L2*b* and L2*d* may be $TiO_2$ layers formed to have a thickness greater than those of the first, third, and fifth sub-material layers L2*a*, L2*c*, and L2*e*.

Figure 59:
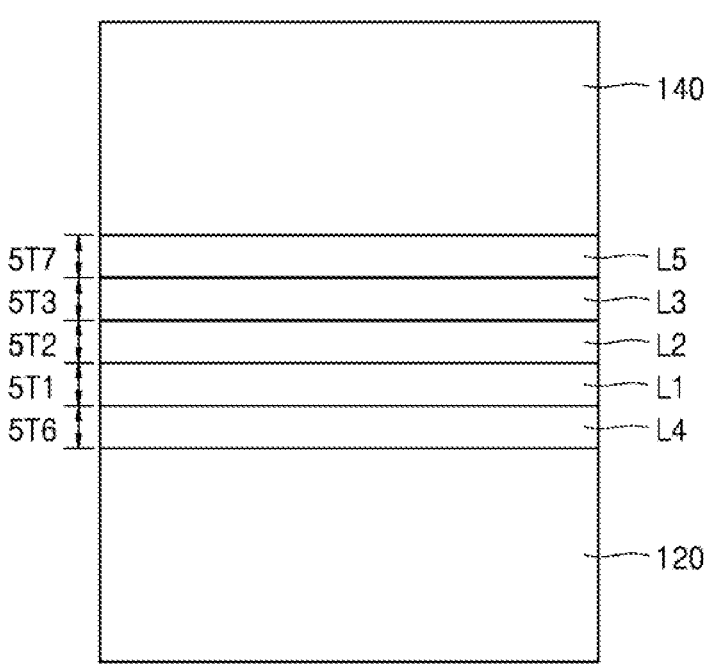

In some example embodiments, as shown in FIG. 59, a fourth layer L4 may be formed with a sixth thickness 5T6 between the first material layer 120 and the first layer L1. In this case, the fourth layer L4 may be directly formed on the one surface of the first material layer 120. One surface (e.g., an upper surface) of the fourth layer L4 may be parallel or substantially parallel to the one surface of the first material layer 120. After the fourth layer L4 is formed, the first layer L1 may be formed directly on the one surface of the fourth layer L4 or may be formed to cover all or a part of the one surface of the fourth layer L4. The formed first layer L1 may have a surface parallel or substantially parallel to the one surface of the first material layer 120 or the one surface of the fourth layer L4. In another point of view, the fourth layer L4 may be formed to be in direct contact with the other surface (e.g., a bottom surface) opposite to the one surface of the first layer L1, and covers all or a part of the other surface of the first layer L1.

The fourth layer L4 may be formed by using an ALD method, but is not limited thereto. The fourth layer L4 may be formed as a high-bandgap layer described with reference to FIG. 1, and the number of ALD cycles may be less than the number of ALD cycles for forming the $TiO_2$ layer. In FIG. 59, the first layer L1 may correspond to one of the second to sixth layers 13*b* to 13*f* of FIG. 1. For example, the first layer L1 may be any one of a $TiO_2$ layer, a phase stabilization layer, and a leakage current suppressing layer.

In some example embodiments, as shown in FIG. 59, a fifth layer L5 may be formed with a seventh thickness 5T7 between the second material layer 140 and the third layer L3. In this case, the fifth layer L5 may be formed directly on the one surface of the third layer L3 and may be formed to cover all or a part of the one surface of the third layer L3. One surface (e.g., an upper surface) of the formed fifth layer L5 may be parallel or substantially parallel to the one surface of the first material layer 120 or the one surface of the third layer L3. After the fifth layer L5 is formed, the second material layer 140 may be formed directly on the one surface of the fifth layer L5 or may be formed to cover all or a part of the one surface of the fifth layer L5. In another point of view, the fifth layer L5 is formed directly on the surface (e.g., a bottom surface) of the second material layer 140 facing the first material layer 120, and covers all or part of the bottom surface of the second material layer 140.

The fifth layer L5 may be formed by using an ALD method, but is not limited thereto. The fifth layer L5 may be formed as a high-bandgap layer described with reference to FIG. 1, and the number of ALD cycles for forming the fifth layer L5 may be less than the number of ALD cycles for forming the $TiO_2$ layer. When the fifth layer L5 is formed, the third layer L3 may correspond to one of the second to sixth layers 13*b* to 13*f* of FIG. 1.

In some example embodiments, only one of selected fourth and fifth layers L4 and L5 may be formed, or both layers may be formed.

Figure 60:
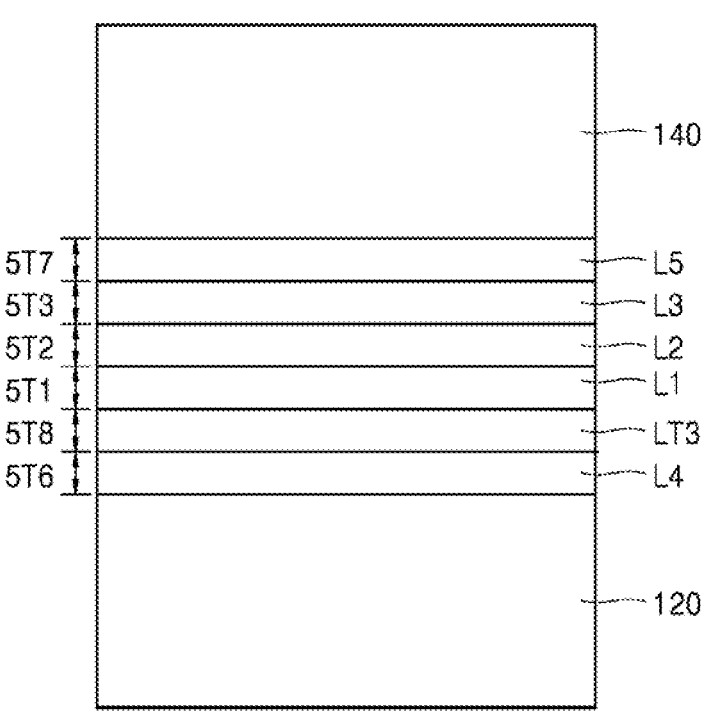

The technical aspect of FIGS. 55 and/or 56 may be applied to the layer structure of FIG. 59. For example, a $TiO_2$ layer may be formed at least one of between the first and second layers L1 and L2, between the second and third layers L2 and L3, between the first and fourth layers L1 and L4, and between the third and fifth layers L3 and L5. FIG. 60 shows a case in which a third $TiO_2$ layer LT3 is formed between the first layer L1 and the fourth layer L4 in FIG. 59. In this case, the third $TiO_2$ layer LT3 may be formed directly on the one surface of the fourth layer L4 and may be formed to cover all or a part of the one surface of the fourth layer L4. The formed third $TiO_2$ layer LT3 may have a surface (e.g., an upper surface) parallel to or substantially parallel to the one surface of the first material layer 120 or the one surface of the fourth layer L4. In addition, the first layer L1 may be formed directly on the one surface of the third $TiO_2$ layer LT3 and may be formed to cover all or a part of the one surface of the third $TiO_2$ layer LT3. As a result, the third $TiO_2$ layer LT3 may be in direct contact with all or a part of the bottom surface of the first layer L1. The first layer L1 may have one surface (e.g., an upper surface) parallel or substantially parallel to the one surface of the third $TiO_2$ layer LT3.

The third $TiO_2$ layer LT3 may be formed by using an ALD method, but is not limited thereto. The third $TiO_2$ layer LT3 is formed with a thickness 5T8 greater than that of a layer used as the phase stabilization layer, a layer used as the leakage current suppressing layer, and a layer formed as the high-bandgap layer. The number of ALD cycles for forming the third $TiO_2$ layer LT3 may also be greater than the number of ALD cycles for forming the layer used as the phase stabilization layer, the layer used as the leakage current suppressing layer, and the layer formed as the high-bandgap layer.

The disclosed dielectric layer uses a $TiO_2$ layer as a base layer, includes a phase stabilization layer for stably maintaining the phase of the $TiO_2$ layer as a rutile-phase having a relatively high-dielectric constant, and includes a leakage current suppressing layer and/or a material layer having a bandgap greater than that of $TiO_2$ to prevent the reduction of a leakage current characteristic of the $TiO_2$ layer. The disclosed dielectric layer may be regarded as a composite dielectric layer, and by using such a dielectric layer, the deterioration of leakage current characteristics may be prevented while maintaining the dielectric constant of the dielectric layer at a high-dielectric constant, even in a highly integrated environment in which the thickness of the dielectric layer becomes thinner, for example, in an environment in which the thickness of the dielectric layer is reduced to 10 nm or less.

Therefore, in the case of an electronic device and apparatus to which the disclosed dielectric layer is applied, operation characteristics may be stably maintained even in a high-integration environment, and thus the operation reliability of the apparatus may be increased.

It should be understood that the example embodiments described herein should be considered in a descriptive sense only and not for purposes of limitation. Descriptions of features or aspects within each example embodiment should typically be considered as available for other similar features or aspects in other example embodiments. While one or more embodiments have been described with reference to the figures, it will be understood by those of ordinary skill in the art that various changes in form and details may be made therein without departing from the spirit and scope as defined by the following claims.

What is claimed is:

1. A dielectric layer comprising:

a first layer having a dielectric constant greater than that of silicon oxide and undoped;

a second layer on the first layer and configured to enhance a rutile phase of the first layer; and a third layer on at least one of the first and second layers, the third layer configured to increase a bandgap of the first layer.

2. The dielectric layer of claim 1, wherein the first layer is between the second layer and the third layer such that the second layer, the first layer, and the third layer are sequentially stacked.

3. The dielectric layer of claim 2, wherein the first layer symmetrical surrounds the second layer, and the third layer is on at least one of a first side or a second side of a first stack structure, the first stack structure including the first and second layers.

4. The dielectric layer of claim 1, wherein the first layer is provided below and above the second layer and is in contact with the second layer.

5. The dielectric layer of claim 4, wherein the first layer is provided below and above the third layer and is in contact with the third layer.

6. The dielectric layer of claim 1, wherein the first layer is provided below and above the third layer and is in contact with the third layer.

7. The dielectric layer of claim 1, wherein the second layer and the third layer are in contact with each other, and the first layer is provided on at least one of a first side or a second side of a stack structure including the contacting second and third layers.

8. The dielectric layer of claim 1, wherein the second layer is included in a plurality of second layers, and the first layer is between the plurality of second layers.

9. The dielectric layer of claim 8, wherein the third layer is included in a plurality of third layers, and the first layer is between the plurality of third layers.

10. The dielectric layer of claim 9, wherein one of the plurality of second layers and one of the plurality of third layers are in contact with each other.

11. The dielectric layer of claim 1, wherein the third layer is included in a plurality of third layers, and the first layer is between the plurality of third layers.

12. The dielectric layer of claim 1, wherein at least one of the second layer or the third layer is buried in the first layer.

13. The dielectric layer of claim 1, further comprising:

a fourth layer configured to increase the bandgap of the first layer, and the fourth layer is on at least one of a first side or a second side of a stack structure including the first to third layers.

14. The dielectric layer of claim 13, wherein the second layer is a plurality of second layers, and the first layer is between the plurality of second layers.

15. The dielectric layer of claim 14, wherein the third layer is a plurality of third layers, and the first layer is between the plurality of third layers.

16. The dielectric layer of claim 13, wherein the third layer is a plurality of third layers, and the first layer is between the plurality of third layers.

17. The dielectric layer of claim 1, wherein the first layer is a $TiO_2$ layer.

18. The dielectric layer of claim 1, wherein the second layer includes at least one of $SnO_2$, $GeO_2$, $GaO_2$ or $SiO_2$.

19. The dielectric layer of claim 1, wherein the third layer includes at least one of $Al_2O_3$, $Y_2O_3$ or $MgO$.

20. The dielectric layer of claim 1, wherein the third layer includes at least one of $HfO_2$ or $ZrO_2$.

* * * * *